United States Patent [19]

Miyashita et al.

[11] Patent Number: 5,610,954
[45] Date of Patent: Mar. 11, 1997

[54] CLOCK REPRODUCTION CIRCUIT AND ELEMENTS USED IN THE SAME

[75] Inventors: Takumi Miyashita; Nobuaki Tomesakai, both of Kawasaki, Japan

[73] Assignee: Fujitsu Limited, Kawasaki, Japan

[21] Appl. No.: 401,793

[22] Filed: Mar. 10, 1995

[30] Foreign Application Priority Data

| Mar. 11, 1994 | [JP] | Japan | 6-041054 |
| Mar. 17, 1994 | [JP] | Japan | 6-047145 |
| Sep. 14, 1994 | [JP] | Japan | 6-220385 |
| Dec. 1, 1994 | [JP] | Japan | 6-329597 |
| Jan. 10, 1995 | [JP] | Japan | 7-002232 |

[51] Int. Cl.$^6$ .................................................. H03D 3/24
[52] U.S. Cl. .......................... 375/375; 375/374; 331/25; 327/157
[58] Field of Search .................................. 375/373, 374, 375/375, 376; 331/1 R, 1 A, 14, 17, 18, 25, 34; 327/156, 157

[56] References Cited

U.S. PATENT DOCUMENTS

| 4,773,085 | 9/1988 | Gordell | 375/376 |
| 4,780,844 | 10/1988 | Keller | 375/376 |
| 4,803,705 | 2/1989 | Gillingham et al. | 331/1 A |
| 5,027,085 | 6/1991 | DeVito . | |
| 5,173,617 | 12/1992 | Alsup et al. | 375/373 |
| 5,455,540 | 10/1995 | Williams | 331/1 A |

OTHER PUBLICATIONS

"A Si Bipolar Phase and Frequency Detector IC for Clock Extraction up to 8 Gb/s", Pottbacker et al, IEEE Journal of Solid–State Circuits, vol. 27, No. 12, Dec. 1992, pp. 1747–1751.

"A 155–MHz Clock Recovery Delay–and Phase–Locked Loop", Lee et al, IEEE Journal of Solid–State Circuits, vol. 27, No. 12, Dec. 1992, pp. 1736–1746.

"A Two–Chip 1.5 Gbd Serial Link Interface", Walker et al, IEEE Journal of Solid–State Circuits, vol. 27, No. 12, Dec. 1992, pp. 1805–1811.

"A 200–MHz CMOS Phase–Locked Loop with Dual Phase Detectors", Ware et al, IEEE Journal of Solid–State Circuits, vol. 24, No. 6, Dec. 1989, pp. 1560–1568.

"A New Phase–Locked Timing Recovery Method for Digital Regenerators", Bellisio, pp. 10–17–10–20.

Primary Examiner—Wellington Chin
Assistant Examiner—Paul Loomis
Attorney, Agent, or Firm—Nikaido, Marmelstein, Murray & Oram LLP

[57] ABSTRACT

A clock reproduction circuit produces a data clock from a data signal. The clock reproduction circuit includes a voltage controlled oscillator, a phase detector, a frequency error detection circuit and a charge pump whose output is controlled by the outputs of the phase detector and the frequency error detection circuit. A VCO clock output from the voltage controlled oscillator is synchronized with the data clock by the feedback loop consisting of these elements. The frequency error detection circuit detects a frequency error between the VCO clock and the data clock by detecting changes in the phases of the VCO clock at the transition edges of the data signal. Analog and digital frequency error detection circuits are used. Further, improved circuit elements in the clock reproduction circuit used.

32 Claims, 72 Drawing Sheets

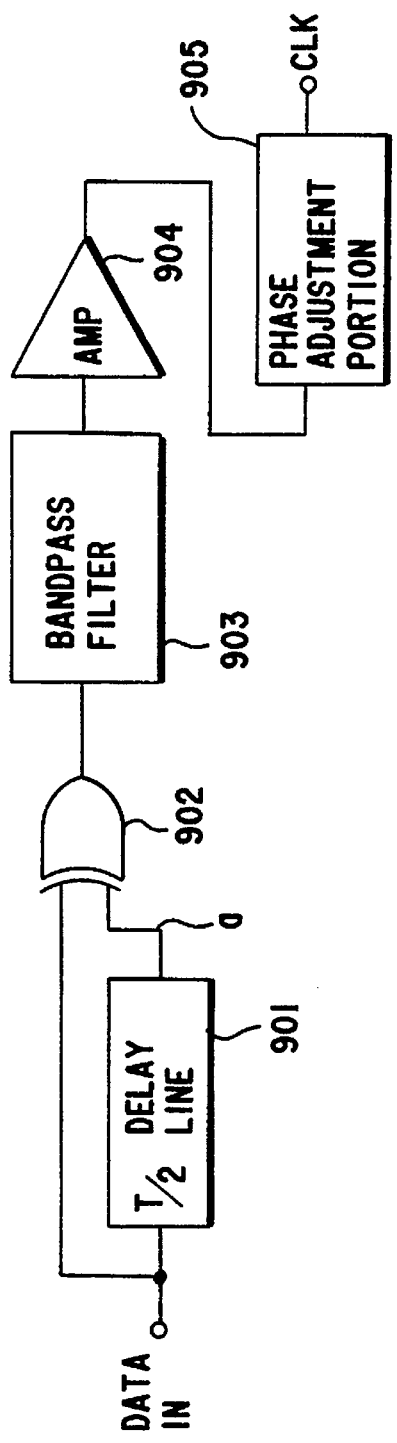
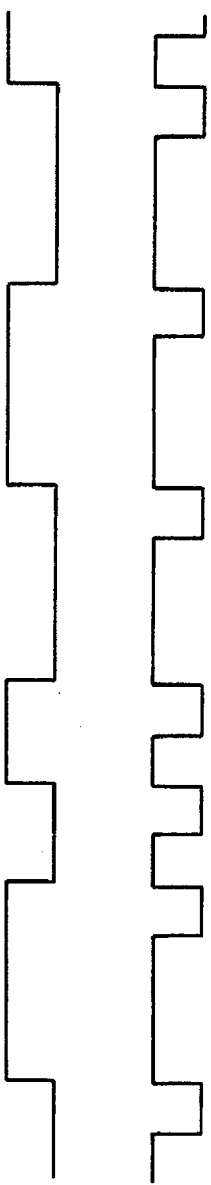
Fig.1 PRIOR ART
Fig.2A PRIOR ART — BIT TRANSFER CLOCK (DATA CLOCK)
Fig.2B PRIOR ART — INCOMING DATA
Fig.2C PRIOR ART — NODE a
Fig.2D PRIOR ART — EXOR OUTPUT Fig. 9A  DATA 
Fig. 9B  *CLK 
Fig. 9C  QA 
Fig. 9D  PDA 
Fig. 9E  CLK 
Fig. 9F  RDATA 
Fig. 9G  PDB 

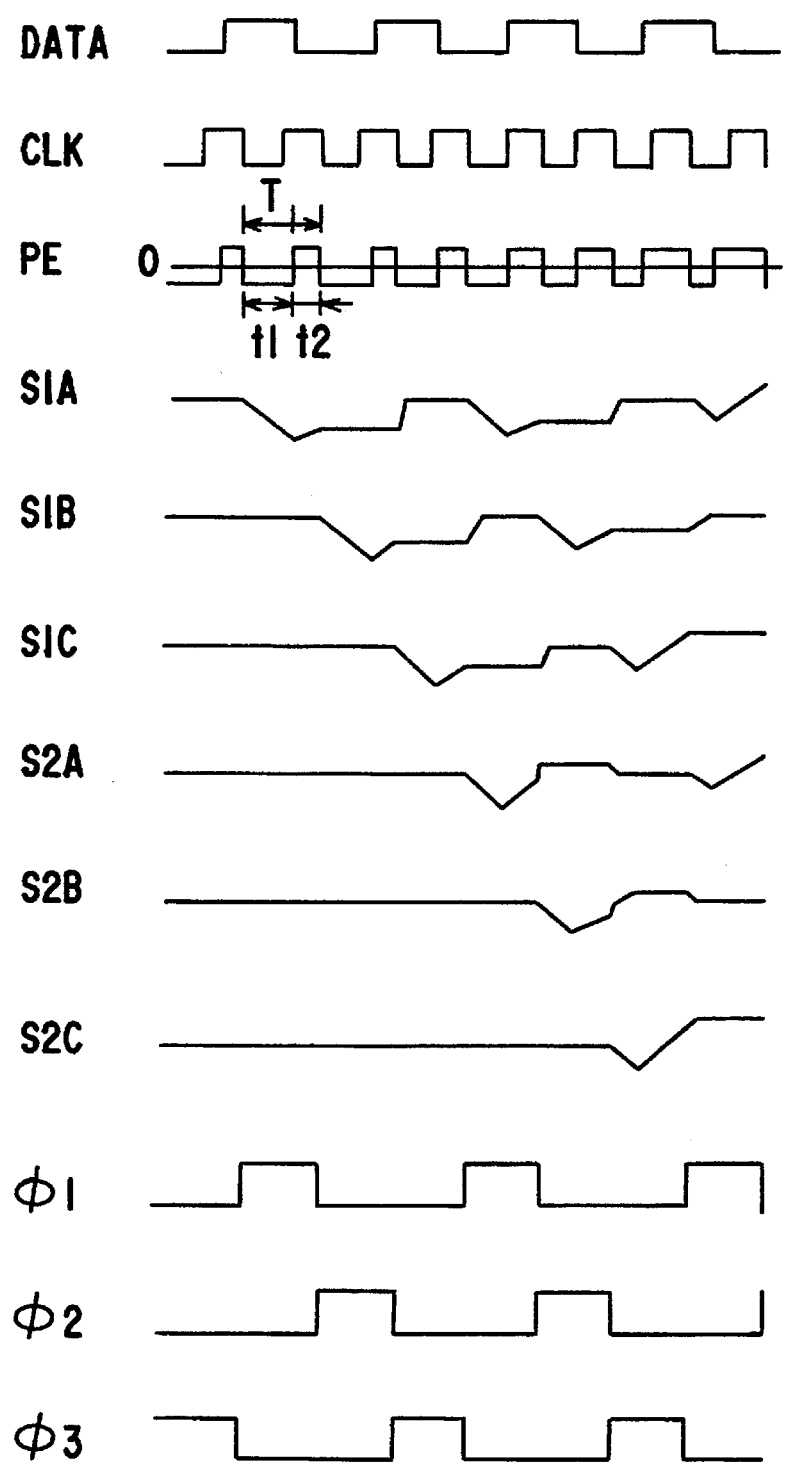

Fig.14A CLK 
Fig.14B DATA 
Fig.14C φ2 
Fig.14D RDATA 
Fig.14E PE1 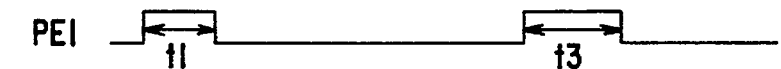
Fig.14F PE2 

Fig.18
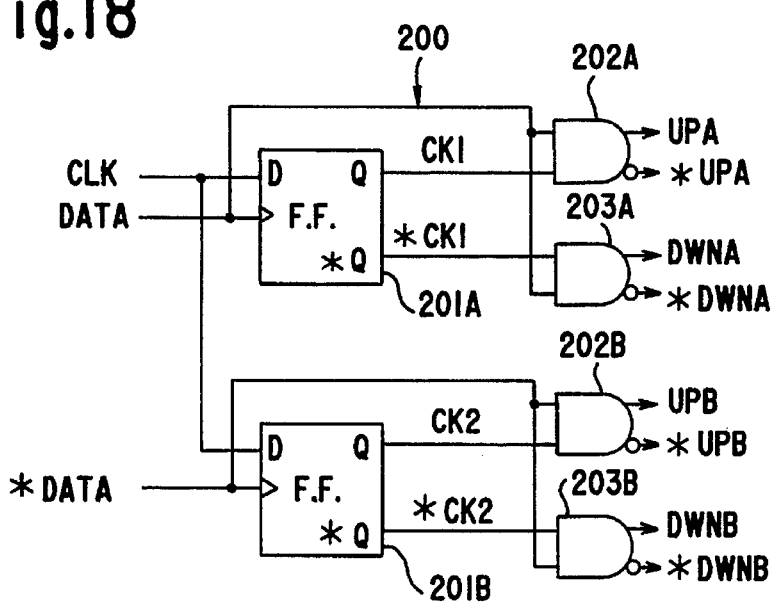
Fig.19A  CLK  
Fig.19B  DATA  
Fig.19C  *DATA  
Fig.19D  CK1  
Fig.19E  CK2  
Fig.19F  UPA  
Fig.19G  DWNA  
Fig.19H  UPB  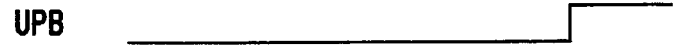
Fig.19I  DWNB  

Fig.28A CLK 
Fig.28B DATA 
Fig.28C RDATA 
Fig.28D CK1 
Fig.28E CK2 
Fig.28F CK3 
Fig.28G CK4 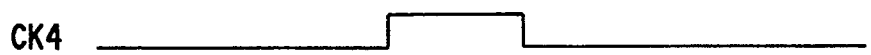
Fig.28H PE1 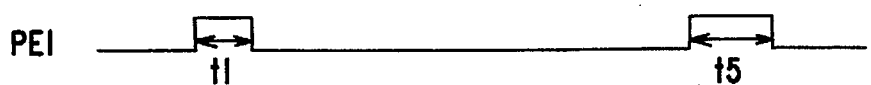
Fig.28I PE2 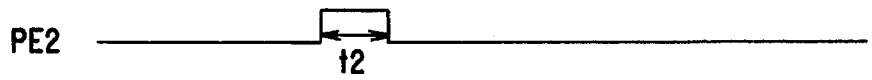
Fig.28J PE3 
Fig.28K PE4 
Fig.28M

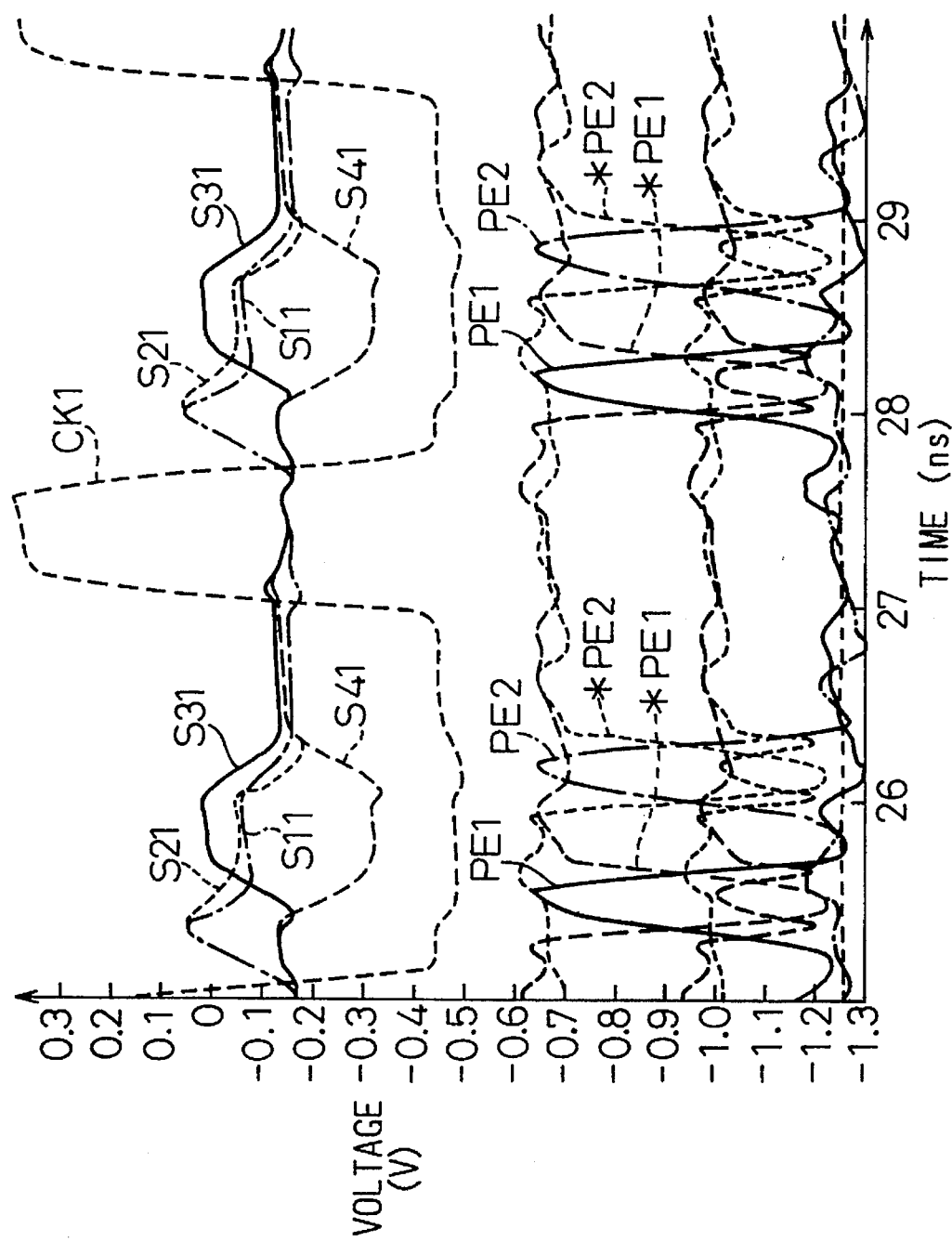

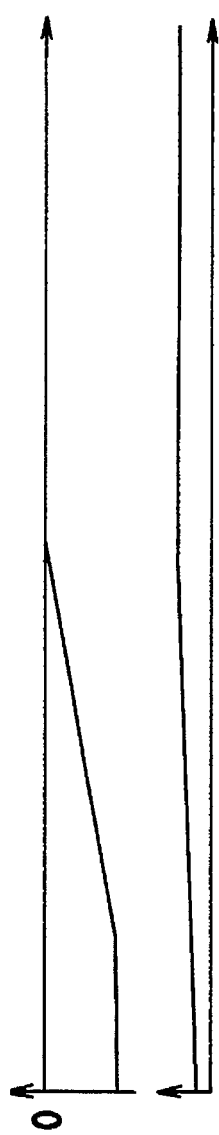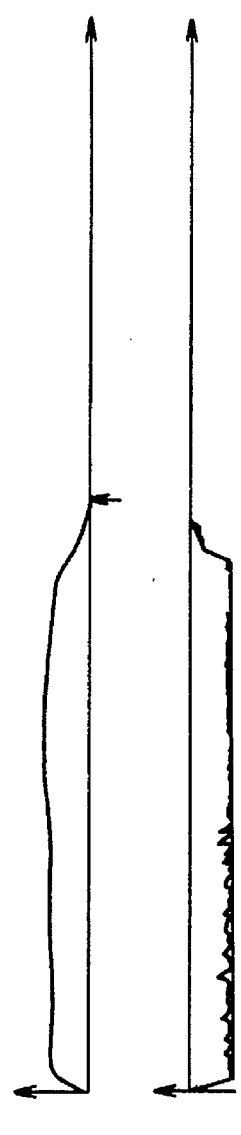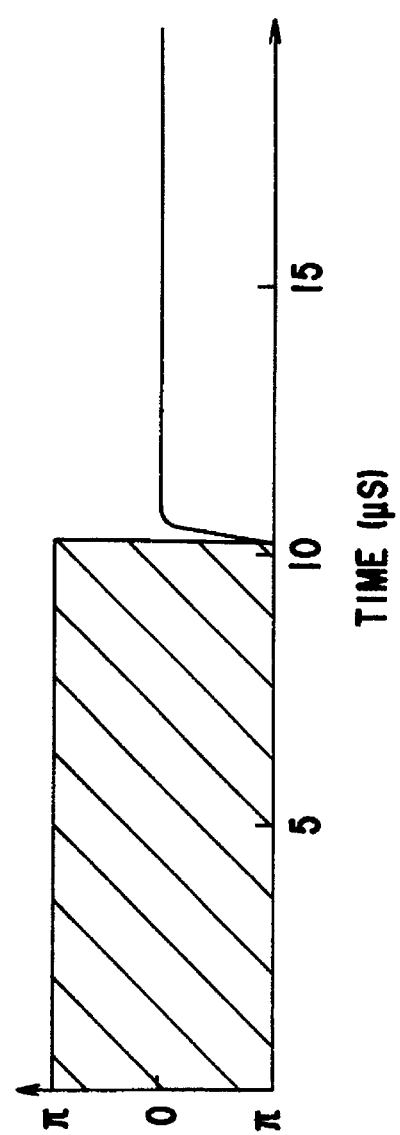

Fig.39

| CODED PHASE ERROR $\Delta\beta_{H-L}$ | POSITIVE PHASE OUTPUT OF LATCH CIRCUIT 310 | | | | | | | |
|---|---|---|---|---|---|---|---|---|
| | Q1 | Q2 | Q3 | Q4 | Q5 | Q6 | Q7 | Q8 |
| 1 | H | L | L | L | L | H | H | H |
| 2 | H | H | L | L | L | L | H | H |
| 3 | H | H | H | L | L | L | L | H |
| 4 | H | H | H | H | L | L | L | L |
| 5 | L | H | H | H | H | L | L | L |
| 6 | L | L | H | H | H | H | L | L |
| 7 | L | L | L | H | H | H | H | L |
| 8 | L | L | L | L | H | H | H | H |

Fig.40

| CODED PHASE ERROR $\Delta\beta_{H-L}$ | POSITIVE PHASE OUTPUT OF LATCH CIRCUIT 311 | | | | | | | |
|---|---|---|---|---|---|---|---|---|
| | Q1 | Q2 | Q3 | Q4 | Q5 | Q6 | Q7 | Q8 |
| 1 | H | L | L | L | L | H | H | H |
| 2 | H | H | L | L | L | L | H | H |
| 3 | H | H | H | L | L | L | L | H |
| 4 | H | H | H | H | L | L | L | L |
| 5 | L | H | H | H | H | L | L | L |
| 6 | L | L | H | H | H | H | L | L |
| 7 | L | L | L | H | H | H | H | L |
| 8 | L | L | L | L | H | H | H | H |

Fig.43

| CODED PHASE ERROR $\Delta\beta_{H-L}$ | POSITIVE PHASE OUTPUT OF LATCH CIRCUIT 310 | | | | | | | | CODED PHASE ERROR SIGNAL | | | | | | | |
|---|---|---|---|---|---|---|---|---|---|---|---|---|---|---|---|---|
| | Q1 | Q2 | Q3 | Q4 | Q5 | Q6 | Q7 | Q8 | X1 | X2 | X3 | X4 | X5 | X6 | X7 | X8 |
| 1 | H | L | L | L | L | H | H | H | H | L | L | L | L | L | L | L |
| 2 | H | H | L | L | L | L | H | H | L | H | L | L | L | L | L | L |
| 3 | H | H | H | L | L | L | L | H | L | L | H | L | L | L | L | L |
| 4 | H | H | H | H | L | L | L | L | L | L | L | H | L | L | L | L |
| 5 | L | H | H | H | H | L | L | L | L | L | L | L | H | L | L | L |
| 6 | L | L | H | H | H | H | L | L | L | L | L | L | L | H | L | L |
| 7 | L | L | L | H | H | H | H | L | L | L | L | L | L | L | H | L |
| 8 | L | L | L | L | H | H | H | H | L | L | L | L | L | L | L | H |

Fig.44

| CODED PHASE ERROR $\Delta\beta_{H-L}$ | POSITIVE PHASE OUTPUT OF LATCH CIRCUIT 311 | | | | | | | | CODED PHASE ERROR SIGNAL | | | | | | | |
|---|---|---|---|---|---|---|---|---|---|---|---|---|---|---|---|---|
| | O1 | O2 | O3 | O4 | O5 | O6 | O7 | O8 | X1 | X2 | X3 | X4 | X5 | X6 | X7 | X8 |
| 1 | H | L | L | L | L | H | H | H | H | L | L | L | L | L | L | L |
| 2 | H | H | L | L | L | L | H | H | L | H | L | L | L | L | L | L |
| 3 | H | H | H | L | L | L | L | H | L | L | H | L | L | L | L | L |
| 4 | H | H | H | H | L | L | L | L | L | L | L | H | L | L | L | L |
| 5 | L | H | H | H | H | L | L | L | L | L | L | L | H | L | L | L |
| 6 | L | L | H | H | H | H | L | L | L | L | L | L | L | H | L | L |
| 7 | L | L | L | H | H | H | H | L | L | L | L | L | L | L | H | L |
| 8 | L | L | L | L | H | H | H | H | L | L | L | L | L | L | L | H |

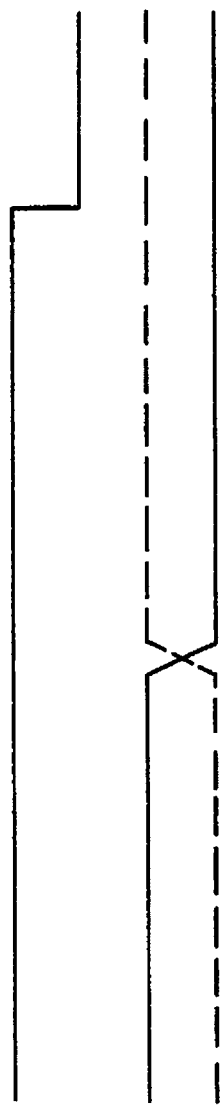
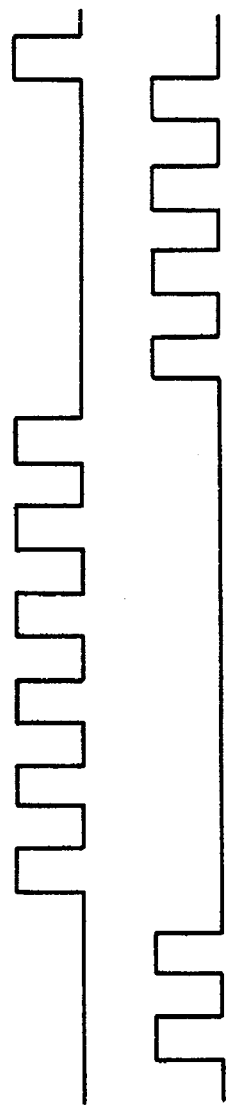
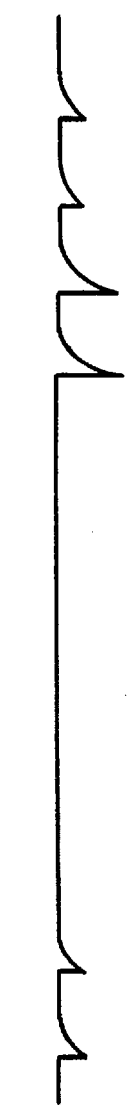
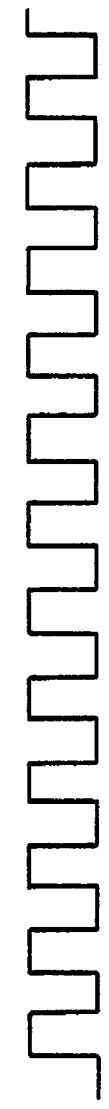
Fig.55A UNLOCK
Fig.55B UPf DWNf
Fig.55C UP
Fig.55D DWN
Fig.55E iUP
Fig.55F iDWN
Fig.55G DATA Fig.61A DATA 
Fig.61B CLK 
Fig.61C UP1 
Fig.61D UP2 
Fig.61E DWN1 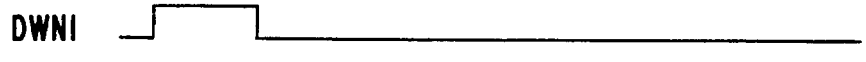
Fig.61F DWN2 
Fig.61G $i_{584}$ 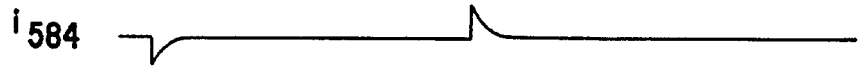
Fig.61H $i_{585}$ 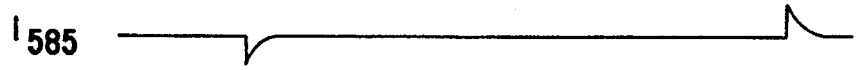
Fig.62
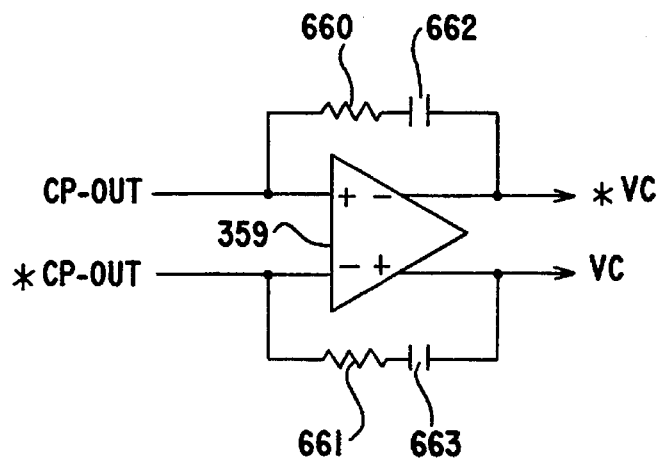

Fig.68A  *UP  
Fig.68B  DWN  
Fig.68C  CH  
Fig.68D  VO  

Fig.69
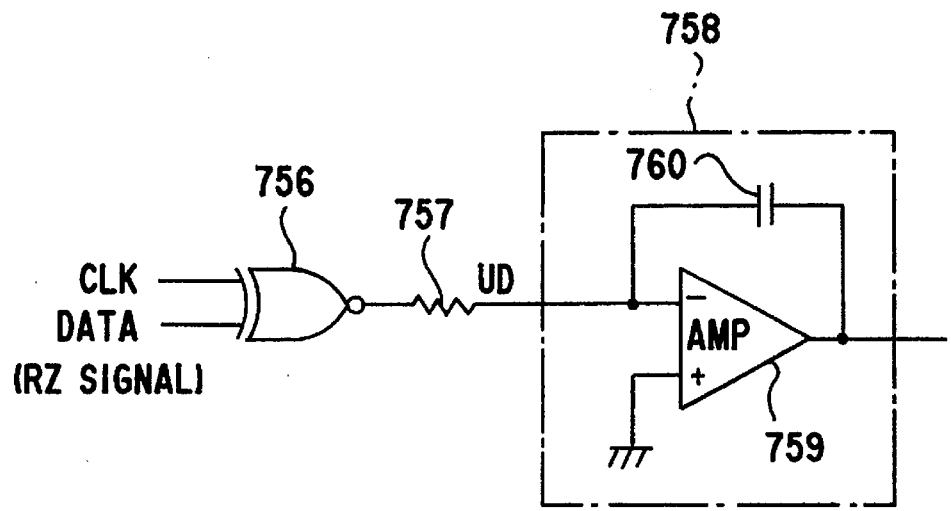
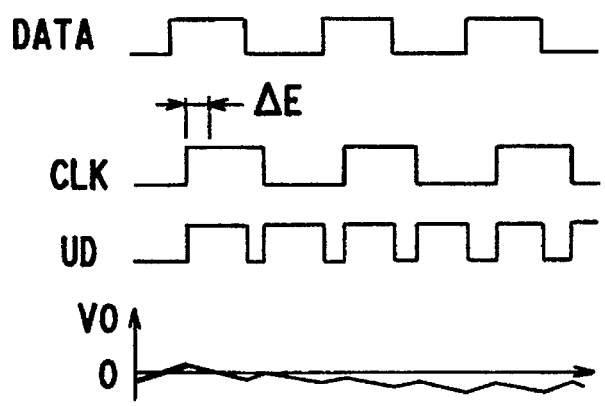
Fig.70A DATA
Fig.70B CLK
Fig.70C UD
Fig.70D VO

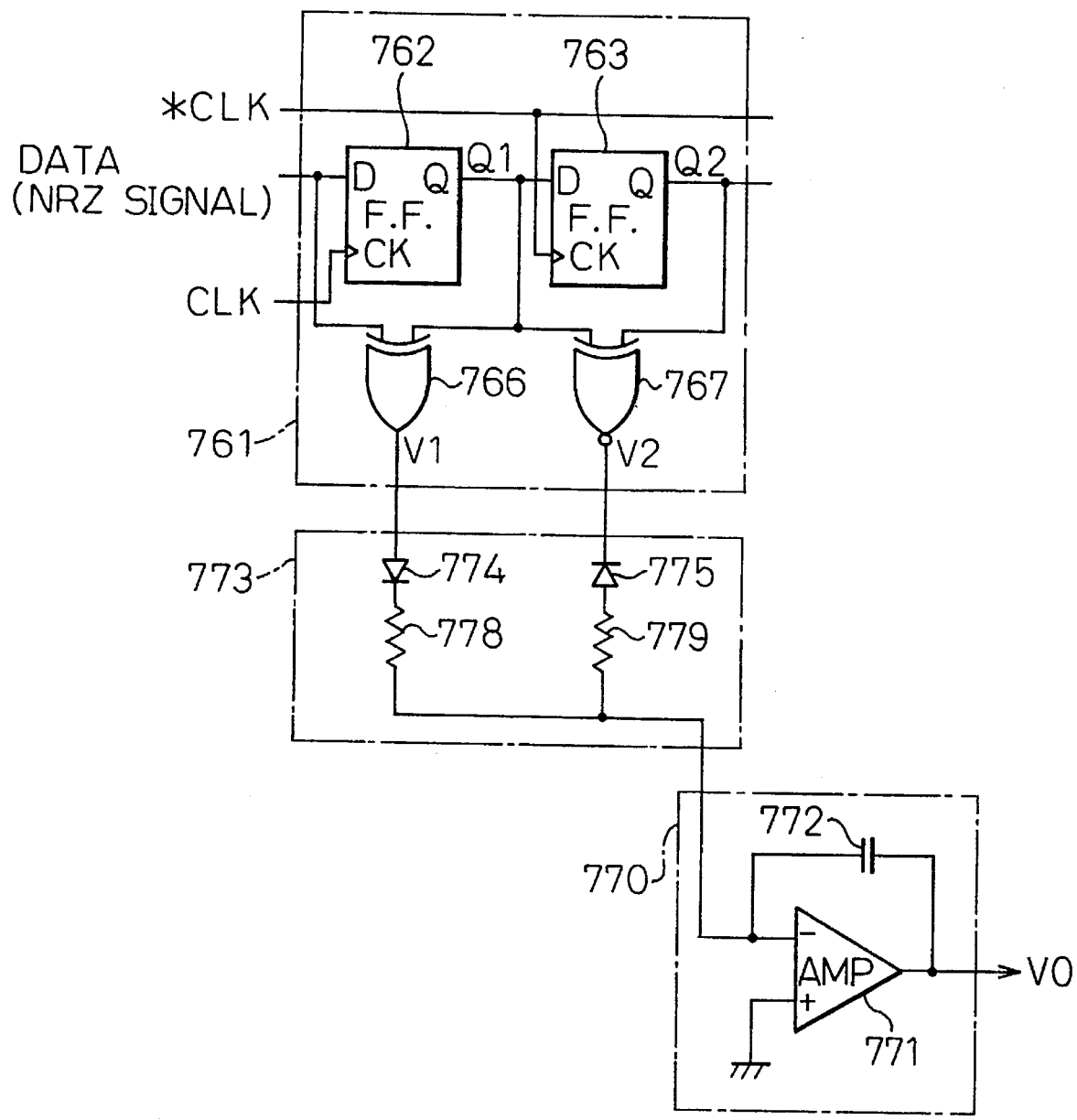

Fig.72A  CLK 
Fig.72B  *CLK 
Fig.72C  DATA 
Fig.72D  Q1 
Fig.72E  Q2 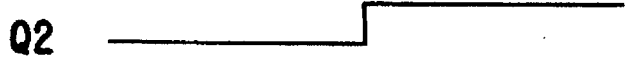
Fig.72F  V1 
Fig.72G  V2 
Fig.72H  VO 

Fig.74A  $\phi$  
Fig.74B  $\phi_1$  
Fig.74C  $\phi_2$  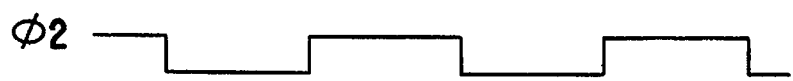
Fig.74D  $\phi_3$  
Fig.74E  $\phi_0$  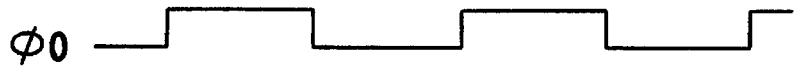

CLOCK REPRODUCTION CIRCUIT AND ELEMENTS USED IN THE SAME

BACKGROUND OF THE INVENTION

1. Field of the Invention

The present invention relates to a clock reproduction circuit. In systems for synchronous transmission of digital data, an information signal is transmitted at a constant rate by a transmitting unit, and it is received at the same rate by a receiving unit. Since it is generally impractical to transmit a clock separately from the data, the timing information is usually derived from the data stream itself. Therefore, a circuit for deriving this implicit signal is provided at the receiving unit. In the specification, this circuit is called a clock reproduction circuit, the clock reproduced from the data signal at the receiving unit is called a data clock, and the frequency of the data clock is called a data clock frequency. Further, in recent years, in data communication systems using optical communication equipments and so forth, data is transmitted as a non-return-to-zero (NRZ) signal in order to increase the transmission efficiency. Therefore, the clock reproduction circuit is required to reproduce the clock from the NRZ signal.

2. Description of the Related Art

In the past, a clock reproduction circuit using a high Q value resonator had been used. However, this conventional clock reproduction circuit cannot satisfy the requirement of data communication systems that a clock signal having a wide frequency range be reproduced from a data signal, therefore, a clock reproduction circuit having a Phase Locked Loop (PLL) circuit has been proposed.

In the normal PLL circuit, a phase detector, a loop filter and a voltage controlled oscillator (VCO) are circularly connected. However, if the frequency error between the clock output from the VCO and the data clock is large, the clock from the VCO cannot be made synchronous with the data clock. In the specification, the clock output from the VCO is called a VCO clock, further, the frequency of the VCO clock is called a VCO frequency. Therefore, there is proposed a clock reproduction circuit which includes a phase detector (PD), a quadrature phase detector (QPD) and a frequency detector (PFD) processing the beat notes of the PD and the QPD. The PFD outputs a frequency error signal. Both of the phase error signal output from the PD and the frequency error signal output from the PFD are fed back to the loop filter.

However, the PFD can detect the frequency error only when cycle slips occur and can detect the directions of the cycle slips. Therefore, when the cycle slips do not frequently occur, there occurs a problem that the circuit cannot enter in a locked-in state. To overcome the above drawback, the gains of the PD and the PFD may be raised. In this case, even when the error between the data clock frequency of the data signal and the VCO clock frequency is small, the voltage supplied by the loop filter remains high. However, this technique poses a problem in that the number of timing jitters occurring during data communication increases.

Further, a conventional phase detector (PD) employed in a conventional clock reproduction circuit includes a latch, a one-shot pulse generator and NAND circuits. However, in this conventional PD, when the data signal has a high frequency, it becomes difficult to generate the one-shot pulse. This poses a problem that pulse generation cannot follow the high-frequency data signal.

Further, in a conventional charge pump employed in a conventional reproduction circuit, when the data signal has a high frequency, the one-shot pulse has a shorter pulse duration, the charge pump drive signals have a short pulse duration, and it becomes difficult to respond to these correlative changes. Thus, a high-frequency data signal cannot be handled properly.

Further, in recent years, a semiconductor integrated circuit (IC) in which the error convergence pulse generator, the charge pump, an operational amplifier in the loop filter, and the VCO are incorporated has been realized. When this IC is used, resistors and a capacitor that are included in the loop filter are externally connected to the IC. However, because the output of the charge pump contains a parasitic inductance or capacitance, the parasitic inductance or capacitance is negligible when the data clock frequency is 1 Gbps or higher. This results in a distorted waveform.

Further, because it is difficult to directly synchronize both the frequency and the phase in the clock reproduction circuit with the data clock, another circuit is used in which the frequency of the VCO clock is firstly made to almost agree with that of the reference clock in a first loop, and then the phase of the clock is synchronized with that of the data signal in a second loop. However, because there is an offset between the first and second loops, there occurs a problem that comparatively long time is necessary to synchronize the clock with the data signal after the first loop is switched to the second loop.

SUMMARY OF THE INVENTION

The first object of the present invention is to provide a frequency error detection circuit and a clock reproduction circuit using the same which can detect a frequency error without cycle slips, namely, which speeds up frequency detection without increasing timing jitter and thus achieving a speedup of clock reproduction.

The second object of the present invention is to provide a phase detector capable of handling a high-frequency data signal.

The third object of the present invention is to provide a charge pump capable of obviating the necessity of using a one-shot pulse produced from a data signal to determine a pulse duration for charge pump drive signals, and also capable of handling a high-frequency data signal.

The fourth object of the present invention is to provide an error detector capable of reliably supplying a signal for use in reducing an error in frequency or phase despite a high frequency of the data signal, and a clock reproduction circuit and a delay locking circuit using the error detector.

The fifth object of the present invention is to provide an improved clock reproduction circuit in which the frequency of the clock is controlled to be consistent with the frequency of a reference clock and the phase is then controlled to be synchronous with the phase of the data clock.

The clock reproduction circuit according to a first aspect of the present invention includes a voltage controlled oscillator generating a VCO clock; a phase detector; a frequency error detection circuit; a charge pump whose output signal is controlled by the phase difference signal and the frequency error signal; and a loop filter. In the clock reproduction circuit, the frequency error detection circuit detects the frequency difference between the data clock and the VCO clock by detecting the phases of the VCO clock at transition edges of the data signal and by detecting changes in the detected phases.

When the frequency of the VCO clock is consistent with that of the data clock, the phases of the VCO clock at the transition edges of the data signal do not change. Therefore, the frequency difference between the data clock and the VCO clock can be detected by detecting a change in the phases of the VCO clock at the transition edges.

According to the present invention, a frequency error between the VCO clock and the data clock can be detected without waiting for a cycle slip. Unlike the prior art in which a frequency error is detected at every cycle slip, the present invention enables speedup of frequency error detection.

It is desired to detect the difference between VCO clock phases at two neighboring transition edges. The difference between VCO clock phases at two neighboring transition edges can be detected by an analog circuit or a digital circuit.

An analog frequency error detection circuit includes two or more phase difference detection/hold circuits, each of which detects a phase of the VCO clock at one transition edge, holds the detected phase, and cancels the held value, and two or more comparison circuits, each of which compares the held values of two of the phase difference detection/hold circuits, and the phase difference detection/hold circuits cyclically and serially detect the phases of the VCO clock at transistion edges, and hold the detected phases until the next transition edge; and the comparison circuits cyclically and serially compare the detected phases output from two corresponding phase difference detection/hold circuits.

A digital frequency error detection circuit includes a multi-phase clock generation circuit for generating m phase-shifted clocks (where m denotes an integer) from the VCO clock, a first latch for latching the m phase-shifted clocks at the first-to-second-level transition of the data signal, a second latch for latching the m phase-shifted clocks at the second-to-first-level transition of the data signal, and a phase comparing circuit which decodes the output signals of the first and second latch and calculates the phase difference.

In the m phase-shifted clocks, clocks are serially shifted by 1/m of one cycle of the VCO clock. Therefore, the phase can be detected by decoding the latched m phase-shifted clocks.

The phase detector according to the second aspect of the present invention includes a latch and two AND circuits. The output signals of the AND circuits are supplied as charge pump drive signals. The latch latches the VCO signal at transition edges of the data signal and outputs complementary signals. The AND circuits respectively synthesize either of the complementary signals output from the latch and the data signal. In the phase detector according to the second aspect of the present invention, the output signal of the latch and the input signal are synthesized in order to produce charge pump drive signals. The high-frequency input signal can therefore be handled properly.

A charge pump according to the third aspect of the present invention changes an output voltage at an output terminal according to a first signal group consisting of first increase complementary signals and first decrease complementary signals, and a second signal group consisting of a second increase signal and a second decrease signal. The charge pump includes a current flow-out circuit including an increase drive voltage generator and an increase pump circuit and a current flow-in circuit which includes a decrease pump circuit and a decrease drive voltage generator. The increase drive voltage generator whose output terminal is connected to a first node increases an output voltage according to the second increase signal; the increase pump circuit is connected between the first node and the output terminal and increases the output voltage at the output terminal according to the first increase complementary signals; the decrease pump circuit is connected between the output terminal and a second node and decreases the output voltage at the output terminal according to the first decrease complementary signals; and the decrease drive voltage generator is connected to the second node and decreases the voltage at the second node according to the second decrease signal.

The increase pump circuit is practically realized by including three rectifying elements connected between the first node and the output terminal in series, a forward direction of each rectifying element being the a direction from the first node to the output terminal and a first capacitor and a second capacitor respectively connected to two connection nodes of the three rectifying elements, the other terminals of the first and second capacitors being respectively supplied with the first increase complementary signals. Further, the decrease pump circuit is realized by including three rectifying elements connected between the first node and the output terminal in series, the forward direction of each rectifying element being the direction from the output terminal to the second node and a third capacitor and a fourth capacitor respectively connected to two connection nodes of the three rectifying elements, the other terminals of the third and fourth capacitors being respectively supplied with the first decrease complementary signals.

In the charge pump of the present invention, the pulse durations necessary for the first increase and decrease complementary signals are therefore determined by the capacitors. This obviates the necessity of using an one-shot pulse produced from the data signal to determine a pulse duration for these charge pump drive signals. A high-frequency data signal can be handled properly.

In the charge pump, when the increase and decrease drive voltage generators are designed to be controlled so that voltages applied to the first and second node are the same or substantially the same, the output impedance can be raised. This helps minimize the influence of power-supply noise.

An error detector according to the fourth aspect of the present invention includes an error convergence pulse generator for supplying a pulse containing information used to reduce an error in frequency or phase of a VCO clock relative to a data signal in response to the data signal and data clock, a charge pump for moving charge through an output terminal thereof in response to the pulse, and an integrating circuit having an input terminal thereof connected to the output terminal of the charge pump, integrating the quantity of charge moved through the input terminal thereof, and supplying an error signal through an output terminal thereof.

Error convergence pulse generators fall into two types: a type whose output pulses have a certain duration and which uses the charge pump to emit or absorb quantity of charge proportional to the number of output pulses; and a type whose output pulses have uncertain durations and which uses the charge pump to emit or absorb charge dependent on (normally, substantially proportional to) the duration of the pulses.

According to the fourth aspect of the present invention, the output of the charge pump is integrated by the integrating circuit. As a result, unnecessary high-frequency components are eliminated to provide only the necessary information. Even if the output of the integrating circuit contains a parasitic capacitance or inductance derived from line connections, the influence of the parasitic capacitance or inductance is minimized. Despite a high frequency of the data clock, a signal for use in converging an error in frequency or phase can be reliably supplied.

A frequency synchronizing apparatus according to the fifth aspect of the present invention includes a voltage controlled oscillator which can change its oscillation frequency according to applied voltage, a reference phase detection means which compares the oscillation signal output from the voltage controlled oscillator with a first reference clock and outputs a signal corresponding to the difference of them and a low pass filter which deletes high frequency components from the output signal of the reference phase detection means. By feeding the output of the low pass filter back to the voltage controlled oscillator, the oscillation signal output from the voltage controlled oscillator is to be synchronized with the first reference clock. This feedback loop for the frequency synchronizing apparatus has a characteristic in that it does not change the oscillation signal within a predetermined phase error range including a zero point of the phase error, and operates to change oscillation frequency of the voltage controlled oscillator to the frequency of the first reference clock out of the above range.

Within the predetermined range, including a zero point of the phase error, the output voltage of the low pass filter, namely, the feedback voltage to the VCO, does not change the oscillation frequency of the oscillation signal. For example, this range is from $+\pi$ to $-\pi$. When frequencies of the two clocks (the clock output from the VCO and the first reference clock) agree with each other and only phases of them are different, the phase error is within the predetermined range because the phase error is constant. Therefore, the oscillation frequency of the VCO does not change. When the frequencies of them are different, the phase error gradually increases although the phases of them agree with each other at the start. When the phase error exceeds the predetermined range, the feedback loop operates, therefore, the frequencies come to agree with each other.

BRIEF DESCRIPTION OF THE DRAWINGS

The present invention will be more clearly understood from the description as set forth below with reference to the accompanying drawings, wherein:

FIG. 1 is a block diagram showing an example of a conventional clock reproduction circuit;

FIG. 2 is a time chart showing operations of the circuit shown in FIG. 1;

FIG. 9 is a time chart showing operations of the circuit shown in FIG. 7;

FIG. 10 is a time chart showing operations of the circuits shown in FIGS. 7 and 8;

FIG. 18 is a circuit diagram showing an example of a phase comparison circuit shown in 17;

FIG. 19 is a time chart showing operations of the phase comparison circuit shown in FIG. 18;

FIG. 22 is a circuit diagram showing an example of a phase error detection/control circuit shown in FIG. 23;

FIG. 29 is a diagram showing a simulation result of the third embodiment;

FIG. 31 is a diagram showing an another simulation result of the third embodiment;

FIG. 39 is a table showing positive phase output of one latch circuit shown in FIG. 32 relating to coded phase error;

FIG. 40 is a table showing positive phase output of the other latch circuit shown in FIG. 32 relating to coded phase error;

FIG. 43 is a table showing a coded phase error signal output from one decoder shown in FIG. 42 related to the coded phase error;

FIG. 44 is a table showing the coded phase error signal output from the other decoder shown in FIG. 42 related to a coded phase error;

FIG. 55 is a time chart showing operations of the multiplying charge pump shown in FIG. 32;

FIG. 61 is a time chart showing operations of the multiplying charge pump shown in FIG. 58;

FIG. 62 is a circuit diagram showing a loop filter shown in FIG. 56;

FIG. 68 is a time chart showing operation of the clock reproduction circuit in FIG. 67;

FIG. 69 is a circuit diagram showing a phase detector of the ninth embodiment;

FIG. 70 is a time chart showing operations of the phase detector shown in FIG. 69;

FIG. 71 is a circuit diagram showing a phase detector of the tenth embodiment;

FIG. 72 is a time chart showing operations of the phase error detector shown in FIG. 71;

FIG. 74 is a time chart showing operations of the delay locked circuit shown in FIG. 71;

DESCRIPTION OF THE PREFERRED EMBODIMENTS

Figure 3:
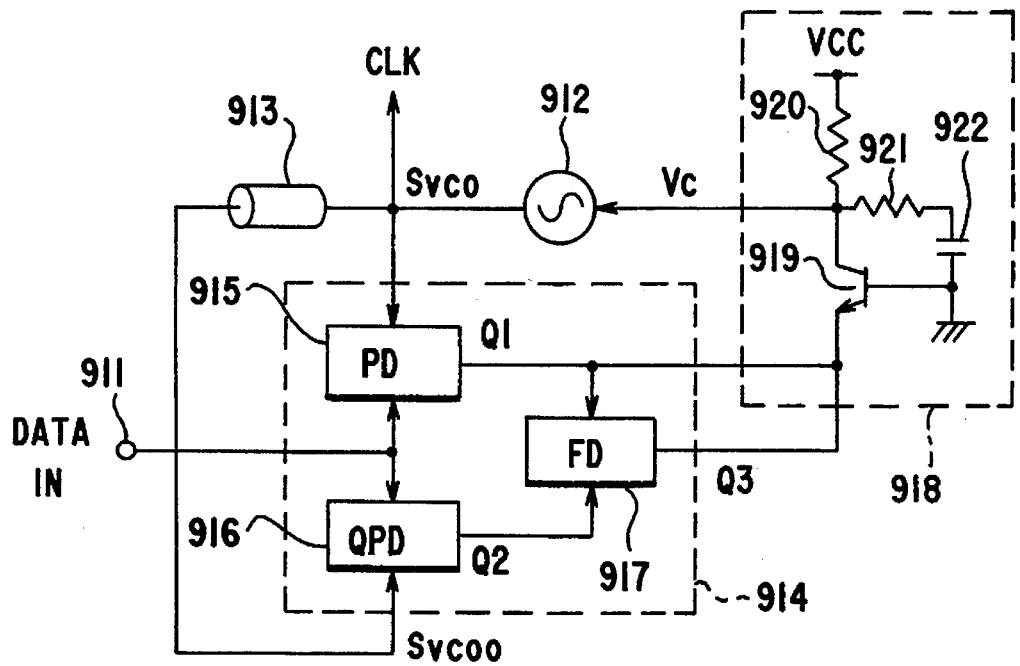
FIG. 3 is a circuit diagram showing an another example of circuitry of a conventional clock reproduction circuit.

Before proceeding to a detailed description of the preferred embodiments of the present invention, a prior art clock reproduction circuit, and the elements used in the same, will be described to allow a clearer understanding of the differences between the present invention and the prior art.

A digital sequential data stream DATA such as an RZ (Return to Zero) signal, an NRZ (Non Return Zero) signal, etc., includes latent information regarding a data clock which is used for modulating the data stream. FIG. 1 shows a conventional clock reproduction circuit which provides a filter having a large Q value for extracting the data clock from a data signal, and FIG. 2 shows a time chart of the operations of this circuit.

As shown in FIG. 1, the clock reproduction circuit includes a T/2 delay line 901 which delays the data signal by a half cycle of the data clock which is previously known, an Exclusive OR (EXOR) gate 902 which outputs a logical EXOR of the data signal and the delayed data signal, a filter 903 which has a high Q value and passes only a signal having frequencies near that of the data clock, and an amplifier 904 which amplifies the output of the filter, and a phase adjustment portion 905 which changes a phase of the clock output from the amplifier 904. The operations of this clock reproduction circuit are described with reference to FIG. 2.

It is assumed that a data signal and a data clock which is used for modulating the data signal at a transmission apparatus are shown in the figure. A data signal delayed at the T/2 delay line 901 becomes a signal shown as "node a", therefore, a signal shown as "EXOR output" is obtained. This signal corresponds to the data clock from which some pulses are omitted. Because a Q value of the filter 903 is high, the filter outputs an oscillation signal having a same frequency as that of the data clock. However, the phase of this signal does not synchronize with the data clock, therefore, the phase adjustment portion 905 shifts the phase of this signal so as to synchronize with the data clock. The adjustment at the phase adjustment portion 905 is performed by changing the length of a signal line.

Although the clock reproduction circuit shown in FIG. 1 is simple, a reproducible frequency is limited to a very narrow frequency range corresponding to the pass bandwidth of the filter 903, therefore, the filter must be changed according to the data clock frequency. This causes a problem in that the reproducible frequency of the clock is limited. Further, the delay value of the phase adjustment portion 905 must be respectively set in each apparatus. Because the length of the signal line is adjusted at a production stage, the production becomes complicated. This produces a problem that the clock reproduction circuit is difficult to produce in an integrated circuit form.

In data communication systems, it is required that a clock having a wide frequency range can be reproduced from a data signal. However, the clock reproduction circuit shown in FIG. 1 cannot satisfy this requirement.

There has been proposed an another conventional clock reproduction circuit including a Phase Locked Loop (PLL). In the normal PLL circuit, a phase comparing circuit (phase detector), a loop filter and a voltage controlled oscillator circuit (VCO) are circularly connected. If the frequency error between the clock output from the VCO and the data clock included in the data signal is large, the clock cannot converge to the data clock.

A circuit having the circuitry shown in FIG. 3 has been proposed as a clock reproduction circuit for reproducing a clock, which is required for reproducing a received data signal, from the received data signal itself. The clock reproduction circuit is realized with a phase/frequency-locked loop (PFLL). In FIG. 3, reference numeral 911 indicates a data input terminal through which a NRZ signal serving as a data signal is received; 912 indicates a voltage controlled oscillator (VCO); 913 indicates a delay line over which a delay signal $S_{vcoQ}$ is delayed with respect to a VCO signal $S_{vco}$, supplied from the VCO 912, by a phase difference of 90 degree; 914 indicates a phase frequency detector (PFD) integrated into a chip; 915 indicates a phase detector (PD) for detecting a phase difference between the NRZ signal and the VCO signal $S_{VCO}$ from the VCO 912; 916 indicates a quadrature phase detector (QPD) for detecting a phase difference between the NRZ signal and the delay signal $S_{vcoQ}$ sent over the delay line 913; 917 indicates a frequency detector (FD) for detecting an error in frequency between the NRZ signal and the VCO signal $S_{VCO}$ of the VCO 912 on the basis of a phase difference detection signal Q1 supplied from the PD 915 and a phase difference detection signal Q2 supplied from the QPD 916; 918 indicates a loop filter (LF) acting as a low-pass filter handling a synthetic signal Q1+Q3 made by synthesizing the phase difference detection signal Q1 supplied from the PD 915 and a frequency error detection signal Q3 supplied from the FD 917; 919 indicates an npn transistor; 920 and 921 indicate resistors; and 922 indicates a capacitor.

A voltage Vc supplied from the loop filter 8 is fed as a control voltage to the VCO 912. The VCO 912 provides a VCO signal $S_{VCO}$ whose frequency corresponds to that of the control voltage Vc. The clock reproduction circuit provides the output signal $S_{VCO}$ of the VCO 912 as a clock CLK reproduced from the NRZ signal. At every cycle slip; that is, every time a phase difference between the NRZ signal and the VCO signal $S_{VCO}$ of the VCO 912 becomes 360 degrees, an error between the data clock of the NRZ signal and the frequency of the VCO clockl $S_{VCO}$ of the VCO 912 is detected in order to attain consistency between the data clock of the NRZ signal and the frequency of the VCO clock $S_{VCO}$ of the VCO 912.

As far as the clock reproduction circuit shown in FIG. 3 is concerned, an error between the data clock of the NRZ signal and the frequency of the VCO clock $S_{VCO}$ of the VCO 912 is detected at every cycle slip. Therefore, when the error between the data clock of the NRZ signal and the frequency of the VCO clock $S_{VCO}$ of the VCO 912 is reduced, a voltage Vc supplied from the loop filter 918 becomes very low. As a result, it takes too much time for frequency detection. It therefore becomes impossible to speed up clock reproduction.

For overcoming the above drawback, the gains of the phase detector 915 and frequency detector 917 may be raised. In this case, even when the error between the data clock of the NRZ signal and the frequency of the VCO clock $S_{VCO}$ of the VCO 912 shrinks, the voltage Vc supplied from the loop filter 918 remains high. However, this technique poses a problem in that the number of timing jitters occurring during data communication increases.

Figure 4:
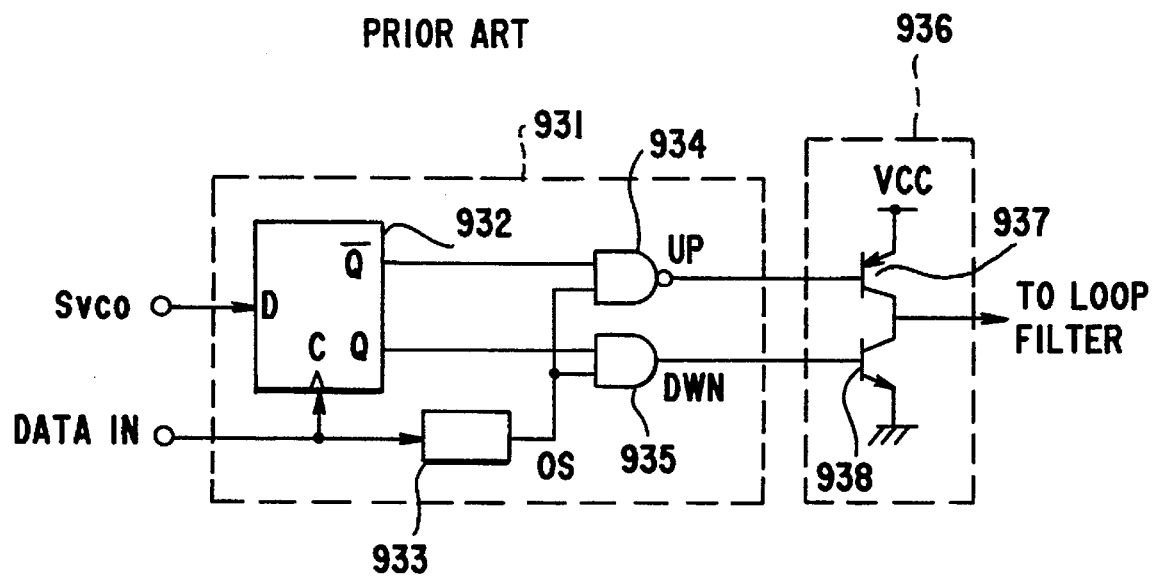
FIG. 4 is a circuit diagram showing an another example of circuitry of a conventional phase detector and charge pump.

FIG. 4 is a circuit diagram showing a conventional phase detector and charge pump employed in a conventional phase-locked loop (PLL).

In FIG. 4, reference numeral 931 indicates a phase detector; 932 indicates a latch (D flip-flop) that accepts the VCO clock from the voltage control oscillator (VCO) through a data input terminal D thereof and accepts a data signal DATA IN (hereinafter, DATA) through a synchronizing signal (hereinafter, latch signal) input terminal C; 933 indicates a one-shot pulse generator for inputting the data signal DATA so as to generate a one-shot pulse OS; 934 indicates a NAND circuit for calculating the NAND of a negative-phase output *Q (hereinafter, a signal bearing an asterisk * is active low) supplied from the latch 932 and an one-shot pulse OS supplied from the one-shot pulse generator 933, and outputting an up signal UP for use in raising the frequency of the VCO clock; 935 indicates an AND circuit for calculating the AND of a positive phase signal Q supplied from the latch 932 and the one-shot pulse OS supplied from the one-shot pulse generator 933, and outputting a down signal DWN for use in lowering the frequency of the VCO clock; 936 indicates a charge pump; VCC indicates a supply voltage line; 937 indicates a pnp transistor whose on and off states are controlled with the up signal UP sent from the NAND circuit 934; and 938 indicates an npn transistor whose on and off states are controlled with the down signal DWN sent from the AND circuit 935.

When the phase detector 931 determines that the VCO clock leads the data signal DATA, the positive-phase output Q of the latch 932 goes high and the negative-phase output *Q thereof goes low. As a result, while the one-shot pulse generator 933 is generating the one-shot pulse OS, the up signal UP is high and the down signal DWN is high. The pnp transistor 937 in the charge pump 936 is therefore turned off and the npn transistor 938 therein is turned on. This causes current to flow from the loop filter into the charge pump 936. By contrast, when the VCO clock lags behind the data signal DATA, the output Q of the latch 932 goes low and the output *Q thereof goes high. As a result, while the one-shot pulse generator 935 is generating the one-shot pulse OS, the up signal UP remains low and the down signal DWN remains low. In this case, the pnp transistor 937 in the charge pump 936 is turned on and the npn transistor 938 therein is turned off. This causes current to flow from the charge pump 936 to the loop filter. In the following, terms "positive-phase" and "negative-phase" are omitted. As described above, a signal of negative-phase is expressed with an asterisk.

As far as the phase detector 931 shown in FIG. 4 is concerned, the one-shot pulse generator 933 generates the one-shot pulse OS so as to determine the pulse duration for the charge pump drive signals (up signal UP and down signal DWN). When the data signal DATA has a high frequency, it becomes difficult to generate the one-shot pulse OS. This poses a problem that pulse generation cannot keep up with the high-frequency data signal DATA.

As far as the charge pump 936 shown in FIG. 4 is concerned, when the data signal DATA has a higher frequency, the one-shot pulse OS has a shorter pulse duration, and thus the charge pump drive signals have a shorter pulse duration, and it becomes difficult to respond to these correlative changes. Thus, the high-frequency data signal DATA cannot be handled properly.

Figure 5:
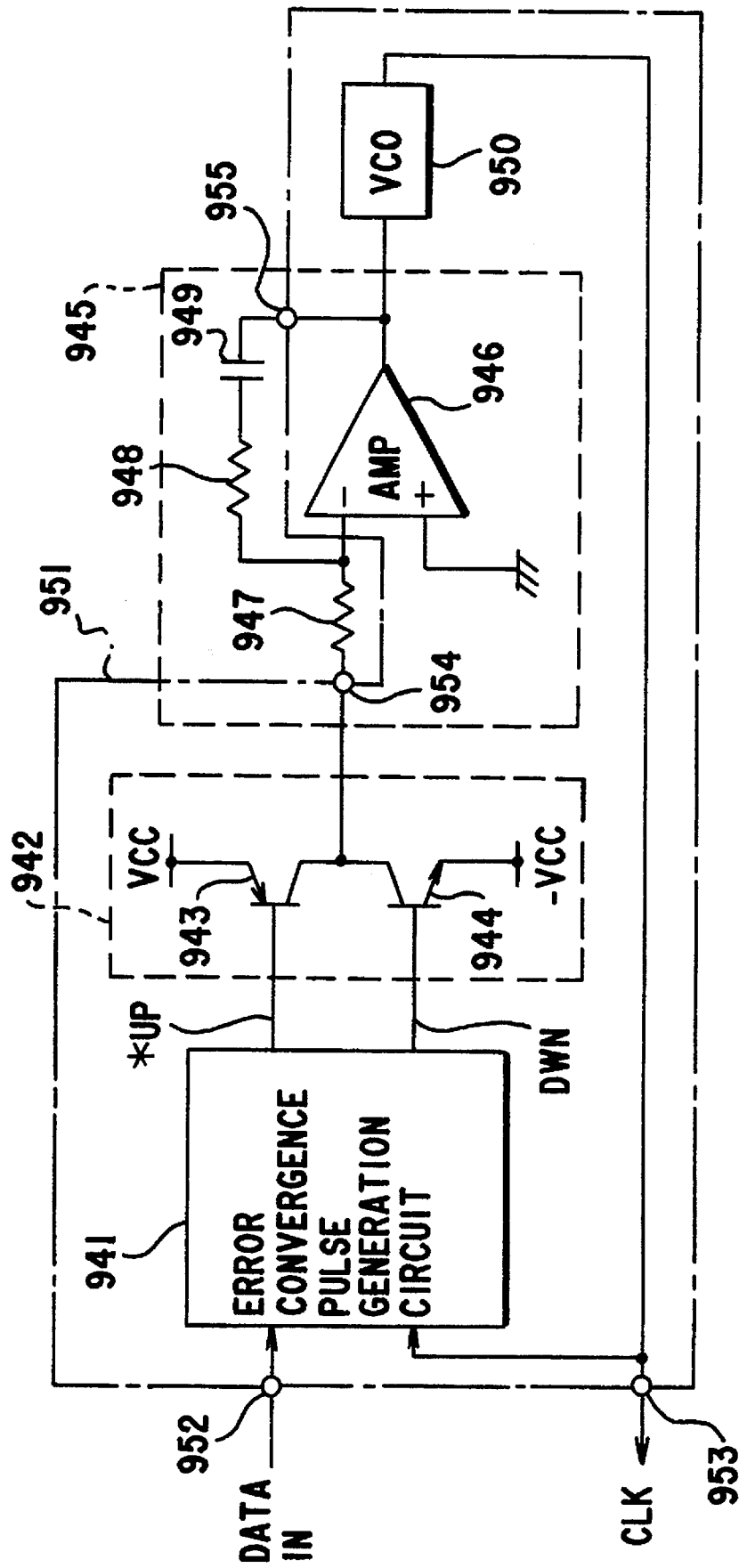
FIG. 5 is a diagram showing an example of a conventional clock reproduction circuit.

As described above, a PLL circuit is used as the clock reproduction circuit. FIG. 5 shows a fundamental constitution of the PLL circuit used as the clock reproduction circuit.

The PLL circuit reproduces a clock CLK latently contained in a series signal DATA IN. In this circuit, an error convergence pulse generator 941, a charge pump 942, a loop filter 945 and a voltage control oscillator (VCO) 950 are interconnected annularly. The error convergence pulse generator 941 can be either of a phase ditector (PD) or a phase frequency detector (PFD).

In recent years, a semiconductor integrated circuit 20 including the error convergence pulse generator 941, the charge pump 942, an operational amplifier 946 in the loop filter 945, and the voltage control oscillator (VCO) has been realized. For defining the characteristic of the loop filter 945 according to the frequency of the data signal DATA, the resistors 947 and 948 and the capacitor 949 that are included in the loop filter 945 are externally connected to the semiconductor integrated circuit 951. Reference numerals 952 to 955 indicate external terminals of the semiconductor integrated circuit 951. A quartz resonator (not shown) is externally connected to the VCO 950.

The error convergence pulse generator 941 generates an up pulse *UP and a down pulse DWN for use in converging an error in frequency or phase of a reproduced clock CLK, namely, a VCO clock, relative to a data signal DATA in a given band or a certain value (0 or ½). When the frequency of the VCO clock CLK is lower than that of the data clock or the data signal DATA or when the VCO clock CLK lags behind the data clock or the data signal DATA, the up pulse *UP is supplied. To the contrary, the down pulse DWN is supplied. The charge pump 942 emits a charge q by a quantity proportional to the pulse duration of the up pulse *UP and absorbs a charge q by a quantity proportional to the pulse duration of the down pulse DWN. For facilitating this operation, the output of the charge pump 942 must have a full swing between the voltage of a power supply line VCC and the voltage of a power supply line −VCC.

Because of the relationship between the external terminal 954 and a bonding wire coupled with the external terminal 954 or the relationships between the external terminal 954 and bonding wire, and other bonding wires or terminals, or a package, the output of the charge pump 942 contains parasitic inductance or capacitance. When the frequency of the data clock or the data signal DATA becomes 1 Gbps or higher, the parasitic inductance or capacitance is not negligible. The output of the charge pump 942 cannot therefore have a full swing, resulting in a distorted waveform. Eventually, the charge pump 942 fails to accomplish the operation of emitting or absorbing charge by a quantity proportional to an input pulse duration. The above problem arises in the circuitry in which an entire loop filter is incorporated in a semiconductor integrated circuit for the sake of compactness. This is because once a data frequency reaches a certain large value, quicker operation is disabled due to the parasitic capacitance in an output line of the charge pump 942.

Figure 6:
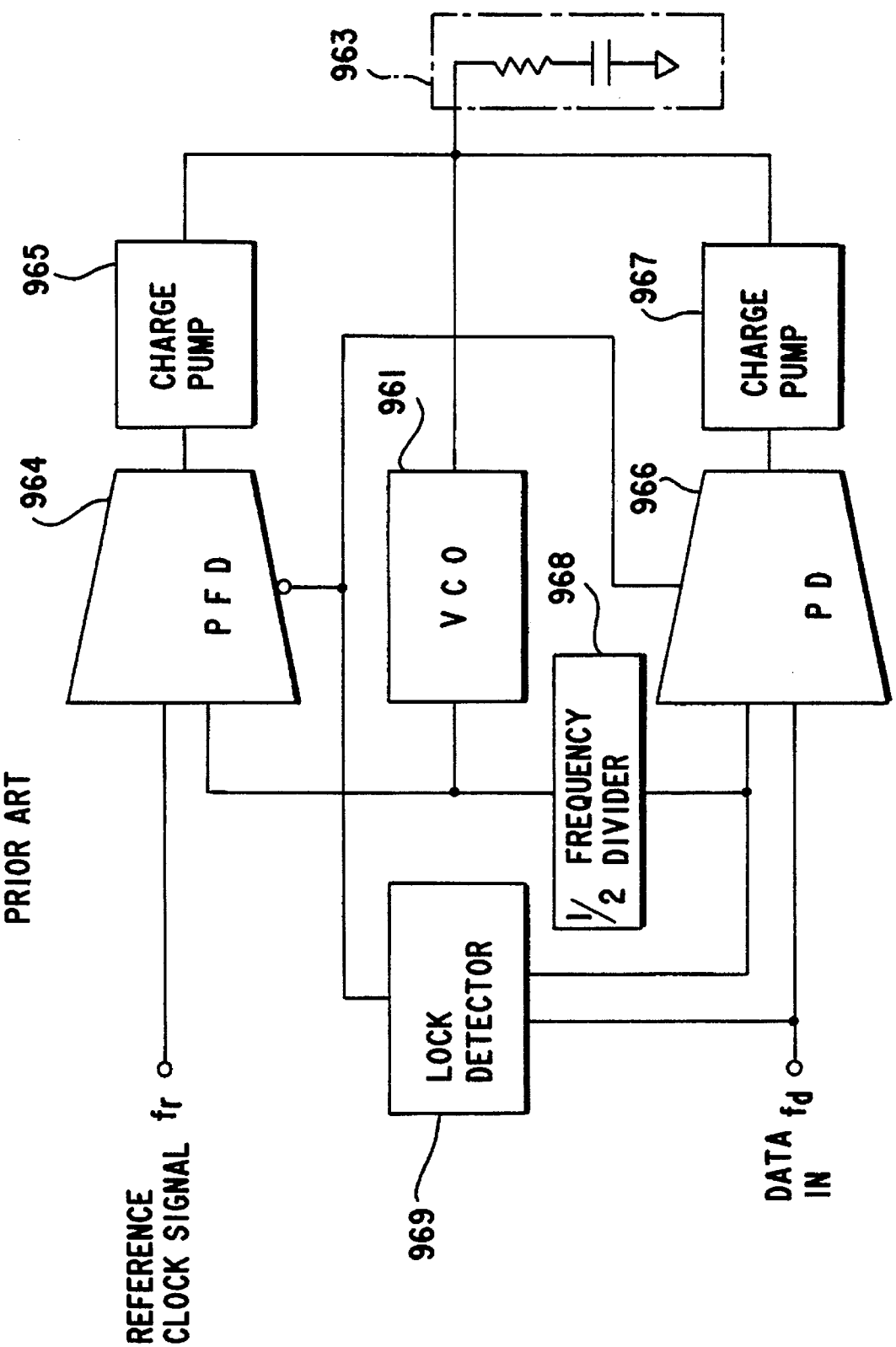
FIG. 6 is a diagram showing an example of a conventional clock reproduction circuit.

As described above, in data communication systems, it is required that a clock having a wide frequency range can be reproduced from a data clock. FIG. 6 is a block diagram showing a constitution of another conventional clock reproduction circuit.

In the clock reproduction circuit shown in FIG. 6, reference numeral 961 indicates a voltage controlled oscillator (VCO); 963 indicates a low-pass filter; 964 indicates a phase frequency comparator (PFD); 965 indicates a PFD charge pump; 966 indicates a phase comparator (PD); 967 indicates a PD charge pump; 968 indicates a ½ frequency divider; and 969 indicates a phase error detector (lock detector). In this clock reproduction circuit, the VCO 961, the low pass filter 963, the PFD 964, and the PFD charge pump 967 constitute a first loop, and the VCO 161, the low pass filter 963, the PD 966 and the PD charge pump 967 constitute a second loop. In the first loop, the PFD 964 compares a clock output from the VCO 961 with a reference clock fr and the compared result is fed back to the VCO 961 via the PFD charge pump 965 and the low pass filter 963. In this way, the clock output from the VCO 961 is synchronized with the reference clock so that their frequencies agree. In the second loop, the ½ frequency divider 968 divides the clock output from the VCO 961, the PD 966 compares phases of the divided clock and the data signal, and the compared result is fed back to the VCO 961 via the PD charge pump 967 and the low pass filter 963. In this way, the clock output from the VCO 961 is synchronized with the data clock included in the data signal.

First, the second loop is made inactive and the first loop is made active. The clock output from the VCO 961 is fully synchronized with the reference clock fr in the first loop. When the frequency of the clock almost agrees with that of the reference clock fr, the first loop is made inactive and the second loop is made active by making the PFD 964 inactive and the PD 966 active. In this way, the clock output from the VCO 961 is synchronized with the data signal. Namely, the data clock necessary to reproduce the data signal is reproduced. When the VCO clock output from the VCO 961 becomes not synchronous with the data signal due to changes of the frequency and the phase of the data signal, the lock detector 969 detects this state and makes the second loop inactive and the first loop active. When the frequency of the VCO clock agrees with that of the reference clock fr, the first loop is switched to the second loop. In this way, the VCO clock is made synchronous with the data signal again.

Figure 16:
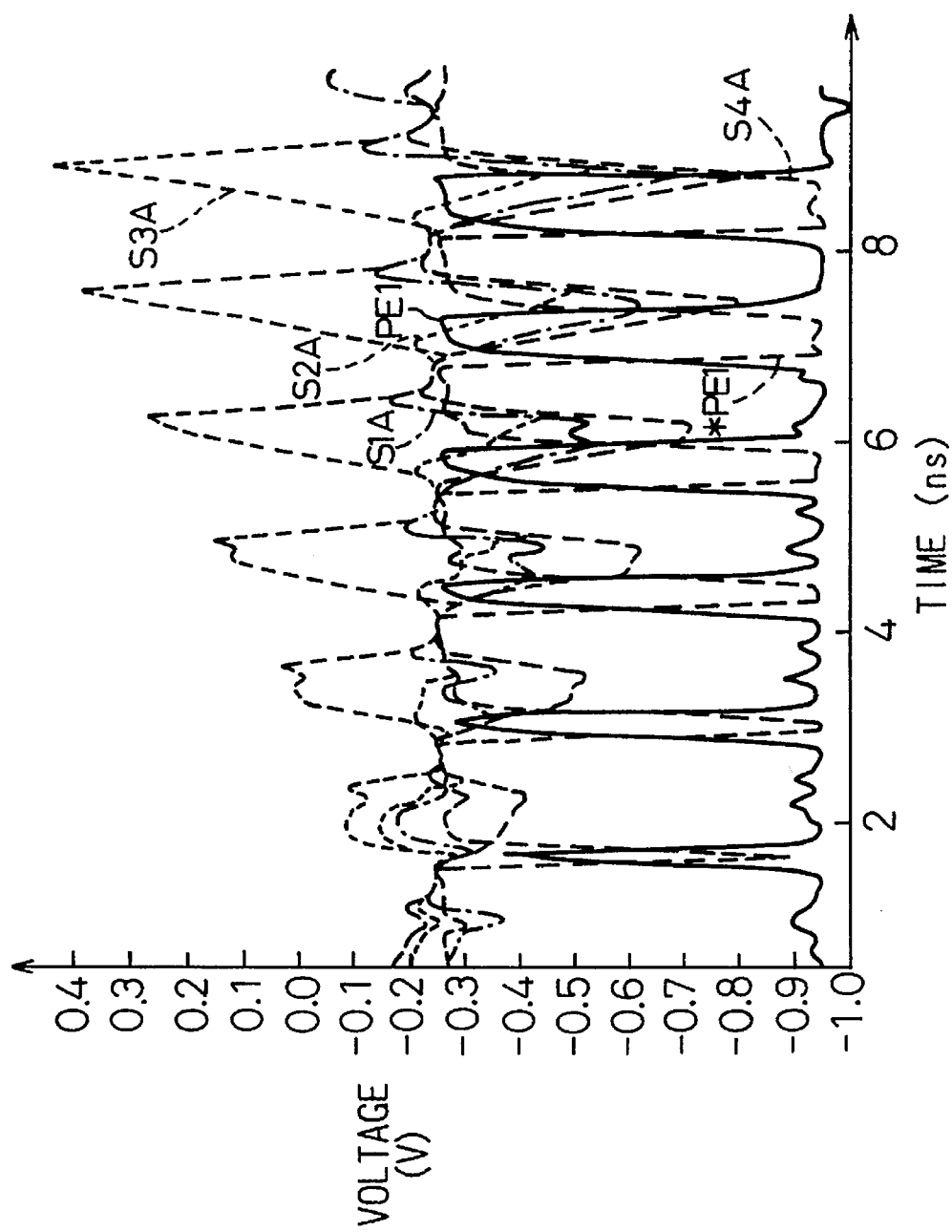
FIG. 16 is a waveform showing an another simulation result of the second embodiment.

When the PLL circuit reproduces the clock from the NRZ data signal, both the frequency and the phase are required to agree with each other. However, it is difficult to directly synchronize both the frequency and the phase with the data clock. Therefore, as shown in FIG. 16, the frequency of the VCO clock is first made to almost agree with that of the reference clock fr in the first loop, then, the phase of the VCO clock is made to agree with that of the data signal in the second loop.

As described above, in the clock reproduction circuit shown in FIG. 6, the switching of the first loop to the second loop is performed by the lock detector. The lock detector performs this switching by changing the active states of the PFD and the PD. However, because there is an offset between the PFD and the PD, there occurs a problem that comparatively long time is necessary to synchronize the VCO clock with the data signal after the first loop is switched to the second loop. Further, when the VCO clock is not synchronous with the data signal, the first loop is made active again. However, a comparatively long time is necessary to synchronize the VCO clock with the reference clock because of an overshoot of the phase. Namely, when the VCO clock is not synchronous with the data signal, a comparatively long time is needed until the VCO clock is synchronous with the data signal again. Due to this problem, the communication efficiency decreases because the time needed for synchronizing is long.

In the following, the embodiments of the present invention will be described with reference to figures. In the figures, elements having same constitutions or similar constitutions are indicated by a same reference.

Figure 7:
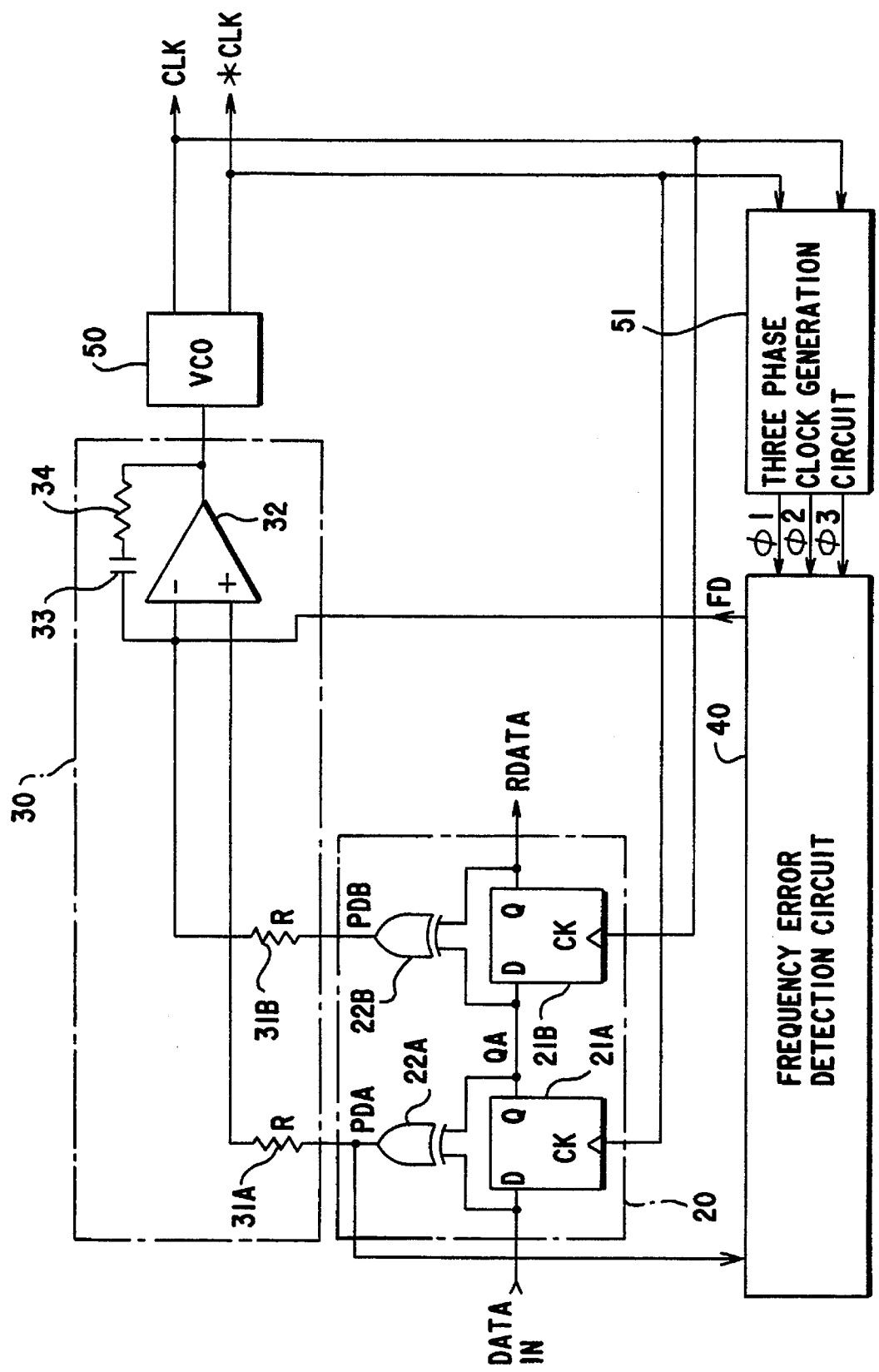
FIG. 7 is a diagram of a clock reproduction circuit of a first embodiment.

FIG. 7 shows a clock reproduction circuit of the first embodiment. As shown in FIG. 7, the clock reproduction circuit includes a phase detector 20; a loop filter 30; a frequency error detection circuit 40; a voltage controlled oscillator (VCO) 50; and a three phase clock generation circuit 51. The phase detector 20 receives a data signal DATA IN (hereinafter, DATA is used.) and outputs a retimed data signal RDATA. The VCO outputs complementary clocks CLK and *CLK, namely, VCO clocks.

In a phase detection circuit 20, two D-type flip-flops 21A and 21B are serially connected, input terminals of an exclusive OR gate 22A are connected to data input and output terminals of the D-type flip-flop 21A, input terminals of an exclusive OR gate 22B are connected to data input and output terminals of the D-type flip-flop 21B.

The data signal DATA is supplied to the input terminal D of the D-type flip-flop 21A, a positive-phase clock CLK is supplied to a clock input terminal of the D-type flip-flop 21B, and a negative-phase clock *CLK, which is an inverted signal of the clock CLK, is supplied to clock input terminals of the D-type flip-flop 21A.

Signals of data output terminals Q of the D-type flip-flops 21A and 21B are made QA and RDATA. Signals of output terminals of the exclusive OR gates 22A and 22B are made PDA and PDB.

The data signal DATA may be a signal which continues as either 0 or 1 for a plurality of cycles, for example, twenty cycles. However, when the data signal DATA is such a signal, it is difficult to represent the signal in the figure because the volume of the waveforms becomes large. Therefore, in order to easily represent the data, the data signal DATA is represented as a pulse stream which periodically changes for each cycle. This representation is common to the other embodiments.

The phase error signal PDA is at a high level from when the data signal DATA rises to when the negative-phase clock *CLK rises, and its pulse width represents a phase error of the data signal DATA relative to the negative-phase clock *CLK. When the data signal DATA changes at high frequency, the pulses of the data signal approach to sine-waves and the low level portions of the pulses overlap those of neighboring pulses. These overlapping cause edge shifts of the data signal DATA, and these edge shifts cause phase jitter in the negative-phase clock *CLK. The signal PDB is used to improve the phase jitter.

The output of the phase detector 20 is supplied to the loop filter 30 and the frequency error detection circuit 20.

The loop filter 30 is formed by combining a low pass filter with an adding circuit. Terminals of resistors 31A 31B which determine a ratio of the adding operation are respectively connected to output terminals of exclusive OR gates 22A and 22B, and the other terminals of the resistor 31A is connected to a non-inverting input terminal of an operational amplifier 32, and the other terminal of the resistor 31B is connected to an inverting input terminal of the operational amplifier 32. A capacitor 33 and a resistor 34 are serially connected between the inverting input terminal and output terminal of the operational amplifier 32 in order to make this circuit a low pass filter. When the resistance value of the resistor 31B is R, the resistance values of the resistor 31A is also R.

Therefore, relating to the phase error signal, the loop filter 30 passes low frequency components of the signal PDA-PDB.

The frequency error detection circuit 40 outputs a frequency error signal FD having a value proportion to the phase difference between neighboring pulses of the phase error signal PDA base on the phase error signal PDA and the clocks CLK and *CLK.

The voltage controlled oscillator (VCO) 50 outputs the complementary clocks CLK and *CLK whose frequency is proportion to an output voltage of the loop filter 30. The VCO 50 is set such that when the input voltage is V, the frequency f of the positive clock CLK is represented as f=of+aV. In this formula, a is a constant, and f0 is a self-oscillation frequency.

The clocks CLK and *CLK are supplied to a three-phase clock generation circuit 51, and clocks $\phi 1$, $\phi 2$, $\phi 3$ are generated. As shown in FIG. 10, the frequencies of the clocks $\phi 1$, $\phi 2$, $\phi 3$ are respectively three times of that of the clock CLK. The duty ratios of the clocks $\phi 1$, $\phi 2$, $\phi 3$ are respectively one third. The phase difference between the clock $\phi 2$ and $\phi 1$ and the phase difference between the clock $\phi 3$ and $\phi 2$ are respectively equal to one cycle of the clock CLK. The clocks $\phi 1$, $\phi 2$, $\phi 3$ are used in the frequency error detection circuit 40.

Figure 8:
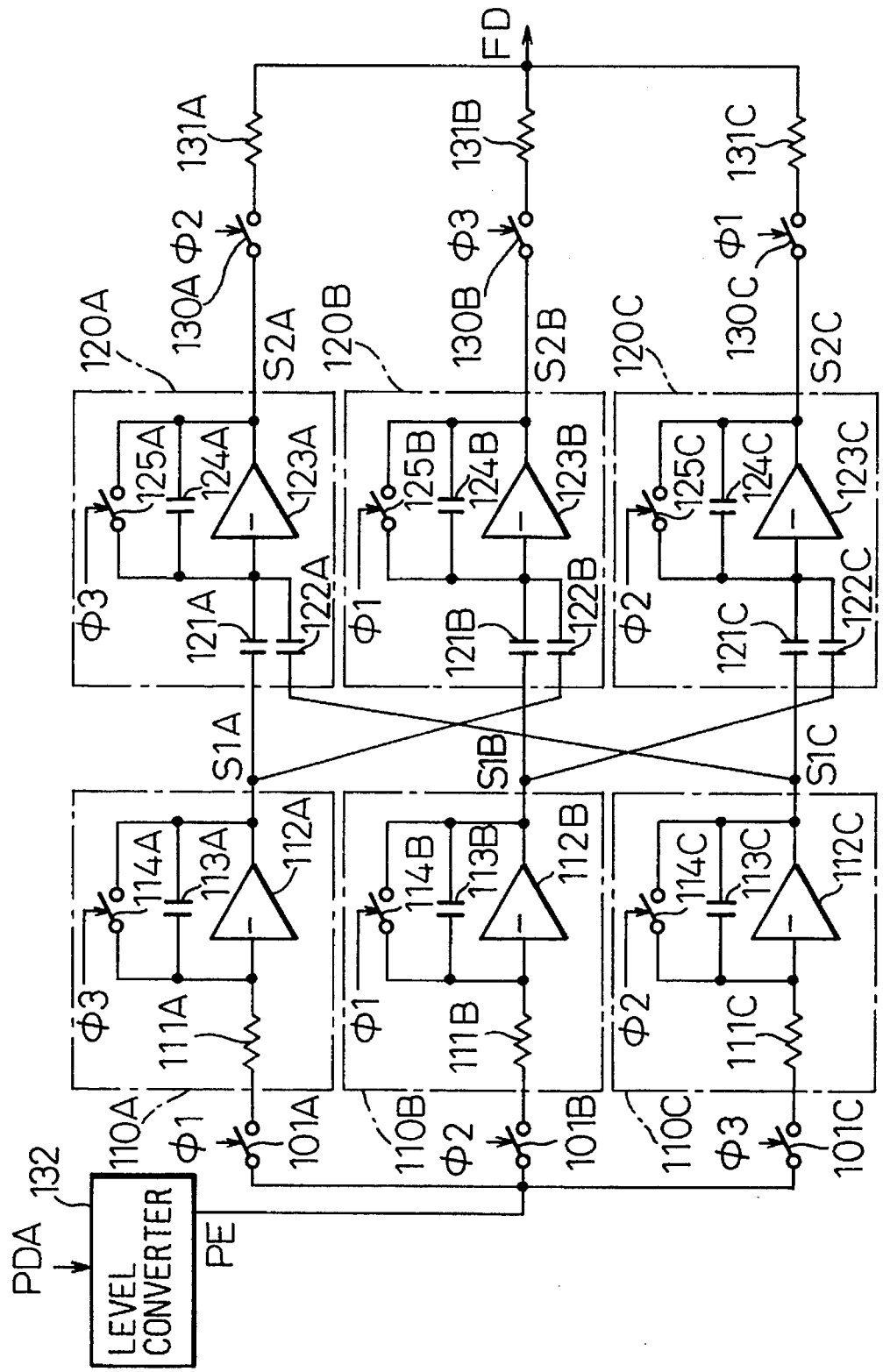
FIG. 8 is a circuit diagram of a frequency error detection circuit shown in FIG. 7.

FIG. 8 shows an example of a constitution of the frequency error detection circuit 40. The frequency error detection circuit 40 has three circuits arranged in parallel, each of which has the same constitution.

The frequency error detection circuit 40 provides a level conversion circuit 132 at an input portion. The level conversion circuit 132 changes the phase error signal PDA, whose low level is zero level, into a phase error signal PE in which the average value of the low level and the high level is zero level as shown in FIG. 3.

The accuracy of the phase error calculation obtained by integrating pulses of the phase error signal PE during one cycle is better than that obtained by integrating pulses of only a high level. The reason is as follows; when times t1, t2 and T are determined as shown in FIG. 4, $$-t1+t2=-(T-t2)+t2=2t2-T,$$

wherein T indicates one cycle. T does not abruptly change because the loop filter 30 exists. When values of the above formula of two neighboring pulses are respectively calculated for each cycle and a difference between the two values is calculated, T is canceled and the difference indicates two times the phase error.

An output terminal of the level conversion circuit 132 is connected to the integrating circuits 110A, 110B and 110C via switches 101A, 101B and 101C respectively. In the integrating circuit 110A, a resistor 111A is connected to an input terminal of an inverting amplifier circuit 112A, a capacitor 113A and a switch element 114A are connected between an input terminal and an output terminal of the inverting amplifier circuit 112A in parallel. The integrating circuits 110B and 110C have same constitutions as the integrating circuit 110A.

The output terminal of the integrating circuit 110A is connected to one input terminal of an adding circuit 120A having two input terminals. An output terminal of the integrating circuit 110C is connected to the other input terminal of the adding circuit 120A. The two input terminals of the adding circuit 120A are respectively connected to two capacitors 121A and 122A, and the two capacitors 121A and 122A are further commonly connected to an input terminal of an inverting amplifier circuit 123A. A capacitor 124A and a switch element 125A are connected in parallel between the input terminal and the output terminal of the inverting amplifier circuit 123A. The adding circuits 120B and 120C have same constitutions as the integrating circuit 120A. The output terminals of the integrating circuits 110B and 110A are connected to two input terminals of the adding circuit 120B, and the output terminals of the integrating circuits 110C and 110B are connected to the two input terminals of the adding circuit 120C.

Each output terminal of the adding circuits 120A, 120B and 120C is connected to a common terminal via each of switch elements 130A, 130B and 130C and resistors 131A, 131B and 131C respectively.

The switch elements 101A, 114B, 125B and 130C turn on when the clock $\phi1$ is at a high level, the switch elements 101B, 114C, 125C and 130A turn on when the clock $\phi2$ is at a high level, and the switch elements 101C, 114A, 125A and 130B turn on when the clock $\phi3$ is at a high level.

Next, the operations of the frequency error detection circuit 40 will be described with reference to FIG. 10.

When each of the clocks $\phi1/\phi2/\phi3$ is at a high level, each of the switch elements 101A/101B/101C respectively turns on, and each of the integrating circuits 110A/110B/110C respectively integrates the phase error signal PE. This representations means that when the clock $\phi1$ is high level, the switch element 101A turns on, and the integrating circuit 110A integrates the phase error signal PE, and when the clock $\phi2$ is high level, the switch element 101B turns on, and the integrating circuit 110B integrates the phase error signal PE, and so forth. In the following, this representation will be used.

When the clock $\phi1$ is at a high level, an integrated value S1A of the integrating circuit 110A and an integrated value S1C of the integrating circuit 110C are supplied to the adding circuit 120A. Although the integrated value S1A changes, the integrated value S1C is constant because the switch element 101C turns off. Therefore, S1C does not influence the output of the adding circuit 120A which calculates a change of a sum of S1A and S1C. However, when the clock $\phi1$ changes to a low level and the clock $\phi2$ changes to a high level, the switch element 114C turns off, therefore, the integrated value S1C changes. The output of the adding circuit 120A changes to positive when the integrated value S1C is negative, and it changes to negative when the integrated value S1C is positive. The switch element 114A turns off and, therefore, the integrated value S1a does not change and it is held constant. Consequently, S1A does not influence the output of the adding circuit 120A. Therefore, the output of the adding circuit 120A is proportion to (S1A–S1C). This means that the adding circuits 120A to 120C respectively operate as subtractors at the reset time of the integrating circuits 110C, 110A and 110B.

In this way, when each of the clocks $\phi3/\phi1/\phi2$ is respectively high level, each of the adding circuits 120A/120B/120C outputs each of frequency errors S2A/S2B/S2C. In this period, each of the frequency errors S2A/S2B/S2C are held constant because each of the switch elements 101A/101B/101C is off. Further, when each clock $\phi2/\phi3/\phi1$ changes to high level, each switch 130A/130B/130C turn on, therefore, potentials proportion to each of the frequency errors S2A, S2B and S2C are output as frequency errors FD.

Next, when each of the clocks $\phi3/\phi1/\phi2$ is at a high level, the integrated values of the integrating circuits 110A, 110B and 110C and the added values of the adding circuits 120A, 120B and 120C are reset, and each of capacitors 124A/124B/124C is also reset.

Next, the operations of the clock reproduction circuit shown in FIG. 7 will be described.

In order to remove phase jitters, the low frequency components of a difference between a phase error signal (PDA+PDC)–PDB and the frequency error signal FD is supplied to an input terminal of the voltage controlled oscillator (VCO) 50. When the frequency error is large, the phase error signal (PDA+PDC)–PDB changes at random and its time average value becomes zero. Therefore, the frequency error signal FD contributes to the frequency convergence.

Namely, when the frequency of the clock CLK is larger than that of a data clock CLK0 included in the data signal DATA, it is apparent from FIG. 10 that the frequency error signal FD becomes negative, the input voltage to the VCO 50 decreases, and the frequency of the clock CLK decreases. When the condition is opposite, the operations are also opposite.

When the frequency of the clock CLK approaches the frequency of the data clock CLK0, the frequency error signal FD approaches to zero and the phase convergence operation using the phase error signal (PDA+PDC)–PDB starts.

In the first embodiment, the difference between two neighboring pulses of the frequency error signal is calculated for each pulse of the frequency error signal. Therefore, in the present invention, the phase error can be detected without the cycle slips which are necessary in the prior art, the response time of the frequency error detection circuit 40 is improved, and a lower limit, of a frequency error to which the frequency error detection circuit responds, can be decreased. Consequently, it is possible to smoothly move to the phase convergence operation.

Figure 11:
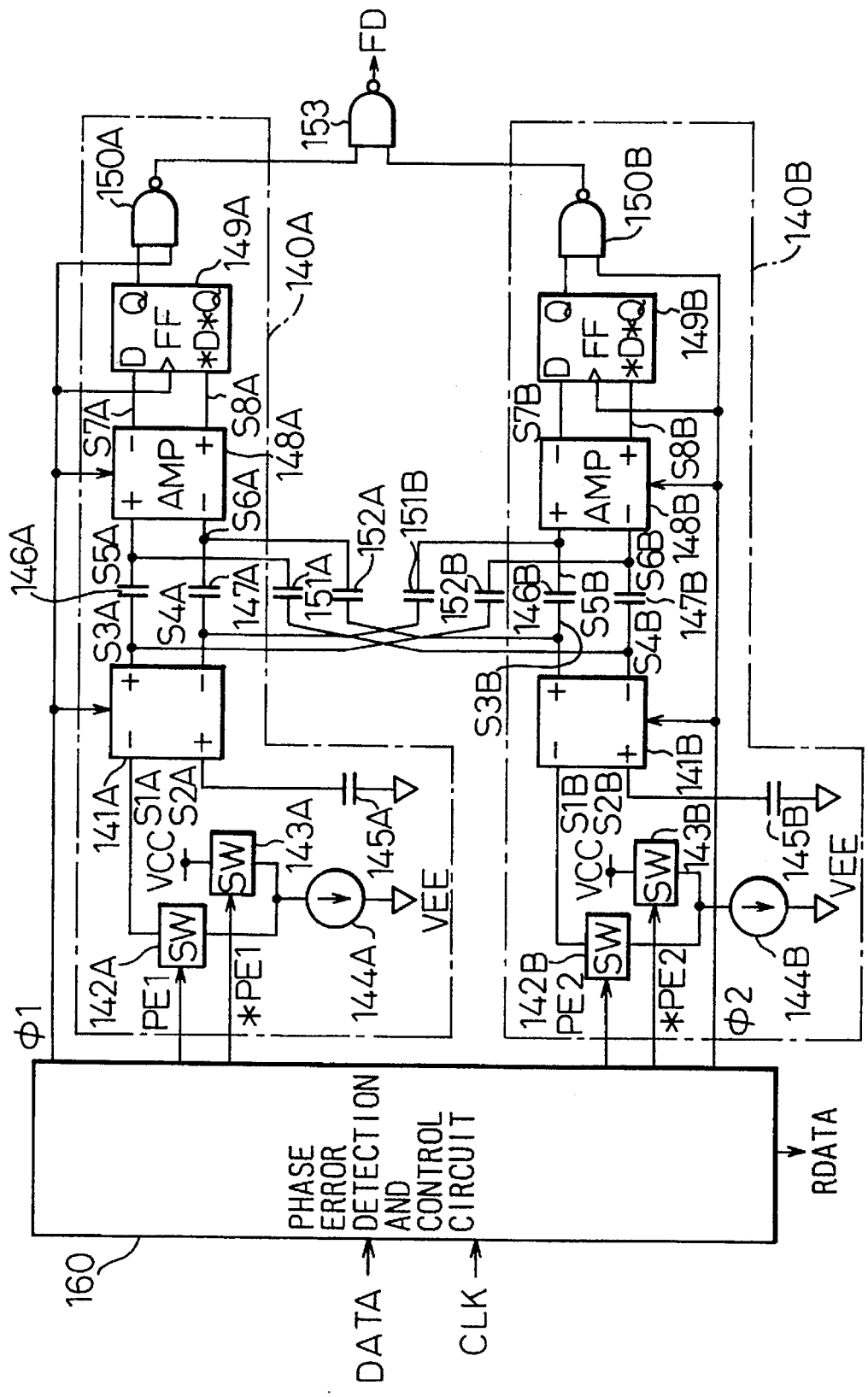
FIG. 11 is a circuit diagram of a frequency error detection circuit of a second embodiment.

FIG. 11 shows a frequency error detection circuit of the second embodiment.

The frequency error detection circuit is, for example, applied to the clock reproduction circuit shown in FIG. 7, and it is used in the place of the frequency error detection circuit 40. However, the frequency error detection circuit is supplied with the input signal DATA and the clock CLK. The frequency error detection circuit 40 shown in FIG. 7 includes three circuits connected in parallel, however, the frequency error detection circuit of the present embodiment includes two circuits consisting of a first circuit 140A and a second circuit 140B connected in parallel.

The first circuit 10A and the second circuit 140B have the same constitution. The first circuit 140A is driven by a timing signal $\phi 1$ supplied from a phase error detection/control circuit 160 and complementary phase error signals PE1 and *PE1, and the second circuit 140B is driven by a timing signal $\phi 2$ supplied from a phase error detection/control circuit 160 and complementary phase error signals PE2 and *PE2.

Figure 12:
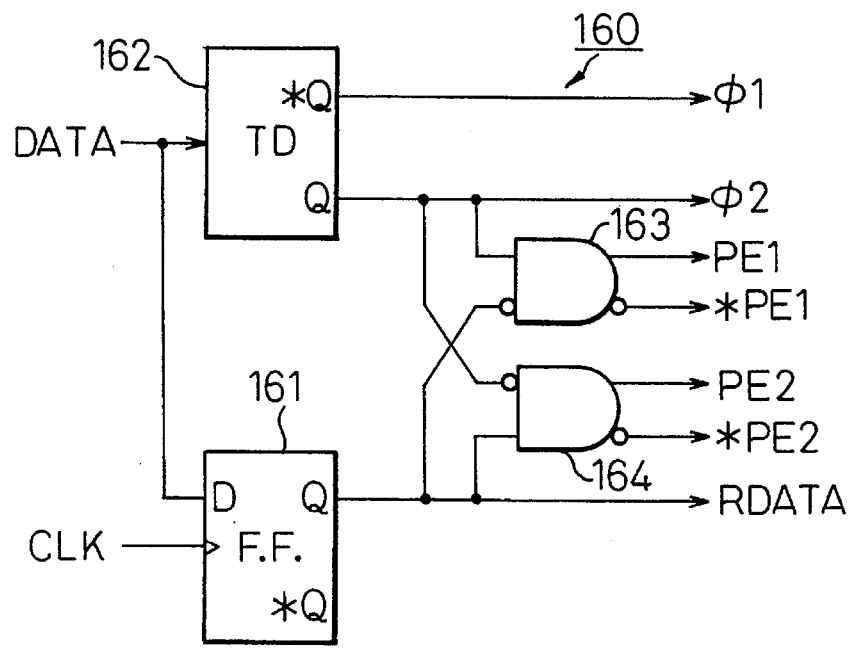
FIG. 12 is a circuit diagram showing a phase error detection and control circuit shown in FIG. 11.

FIG. 12 shows an example of the constitution of the phase error detection/control circuit 160.

A D-type flop flop 161 holds the input signal DATA at the rising edge of the clock CLK and outputs a signal RDATA (retimed data), and a delay circuit 162 delays the input signal DATA by a constant time td and outputs a signal $\phi 2$. The complementary phase error signals PE1 and *PE1 are obtained by an AND gate 163 to which the signal RDATA and the signal $\phi 2$. The AND gate 163 has two output terminals from which a positive-phase signal and a negative-phase signal are output. In the following, this type AND gate is called a complementary type AND gate. The time td is determined to be equal to a signal transmission time from a data input terminal D to a positive-phase output terminal Q in the D-type flip flop 161 after the rise of the clock CLK. The complementary phase error signals PE2 and *PE2 are obtained by a complementary type AND gate 164 to which the signal RDATA and the signal $\phi 2$.

The important signals in the circuit shown in FIG. 12 are shown in FIG. 14. In order to simplify the explanations, signal transmission delays except a delay of the signal $\phi 2$ relative to the input signal DATA are neglected in FIG. 8.

The pulse width of the phase error signal PE1 is the time from the rising edge of the signal $\phi 2$ to the rising edge of the signal RDATA synchronous with the rising of the clock CLK. The pulse width of the phase error signal PE2 is the time from the falling edge of the signal $\phi 2$ to the falling edge of the signal RDATA synchronous with the rising of the clock CLK.

Although the cycle slips do not occur, by detecting signs of differences of neighboring pulses of the phase error signals PE1 and PE2, for example, the signs of (t2–t1) and (t3–t2), the response speed of the frequency error detection circuit 60 can be improved and the lower limit, of a frequency error to which the frequency error detection circuit responds, can be decreased.

In the second embodiment, it is assumed that the frequency of the clock CLK was about 1 GHz, therefore, the frequency error must be calculated in an analog circuit at high speed. Therefore, the frequency error detection circuit is constituted with MES transistors such as a GaAs MES transistor, current switching circuits and differential circuits, and two circuits consisting of a first circuit 140A and a second circuit 140B connected in parallel. Further, improvements in the circuit technology described in the following are made concretely.

(t2–t1) and (t3–t2) shown in FIG. 8 are respectively calculated at the second circuit 140B and the first circuit 140A.

Figure 13A:
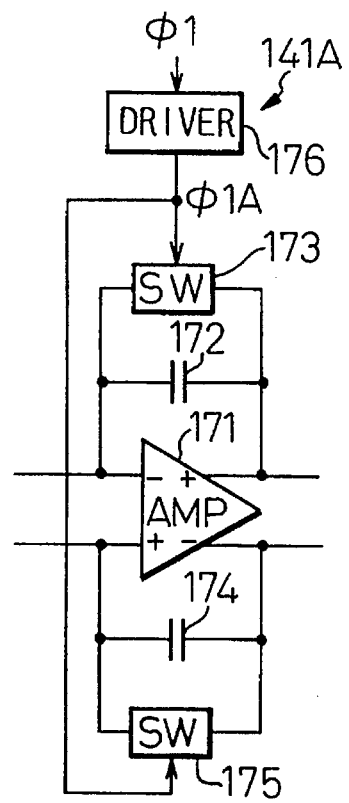
FIG. 13A is a circuit diagram showing an example of an integrating circuit shown in FIG. 11.

An example of constitutions of an integrating circuit 141A in the first circuit 140A is shown in FIG. 13A.

The operational amplifying circuit 171 includes input/output buffers, output amplitude limiting circuits and window comparators (not shown) in addition to an operational amplifying circuit. This circuit has complementary input/output terminals. A capacitor 172 is connected between an inverting input terminal and a non-inverting output terminal of the operational amplifying circuit 171. The capacitor 172 is provided in order to make the operational amplifying circuit as an integrating circuit. A switch element 173 is connected in parallel with the capacitor 172. The switch element 173 discharges electric charge stored in the capacitor 172. Similarly, a capacitor 174 is connected between a non-inverting input terminal and an inverting terminal of the operational amplifying circuit 171, and a switch element 175 is connected in parallel with the capacitor 174. The switches 173 and 175 are controlled on or off by an output signal $\phi 1$ output from a driver 141. The switch elements 173 and 175 are MES transistor switches, and the other switches described in the following are also MES transistor switches. An input terminal of the driver 176 is also a control input terminal of the integrating circuit 141A, and the signal $\phi 1$ is supplied to these terminals.

In FIG. 11, one terminal of the switch element 142A is connected to the inverting input terminal of the integrating circuit 141A, and one terminal of the switch element 143A is connected to a supply voltage line Vcc. Both of the other terminals of the switch elements 142A and 143A are connected to a supply voltage line Vee (all inverted triangles in the figures are the supply voltage line Vee.) via a constant current supply 144A. The integrating circuit 141A operates as an integrating circuit for integrating charge. For example, the potentials of the supply voltage lines Vcc and Vee are respectively 1.2 V and –2.0 V. The non-inverting input terminal of the integrating circuit 141A is connected to the supply voltage line Vee via a capacitor 145A. The capacitor 145A equalizes the parasitic capacities of the two input terminals of the integrating circuit 141A to each other.

Although the circuits respectively connected to the two input terminals of the integrating circuit 141A are unsymmetrical, as shown in FIG. 14, the complementary input signals S1A and S2A become symmetrical because the outputs of the integrating circuit 141A are respectively fed back to the input terminals via the capacitors 172 and 174 shown in FIG. 13A.

When the phase error signal PE1 changes to high level, the switch element 142A turns on, the switch element 142B turns off, and the potential of the signal S1A decreases. Therefore, the potential of the signal S3A increases, the potential of a signal S4A decreases, and the potential of the signal S2A increases. When the phase error signal PE1 changes to a low level, the potentials of the signal S1A, S2A, S3A and S4A at that time are held. The potential of the signal S3A is proportion to the pulse width of the phase error signal PE1.

Figure 13B:
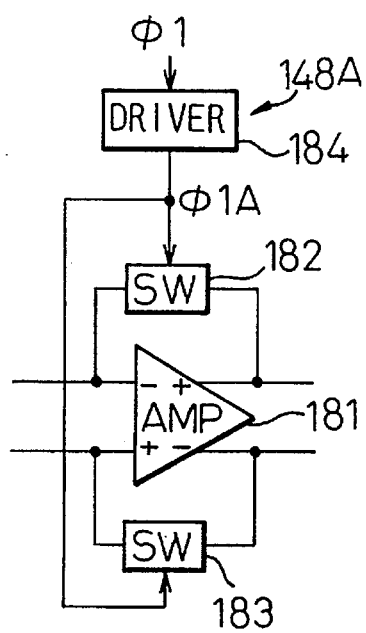
FIG. 13B is a circuit diagram showing an example of a differential amplifying circuit shown in FIG. 11.
Figure 14G:
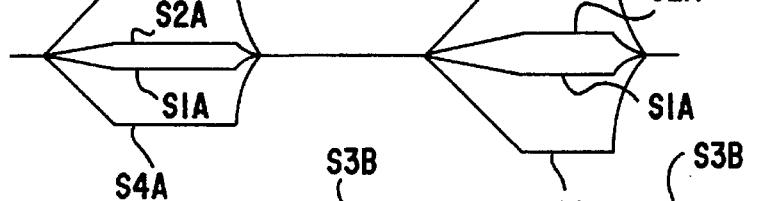
FIG. 14 is a time chart showing operations of the circuit shown in FIG. 11.
Figure 14H:
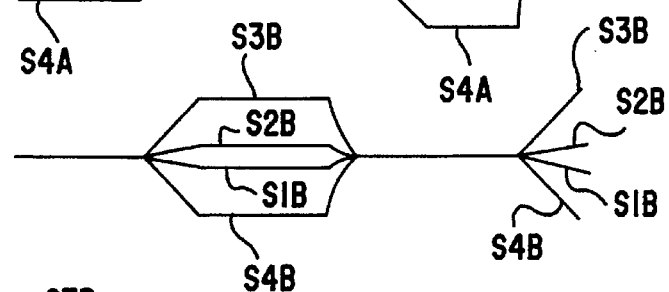
Figure 14I:
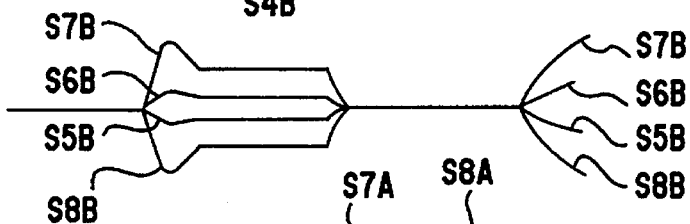
Figure 14J:
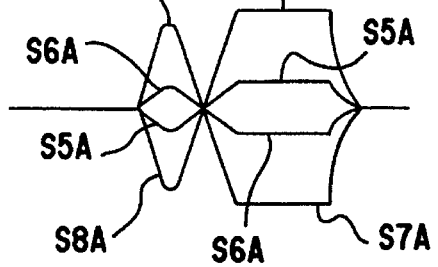

A non-inverting output terminal and an inverting output terminal of the integrating circuit 141A are respectively connected to a non-inverting input terminal and an inverting input terminal of a differential amplifying circuit 148A, having a reset function, via capacitors 146A and 147A. As shown in FIG. 13B, the differential amplifying circuit 148A includes an operational amplifying circuit 181, switches elements 182 and 183 for reset, and a driver 184 for the switch elements. Namely, this circuit 148A has the constitution of the integrating circuit 141A except that the capacitors 172 and 174 are omitted.

In FIG. 11, further, the non-inverting input terminal and the inverting input terminal of the differential amplifying circuit 148A are respectively connected to an inverting input terminal and a non-inverting input terminal of an integrating circuit 141B, in the second circuit 140B, via capacitors 151A and 152A. Similarly, an inverting input terminal and a non-inverting input terminal of an integrating circuit 148B in the second circuit 140B are connected to a non-inverting output terminal and an inverting output terminal of the differential amplifying circuit 141A in the first circuit 140A via capacitors 151B and 152B.

In the same way as in the integrating circuit 141A, when the phase error signal PE2 changes to a high level, the potential of the signal S3B increases, and the potential of the signal S4B decreases. The signal φ1 changes to high level at a same timing as the phase error signal PE2, switch elements 713, 715, 763 and 765 shown in FIGS. 13A and 13B turn on and the electric charges stored in the capacitors 172, 174 and the electric charges stored in the capacitors shown in FIG. 11 are discharged. Input signals S5B and S6B of the inverting and non-inverting terminals of the differential amplifying circuit 148B change as shown in FIG. 14 and the sign of the signal S5B at the rising edge of the phase error signal PE2 coincides with the sign of (t2–t1). The differential amplifying circuit 146B amplifies the signals S5B and S6B and outputs the signals S7B and S8B from an inverting output terminal and a non-inverting output terminal. In the same way as in the input and output signals of the integrating circuit 141B, the input signal and the output signal of the differential amplifying circuit 148B are held until the signal φ2 changes to a high level.

The inverting and non-inverting output terminals of the differential amplifying circuit 148B are respectively connected to the complementary data input terminals D and *D of a D-type flip flop 149B. The clock input terminal of the D-type flip flop 149B is supplied with the signal φ2, and the signals S7B and S8B are converted into binary data at the rising edge of the signal φ2 and held in the D-type flip flops. The signal φ2 is also supplied to the control input terminals of the integrating circuit 141B and the differential amplifying circuit 148B. When the signal φ2 is at a high level, electric charges stored in the capacitors 146B and 147B and capacitors in the integrating circuit 141B and the differential amplifying circuit 148B are discharged. Therefore, when the pulse width difference between neighboring pulses of the phase error signals PE2 and PE1, for example, (t2–t1) shown in FIG. 14, is negative, the non-inverting output terminal Q of the D-type flip flop 149B changes to a high level at the rising edge of the signal φ2 and this data is held at the D-type flip flop 149B until the signal φ2 rises again. This is same as in the D-type flip flop 149A.

The non-inverting output terminals of the D-type flip flops 149A and 149B are respectively connected to input terminals of AND gates 150A and 150B, and the signals φ1 and φ2 indicating that the output data is effective or noneffective are supplied to other input terminals of the D-type flip flops 149A and 149B. Output terminals of the D-type flip flops 149A and 149B are connected to the input terminals of the AND gate 153. A frequency error signal FD output from the AND gate 153 is at a high level when the signal φ2 is at a high level and the pulse width difference between neighboring pulses in the phase error signals PE2 and PE1, for example, (t2–t1) shown in FIG. 14 is negative, or when the signal φ1 is at a high level and the pulse width difference between neighboring pulses of the phase error signals PE1 and PE2, for example, (t3–t2) shown in FIG. 14 is negative.

When the frequency error detection circuit 60 is applied to a clock reproduction circuit, it increases the clock frequency when the frequency error signal FD is at a high level, and it decreases the clock frequency when the frequency error signal FD is at a low level.

Figure 15:
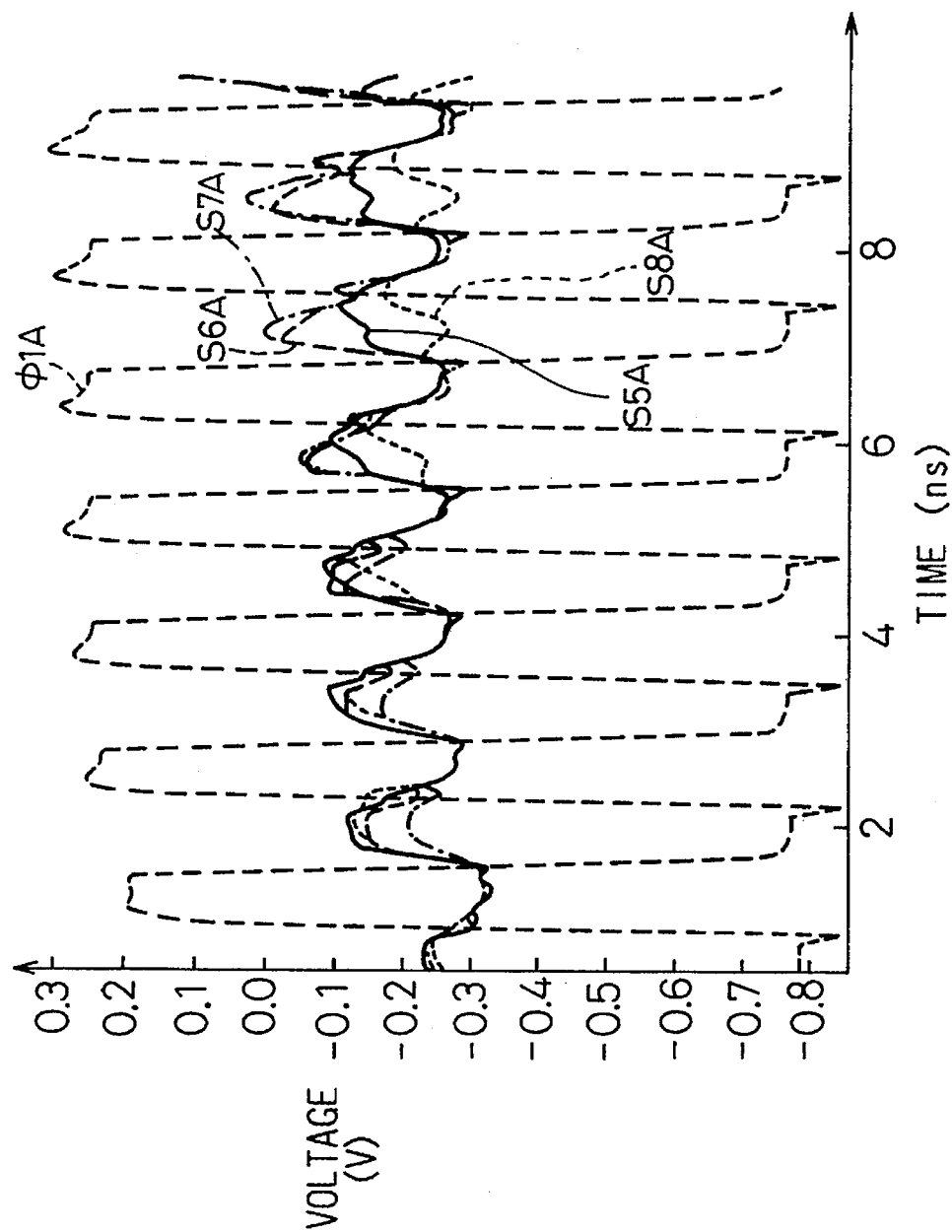
FIG. 15 is a waveform showing a simulation result of the second embodiment.

FIGS. 15 and 16 show simulation results of when the above frequency error detection circuit of the second embodiment is used in the place of the frequency error detection circuit shown in FIG. 7.

The conditions of the simulations are as follows:

Transistors: GaAs transistors;

Frequency of the clock CLK0: 1.85 GHz (constant);

Initial oscillation frequency of the voltage controlled oscillation circuit 50:1.000 GHz.

Figure 17:
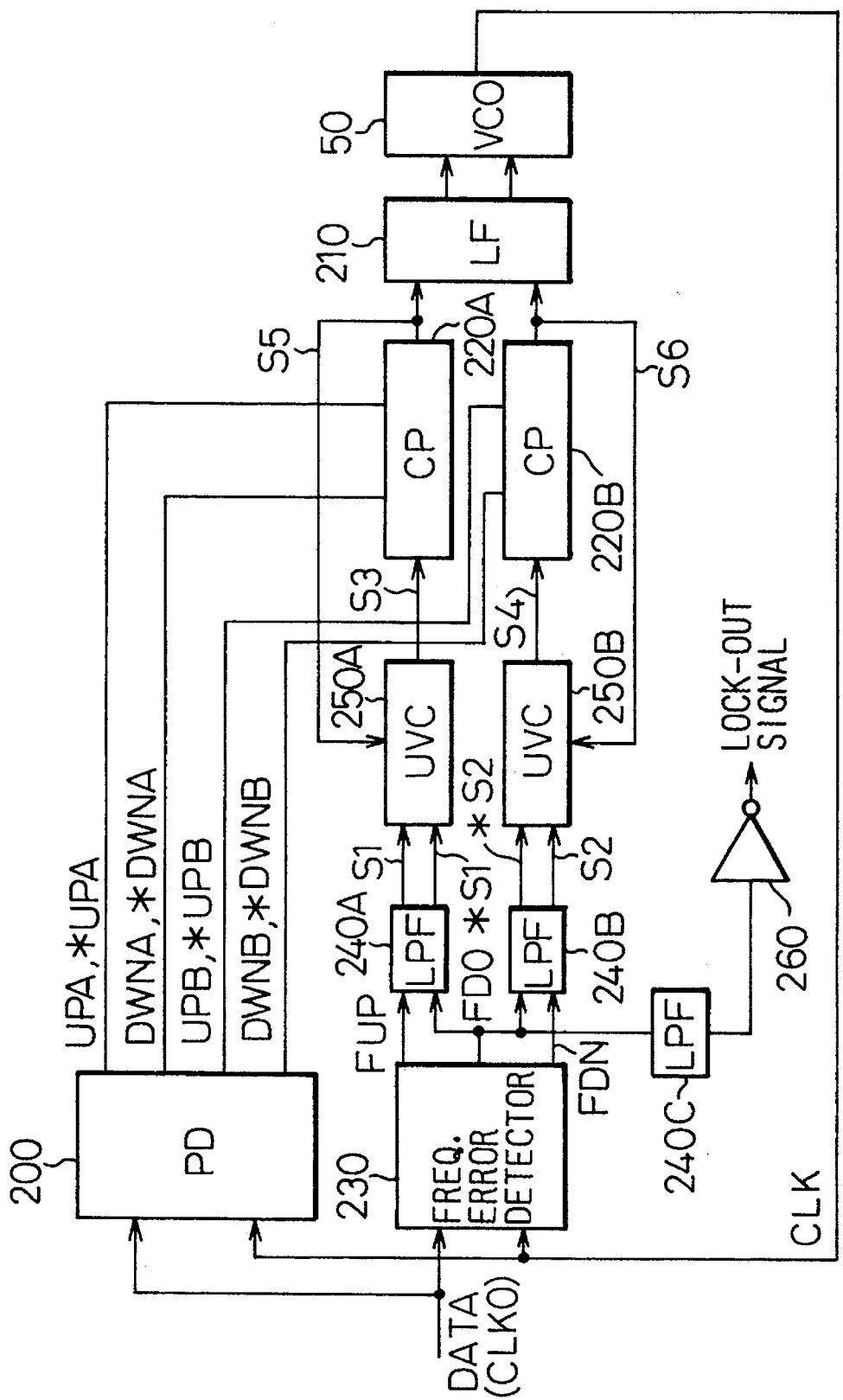
FIG. 17 is a circuit diagram of a frequency error detection circuit of a third embodiment.

FIG. 17 shows a clock reproduction circuit of the third embodiment. In this circuit, in a loop consisting of a phase comparator 200, a loop filter 210 and a voltage controlled oscillator (VCO) 50, a pair of charge pump circuits 220A and 220B are connected between the phase comparator 200 and the loop filter 210.

Figure 27:
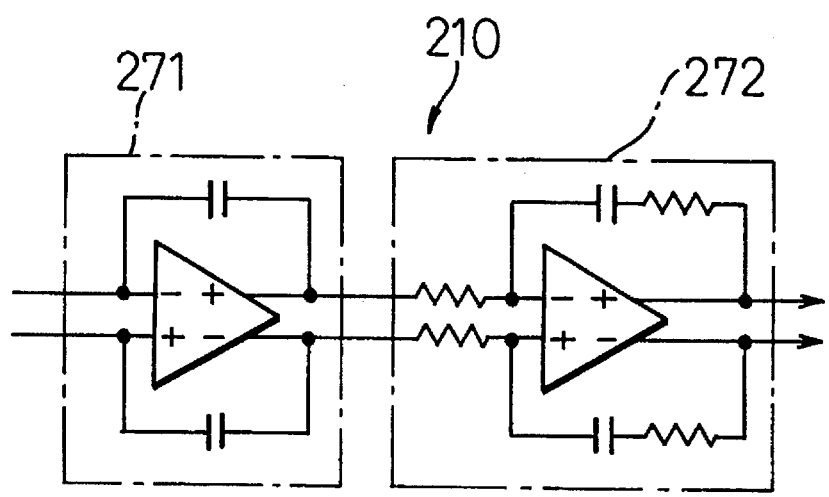
FIG. 27 is a circuit diagram showing an example of a loop filter shown in FIG. 17.

As shown in FIG. 27, in the loop filter 210, a ripple filter 271, which certainly removes ripple components in the high frequency components of a signal, and a low pass filter 272 are serially connected. The gains of the ripple filter 271, and of the low pass filter 272, is about twenty.

FIG. 18 shows an example of constitutions of the phase comparator 200, and FIG. 19 shows operations of the phase comparator 200.

A D-type flip-flop 201A holds the clock CLK at the rising edge of the data signal DATA and outputs a signal CK. Complementary up signals UP1 and *UP1 are obtained by supplying the signal CK1 and the data signal DATA to a complementary output type AND gate 202A. Complementary down signals DWN1 and *DWN1 are obtained by supplying the signal *CK1 and the data signal DATA to an AND gate 203A. Similarly, the complementary up signals UP2 and *UP2 and the complementary down signals DWN2 and *DWN2 are respectively obtained by using the input signal DATA and the clock CLK, and a D-type flip-flop 201B and AND gates 202B and 203B.

Each of the up signals UP1/UP2 changes to high level when the clock CLK is at a high level at each rising edge of the data signals DATA/*DATA and changes to low level simultaneously with either of the data signals DATA/*DATA. Each of the down signals DWN1/DWN2 changes to high level when the clock CLK is low level at each rising edge of the data signals DATA/*DATA and changes to low level simultaneously with the data signal DATA/*DATA.

Therefore, by controlling the clock CLK to advance its phase when either of the up signals UP1 or UP2 is high level and to delay its phase when either of the down signals DWN1 or DWN2 is high level, the clock CLK is controlled so that the phase of the clock CLK approaches the phase of the data signal DATA (clock CLK0)

Figure 20:
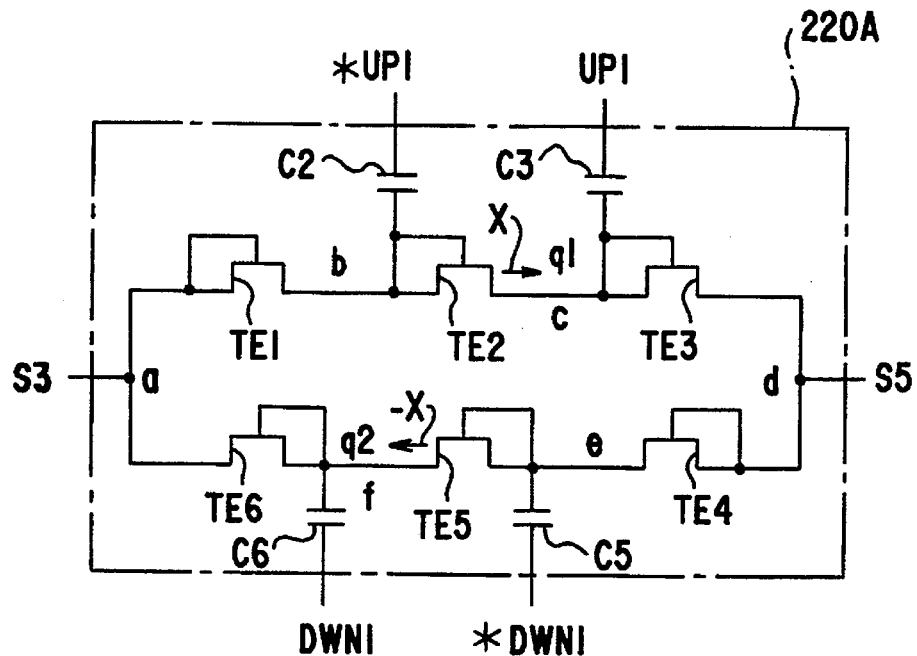
FIG. 20 is a circuit diagram showing an example of a charge pump circuit shown in FIG. 17.
Figure 21:
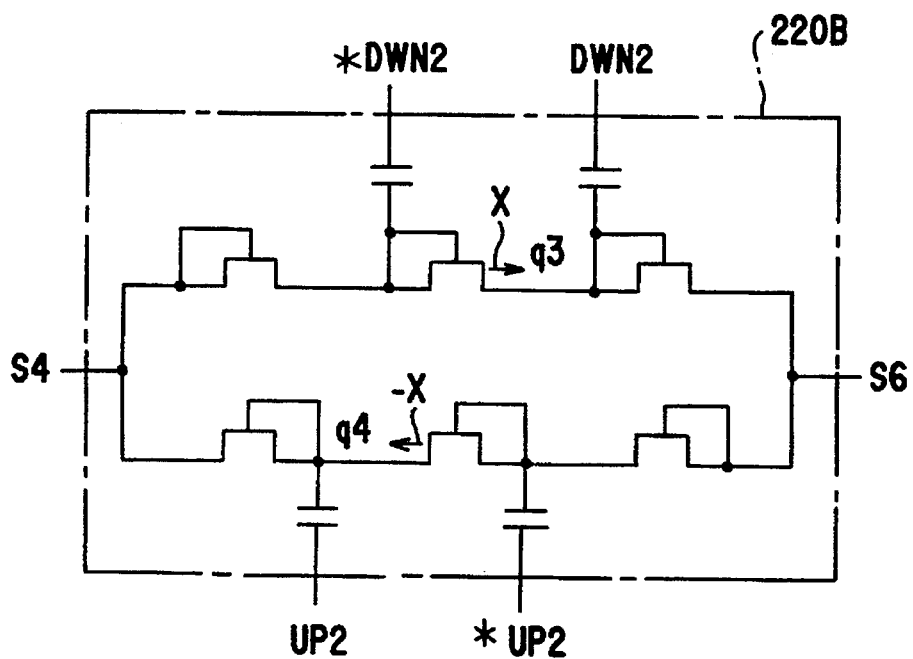
FIG. 21 is a circuit diagram showing an example of the other charge pump circuit shown in FIG. 17.

FIGS. 20–21 show an example of the constitution of the charge pump circuits 220A and 220B. In the charge pump circuit 220A, enhancement type MES (E-MES) transistors TE1 to TE6 are connected to form a loop. A gate and a drain of each of the E-MES transistors TE1 to TE3 are shorted, therefore, each of them operates as a diode of which the forward direction is indicated by the arrow X in the figure. A gate and a source of each of the E-MES transistors TE4 to TE6 are shorted, therefore, each of them operates as a diode of which the forward direction is indicated by the arrow X in the figure.

The up signals *UP1 and UP1 and the down signals *DWN1 and DWN1 are respectively supplied to gates of the E-MES transistors TE2, TE3, TE5 and TE6 via capacitors C2, C3, C5 and C6. The input and output terminals of the charge pump circuit 220A are respectively the drains of the E-MES transistors TE1 and TE4, the input terminal of the charge pump circuit 220A is supplied with a signal S3, and a signal S5 is extracted from the output terminal of the charge pump circuit 220A. As shown in the figure, the lines between the neighboring E-MES transistors are indicated by references a to f.

Now, it is assumed that potentials of the signal S3 and S5 are the same.

The circuit operates in the following manner relating to each pair of the complementary up signals UP1 and *UP1. First, the E-MES transistors TE1 to TE6 are off. When the up signal *UP1 changes from high level to low level and the up signal UP1 changes from low level to high level, the E-MES transistors TE1 and TE3 turn on and the electric charge q1 moves from a to b and from c to d. Next, when the up signal *UP1 changes to a high level and the up signal UP1 changes to a low level, the E-MES transistors TE1 and TEB turn off, the E-MES transistor TE2 turn on and the electric charge q1 moves from b to c. This results in the electric charge q1 moving from a to d.

The circuit operates in the following manner relating to each pair of the complementary down signals DWN1 and *DWN1. First, the E-MES transistors TE1 to TE6 are off. When the down signal *DWN1 changes from a high level to a low level and the down signal DWN1 changes from a low level to a high level, the E-MES transistors TE4 and TE6 turn on and the electric charge q2 moves from d to e and from f to a. Next, when the down signal *DWN1 changes to a high level and the down signal DWN1 changes to a low level, the E-MES transistors TE4 and TE6 turn off, the E-MES transistor TE5 turn on and the electric charge q2 moves from e to f. This results in the electric charge q2 moving from d to a.

Because the potentials of the signals S3 and S5 are the same, q1 is equal to q2.

The charge pump circuit 220B has a same constitution as that of the charge pump circuit 220A. In order to operate the charge pump circuit 220B in an inversed manner compared to the charge pump circuit 220A, down signals DWN2 and *DWN2 and up signals UP2 and *UP2 are supplied to control input terminals of the charge pump circuit 220 B in a form that the down signals DWN2 and *DWN2 correspond to the up signals UP1 and *UP1 and the up signals UP2 and *UP2 correspond to the down signals DWN1 and *DWN1. The units of electric charge q3 and q4 in the charge pump circuit 220B correspond to units of moving electric charge q1 and q2 in the charge pump circuit 220A. Further, the input and output signals of the charge pump circuit 220B are indicated by references S4 and S6.

As described above, after the frequency of the clock CLK is made to be approximately equal to that of the clock CLK0 included in the data signal DATA, in a loop consisting of the phase comparator (PD) 200, the charge pump circuit 220A, the loop filter 210 and the VCO 50, the phase of the clock CLK is converged to the phase of the clock CLK0 by setting the signals S3 and S5 to be equal and setting the signals S4 and S6 to be equal.

When the frequency of the clock CLK is lower than that of the clock CLK0, q1 is made larger than q2 by setting the potential of the signal S3 higher than the potential of the signal S5, and q4 is made larger than q3 by setting the potential of the signal S4 higher than the potential of the signal S6. By these settings, the phase advancing operation of the clock CLK by the up signals UP1 and *UP1 is larger than the phase delaying operation by the down signals DWN1 and *DWN1. Similarly, the phase advancing operation of the clock CLK by the up signals UP2 and *UP2 is larger than the phase delaying operation by the down signals DWN2 and *DWN2. Therefore, the frequency of the clock CLK increases to converge to that of the clock CLK0.

Contrarily, when the frequency of the clock CLK is higher than that of the clock CLK0, the relations between the potentials of the signals S3 and S5 and the relations between the potentials of the signals S4 and S6 are set opposite to the above conditions. By this, the operations are reversed, and the frequency of the clock CLK decreases to converge to that of the clock CLK0.

When the frequency error is large, the up signals UP1 and UP2 and the down signals DWN 1 and DWN2 are set at random, therefore, the function of each charge pump circuit is determined by the voltage between the input and output terminals of each circuit.

By multiple operations of the frequency error and the phase error in the present embodiment, the frequency error can be certainly made converged than in the prior arts and the above first embodiment in which both of the frequency error and the phase error are only combined.

In order to change the unit quantities of the moving electric charges according to the frequency errors as described above, a frequency error detection circuit 230, low pass filters 240A and 240B, and unit value control circuits 250A and 250B are used.

Figure 23:
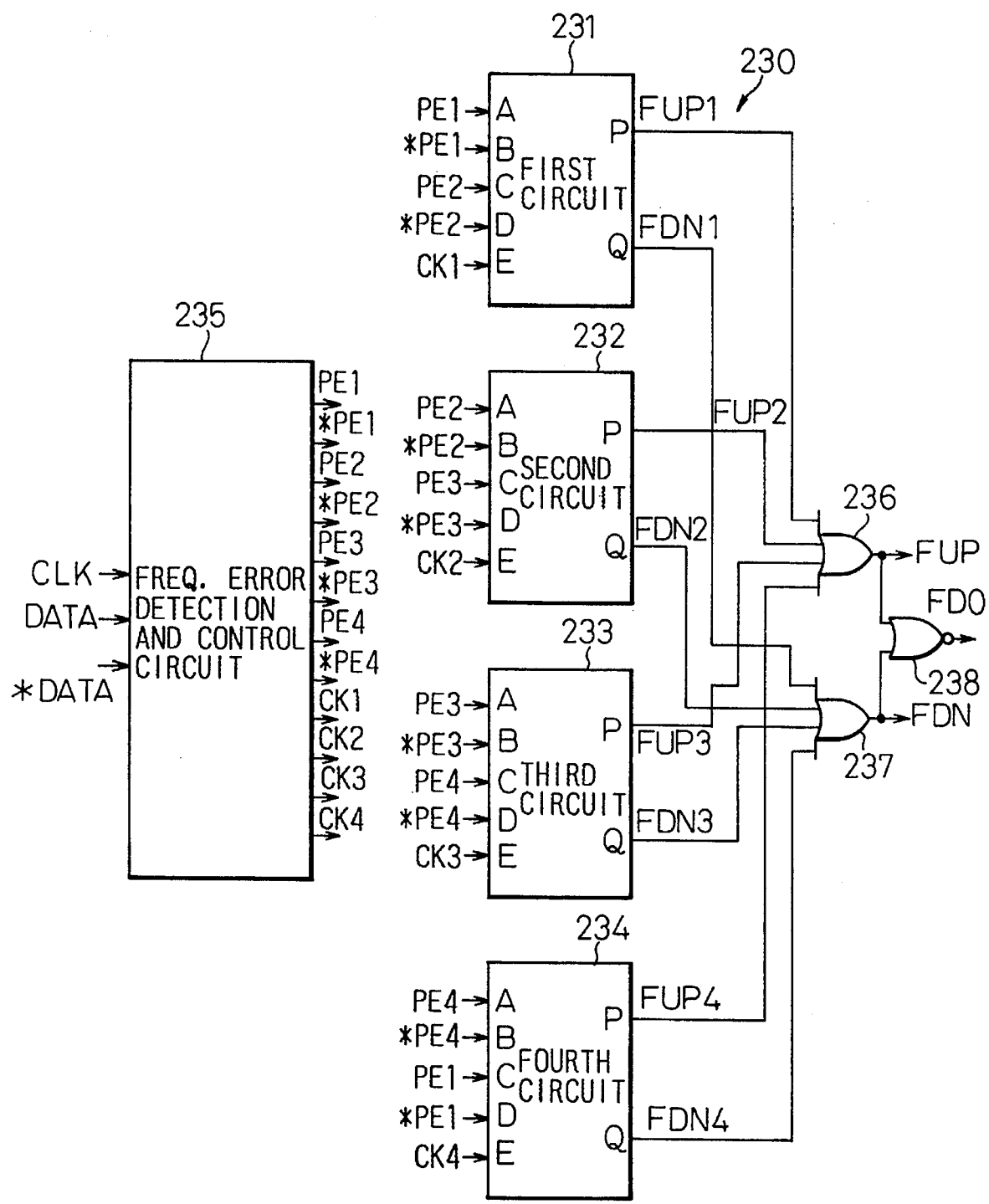
FIG. 23 is a circuit diagram showing an example of a frequency error detection circuit shown in FIG. 17.

One of the constitutional examples of the frequency error detection circuit 230 is shown in FIG. 23.

This detection circuit includes four circuits composed of a first circuit 231 to a fourth circuit 234 connected in parallel. The first circuit 231 to the fourth circuit 234 are driven by a signal from a phase error detection/control circuit 235.

Figure 24:
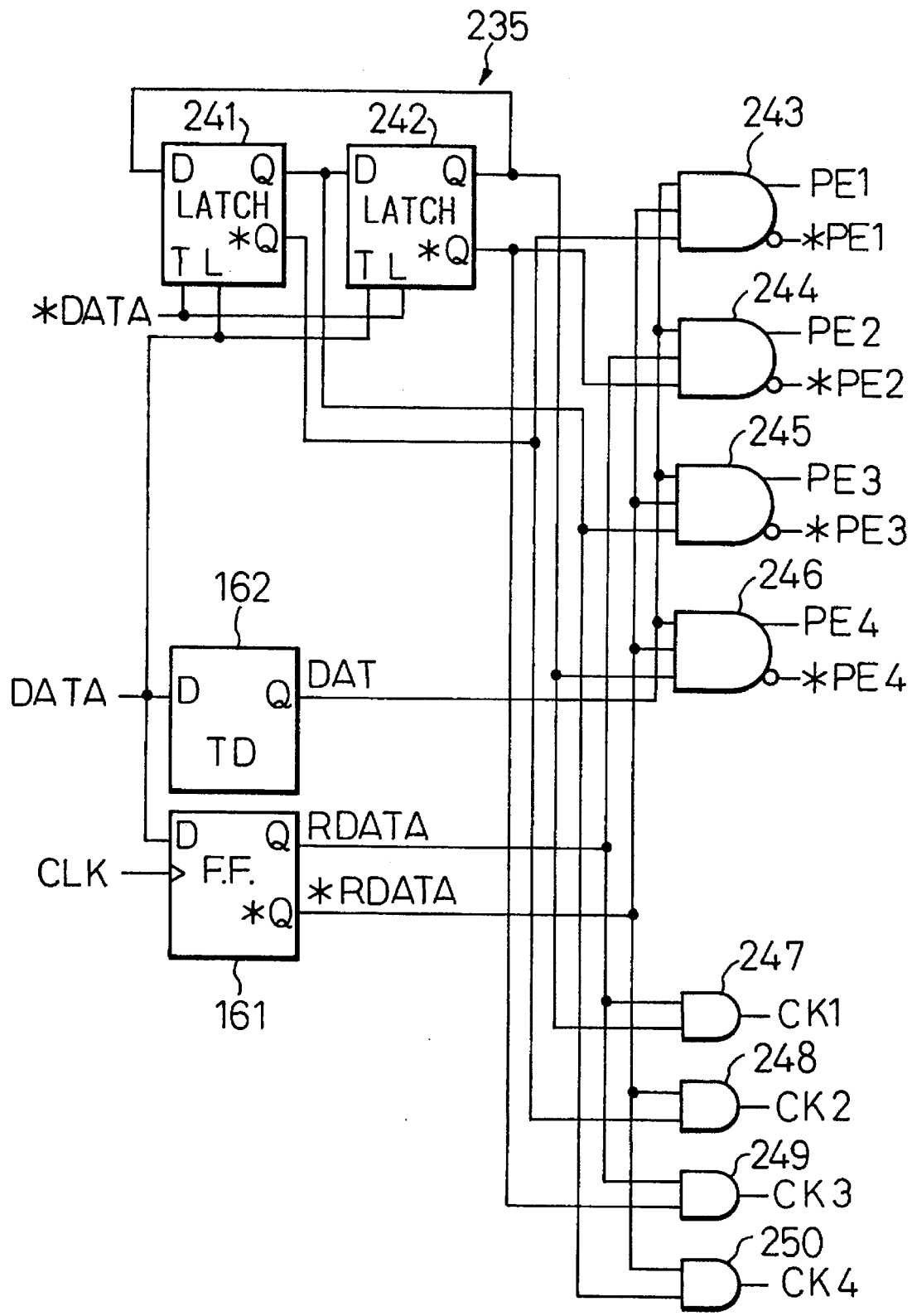

One of the constitutional examples of this circuit 235 is shown in FIG. 24.

Figure 28L:
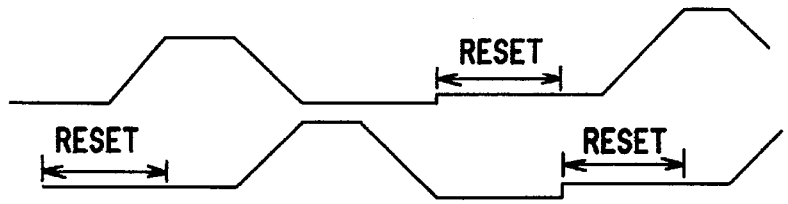
FIG. 28 is a time chart showing operations of the circuits shown in FIGS. 23 to 25.
Figure 28N:
Figure 28O:

In the circuit 235, a constitution of four circuits connected in parallel is realized by adding new constitutions to the circuit shown in FIG. 12. Latch circuits 241 and 242, and AND gates 243 to 250 are added to the D-type flip-flops 161 and the delay circuit 162 shown in FIG. 12. Phase error signals PE1 to PE4 and the complementary signals *PE1 to *PE2 shown in FIG. 28 are generated from the AND gates 243 to 246. The pulse width of the phase error signal PE1 is the time from the rising edge of the signal DATA to the falling edge of the signal RDATA synchronous with the rising edge of the clock CLK. The pulse width of the phase error signal PE2 is the time from the falling edge of the signal DATA to the rising edge of the signal RDATA synchronous with the rising edge of the clock CLK. The pulse width of the phase error signal PE3 is the time from the rising edge of the signal RDATA synchronous with the rising edge of the clock CLK to the falling edge of the signal DATA. The pulse width of the phase error signal PE4 is the time from the falling edge of the signal RDATA synchronous with the rising edge of the clock CLK to the rising edge of the signal DATA.

The latch circuits 241 and 242 operate to divide the input signal DATA by 2 so that each one cycle of the phase error signals PE1 to PE4 and the signals CK1 to CK4 is equal to two cycle of the signal DATA.

In FIG. 24, T and L of each latch circuit respectively indicate a through control signal input terminal and a latch control signal input terminal to which the complementary clock signals are input. A D-type flip-flop circuit 161 is constituted by serially connecting two latch circuits, and a delay circuit 162 is obtained by serially connecting two latch circuits and fixing the control signal input terminals T and L in both circuits at a high level or a low level. By this fixing of the control signal input terminals T and L, the latch circuits are set to through states. Therefore, either of the D-type flip-flop 61, the delay circuit 162, and a ½ frequency divider circuit composed of the circuits 241 and 242 is constituted by a two-stage latch circuit, and the delays at the outputs of these circuits are the same.

Each pulse width difference between the neighboring pulses of the phase error signals PE1 and PE2 such as t2–t1, each pulse width difference between the neighboring pulses of the phase error signals PE3 and PE1 such as t3–t2, each pulse width difference between the neighboring pulses of the phase error signals PE4 and PE3 such as t4–t3, and each pulse width difference between the neighboring pulses of the phase error signals PE1 and PE4 such as t5–t4 shown in FIG. 28 is respectively calculated in each of the first circuits 231 to the fourth circuit 234 having the constitutions shown in FIG. 23.

As shown in FIG. 28, the timing signals CK1 to CK4 are obtained by serially extracting either the high level portions or the low level portions of the signal RDATA.

Input and output signals of each constitutional element in FIG. 24 are complementary signals, however, in order to simplify the explanation, only a few outputs are represented as complementary signals, and the other pairs of signals are represented as a single signal.

Figure 25:
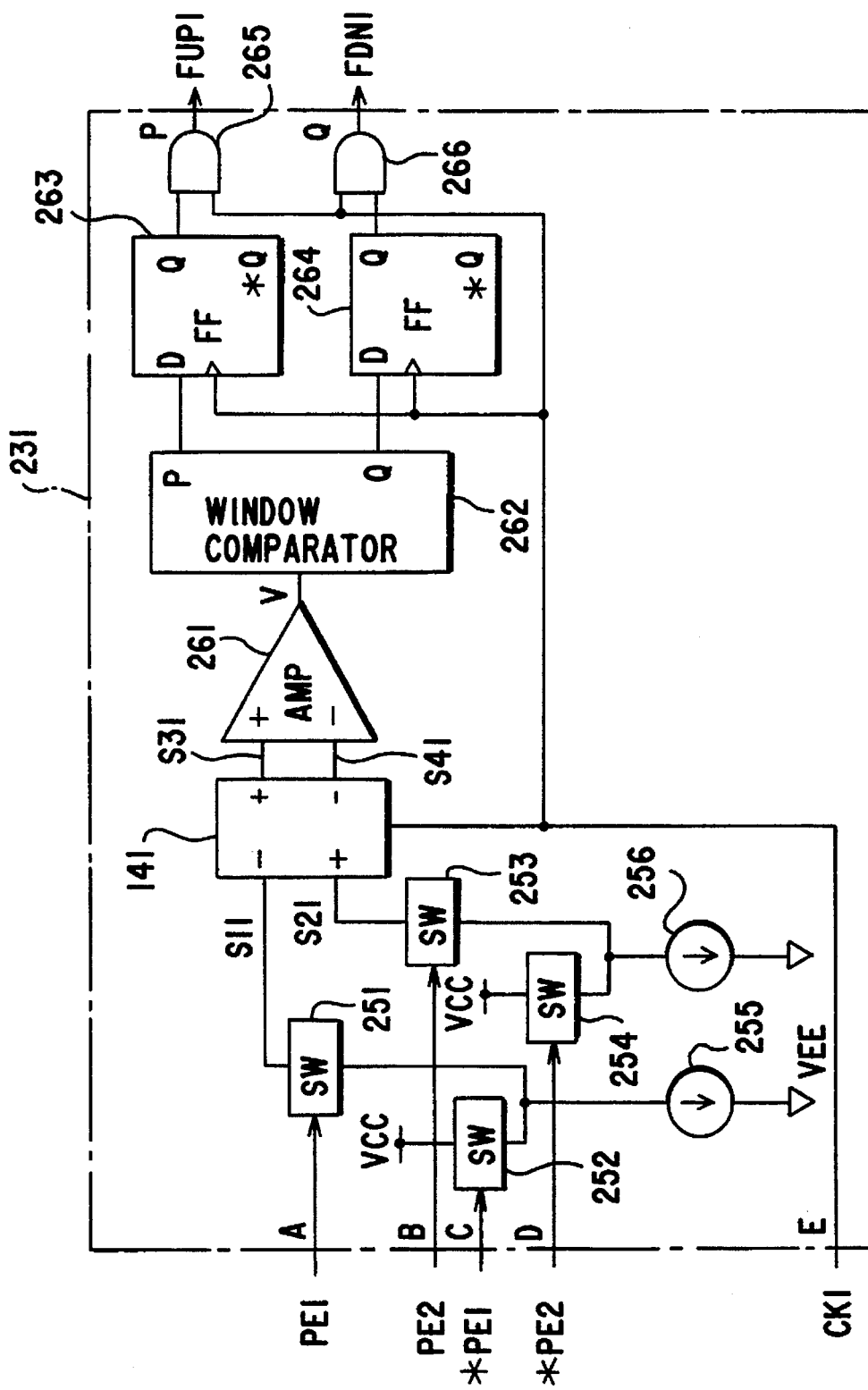
FIG. 25 is a circuit diagram showing an example of a first circuit shown in FIG. 23.

FIG. 25 shows one of constitutional examples of the first circuit 231 shown in FIG. 23.

The integrating circuit 141, the switch elements 251 and 252, and the constant current source 255 of this circuit respectively have same constitutions as the integrating circuit 141A, the switch elements 142A and 143A, and the constant current source 144A shown in FIG. 11. A circuit connected to the non-inverting input terminal of the integrating circuit 141 has a same constitution as a circuit connected to the inverting input terminal. Phase error signals PE1, *PE1, PE2 and *PE2 are supplied to control input terminals A to D of the switch elements 251 to 254.

When the phase error signals PE1 and PE2 are respectively at a high level and a low level, the switch elements 251 and 254 are turned on and the switch elements 252 and 253 are turned off, therefore, a signal S31 at the non-inverting output terminal of the integrating circuit 141 linearly increases as shown in FIG. 28. Next, when the phase error signal PE1 changes to a low level, the switch elements 251 and 252 respectively turn off and on, and the input and output potentials of the integrating circuit 141 are held. At this time, the potential of the signal S31 is proportion to the pulse width of the phase error signal PE1.

Next, when the phase error signal PE2 changes to a high level, the switch elements 253 and 254 respectively turn on and off, and the signal S31 linearly decreases. When the phase error signal PE2 changes to low level, the switch elements 253 and 254 respectively turn off and on, and the input output potentials of the integrating circuit 141 are held. At this time, the potential of the signal S31 is proportion to a pulse width difference (t1–t2) between neighboring pulses of the phase error signals PE1 and PE2.

Next, when the signal CK1 is at a high level, the capacitor included in the integrating circuit 141 is shorted, the potential difference between the complementary input and output of the integrating circuit 141 becomes zero.

The non-inverting and inverting output terminals of the integrating circuit 141 are respectively connected to a non-inverting input terminal and an inverting input terminal of a differential amplifying circuit 261. The differential amplifying circuit 261 has the same constitution as that of the operational amplifying circuit 181 shown in FIG. 13B. The input and output signals of each constitutional element in FIG. 25 are complementary signals similar to those of the integrating circuit 141. However, in order to simplify the representation, it is represented as a single signal.

Because a potential difference V between the complementary ouputs of the differential amplifying circuit 261 easily causes an error when the difference (t1–t2) is small, the potential difference V is supplied to a window comparator 262 in order to remove this error. The window comparator 262 outputs a high level signal at an output terminal P only when the input potential difference V is higher than a positive reference value V0, outputs a high level signal at an output terminal Q only when V is lower than –V0, and outputs low level signals at both output terminals P and Q when V is within a range from –V0 to V0. The reference value V0, which determines the range for removing the error, is adjustable. For example, this value is 0.15 V.

The output terminals P and Q of the window comparator 262 are respectively connected to data input terminals D of D-type flip-flops 263 and 264, and the D-type flip-flops 263 and 264 holds those values at the rising edge of the signal CK1, namely, at a reset of the integrating circuit 141.

The non-inverting output terminals Q of the D-type flip-flops 263 and 264 are respectively connected to input terminals of the AND gates 255 and 266, and the signal CK1 which indicates whether or not the outputs of the D-type flip-flops 263 and 264 are valid are respectively supplied to the other input terminals of the AND gates 265 and 266.

An up signal FUP1 output from the AND gate 265 is at a high level when the signal CK2 is at a high level, the pulse width difference between neighboring pulses of the phase error signals PE2 and PE1 is negative, and its absolute value is larger than a value determined according to the reference value V0.

Internal signals S32, S33 and S34 of the second circuit 232, the third circuit 233 and the fourth circuit 234 corresponding to the signal S31 are shown in FIG. 28.

In FIG. 23, the up signals FUP1 to FUP2 and the down signals FDN1 to FDN4 respectively become valid when the signals CK1 to CK4 are respectively at high levels.

The up signals FUP1 to FUP2 are supplied to an OR gate 236, and an up signal FUP is output from the OR gate 236. The down signals FDN1 to FDN4 are supplied to an OR gate 237, and a down signal FDN is output from the OR gate 237. The outputs of the OR gates 236 and 237 are supplied to a NOR gate 238, and a frequency agree signal FD0 output from the NOR gate 238 becomes high level when both of the up signal FUP and the down signal FDN are low level.

Figure 26:
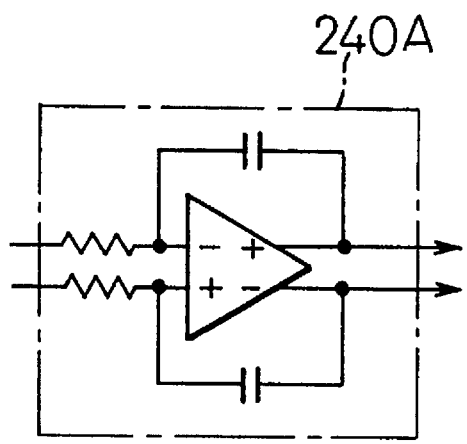
FIG. 26 is a circuit diagram showing an example of a low pass filter shown in FIG. 17.

As shown in FIG. 17, in order to make the up signal FUP, the down signal FDN and the frequency agree signal FD0 to be analog signals and to make the operations of the unit value control circuits 250A and 250B stable, the up signal FUP and the frequency agree signal FD0 are supplied to a pair of complemetary input terminals of a low pass filter 240A, and the down signal FDN and the frequency agree signal FD0 are supplied to a pair of complemetary input terminals of a low pass filter 240B. The low pass filters 240A and 240B have the same constitution, and the low pass filter 240A has a constitution shown in FIG. 26. Complementary output signals S1 and *S1 of the low pass filter 140A are supplied to complementary input terminals of the unit value control circuit 250A, and complementary output signals S2 and *S1 of the low pass filter 240A are supplied to complementary input terminals of the unit value control circuit 250B.

Figure 22:
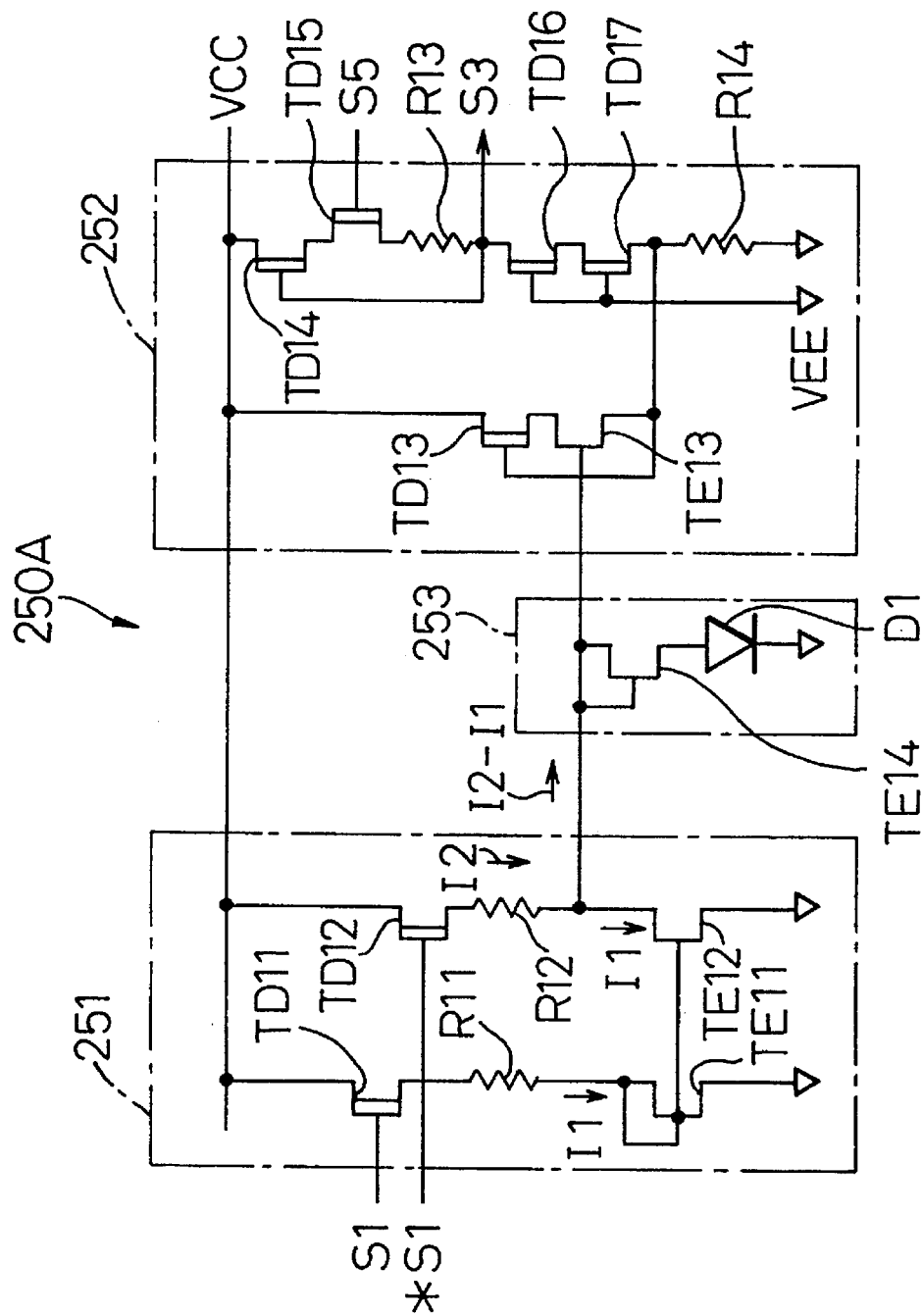
FIG. 22 is a circuit diagram showing an example of a unit value control circuit shown in FIG. 17.

The unit value control circuits 250A and 250B have the same constitution, and the unit value control circuit 250A has the constitution shown in FIG. 22.

The unit value control circuit 250A is composed of an input buffer circuit 251 which converts the complementary input signals S1 and *S1 into a single output, an output circuit 252 which stably generates a signal S3 linearly changing according to a change of an output of the input buffer circuit 251, and a limiter 253 which determines an upper limit of the output potential of the input buffer circuit 251.

The input buffer circuit 251 includes D-MES transistors TD11 and TD12, resistors R11 and R12 and E-MES transistors TE11 and TE12 while the output circuit 252 includes D-MES transistors TD13 to TD17, an E-MES transistor TE13, and resistors R13 and R14. The upper limiter 253 includes an E-MES transistor TE14 and a schottky diode D1. The D-MES transistors TD13 and TD14 are provided in order to decrease a fluctuation in the signal S3 relating to a fluctuation of the source supply line Vcc.

The E-MES transistors TE11 and TE12 constitute a current mirror circuit and the currents flowing through the respective transistors are the same. Each of these current is I1.

When the potential of the signal S1 becomes higher than the potential of the signal *S1, the current I2 flowing through the D-MES transistor TD12 becomes larger than the current flowing through the D-MES transistor TD11, the current (I2-I1) flows to the E-MES transistor TE13, and the gate potential of the E-MES transistor TE13 decreases. The source potential of the E-MES transistor TE13 is less than its gate potential, therefore, the current flowing through the resistor R14 decreases, and the potential of the signal S3 increases. Accordingly, in FIG. 20, the potential of the signal S3 becomes higher than the potential of the signal S5, and the signal S5 is fed back to the gate of the D-MES transistor TD15 shown in FIG. 22. When the potential of the signal S5 decreases, the current flowing through the D-MES transistor TD15 increases and the potential of the signal S3 decreases and the potentials of the signals S3 and S5 are controlled to agree with values corresponding to an input potential of the output circuit 252.

Similarly, in FIG. 17, the output signal S4 from the unit value control circuit 250B is supplied to an input terminal of the charge pump circuit 220B, and an output of the charge pump circuit 220B is fed back to the unit value control circuit 250B.

Therefore, the above multiple convergence operation relating to the frequency error is performed. Further, the frequency error detection circuit 230 can detect the frequency error without the cycle slips, therefore, the convergence operation relating to the frequency error is performed for a value less than the conventional value. This means that the above multiple convergence operation is performed more effectively than in the conventional apparatus.

A lock-out signal can be obtained by passing the frequency agree signal FD0 through a low pass filter 240C and an hysteresis-type inverter 260.

Figure 30:
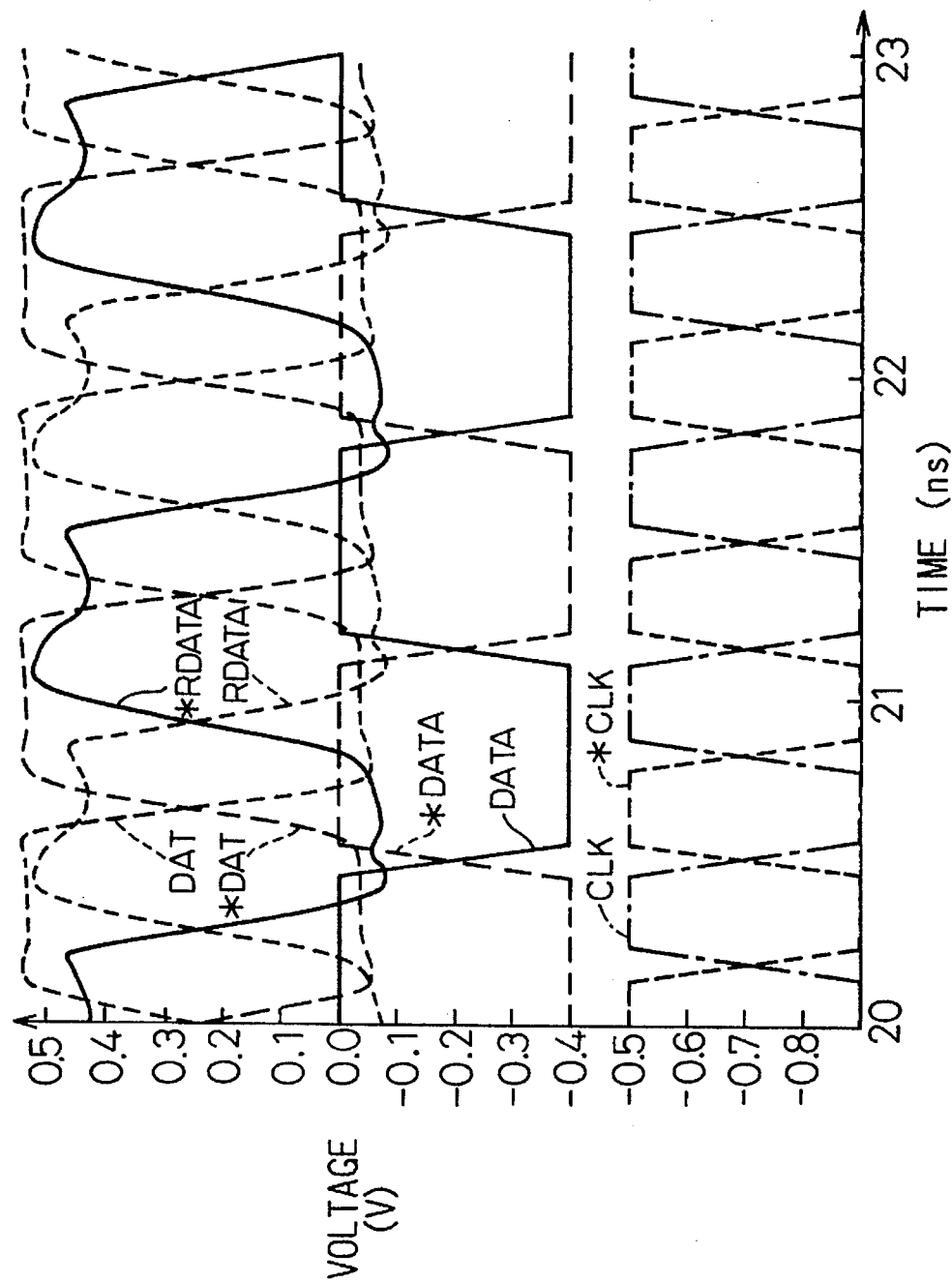
FIG. 30 is a diagram showing an another simulation result of the third embodiment.

FIGS. 29 to 31 show simulation results of the clock reproduction circuit of the third embodiment. The conditions of the simulation are same to those of the above second embodiment. However, relating to FIG. 31, durations of the "1" value and durations of the "0" values of the input signal DATA randomly change and the input signal DATA repeats for a cycle consisting of 224 clock cycles. Crossed oblique lines indicate a portion in which the phase error randomly changes.

It is apparent from FIG. 31 that the frequency error convergence operation is effectively performed within a convergible range of the phase error and the circuit is locked-in in a short time such as 10 μs. The convergence operation is performed more effectively in the third embodiment than in the first and second embodiments. However, it is apparent, from the operating principles, that the first and second embodiments have similar effects to that of the third embodiment.

The clock reproduction circuit of the third embodiment can reproduce clock frequencies within the range 1.0 to 1.9 GHz.

Various modifications are further available. For example, the frequency error detection circuits respectively have four stages connected in parallel in the first and second embodiments and it has two stages connected in parallel in the second embodiment. Any number of the stages more than two is possible. The number of the stages is determined by considering the frequency of the clock CLK0 and the necessary charge reset time.

Further, in place of the voltage control between the input and output terminals of the unit value control circuits 250A and 250B, an output amplitude of each AND gate of FIG. 18 may be adjustable according to the control input signal which is generated based on the output of the frequency error detection circuit 230, and the up signals UP1, *UP1, UP2 and *UP2 and the down signals DWN1, *DWN1, DWN2 and *DWN2 adjust the unit values of the moving charges q1 to q4 in a same way as in the third embodiment.

Further, combinations of elements of respective embodiments are available. For example, the differential amplifying circuits 148A and 148B may output analog frequency error signals without the analog-to-digital conversion of the output. Similarly, in the circuit shown in FIG. 25, the analog frequency error signal of the differential amplifying circuit 261 may be directly output without analog-to-digital conversion of the output signal. Further, the analog frequency error outputs of the adding circuits 120A to 120C of FIG. 8 may be converted into digital signals. The constitution of the output stage in FIG. 11 in which the signal is converted into a binary signal and the constitution of the output stage in FIG. 25 may be exchanged.

In the first to third embodiments, the frequency error detection circuits are realized by analog circuits. In the following, embodiments in which the frequency error detection circuits are realized by digital circuits will be described.

Figure 32:
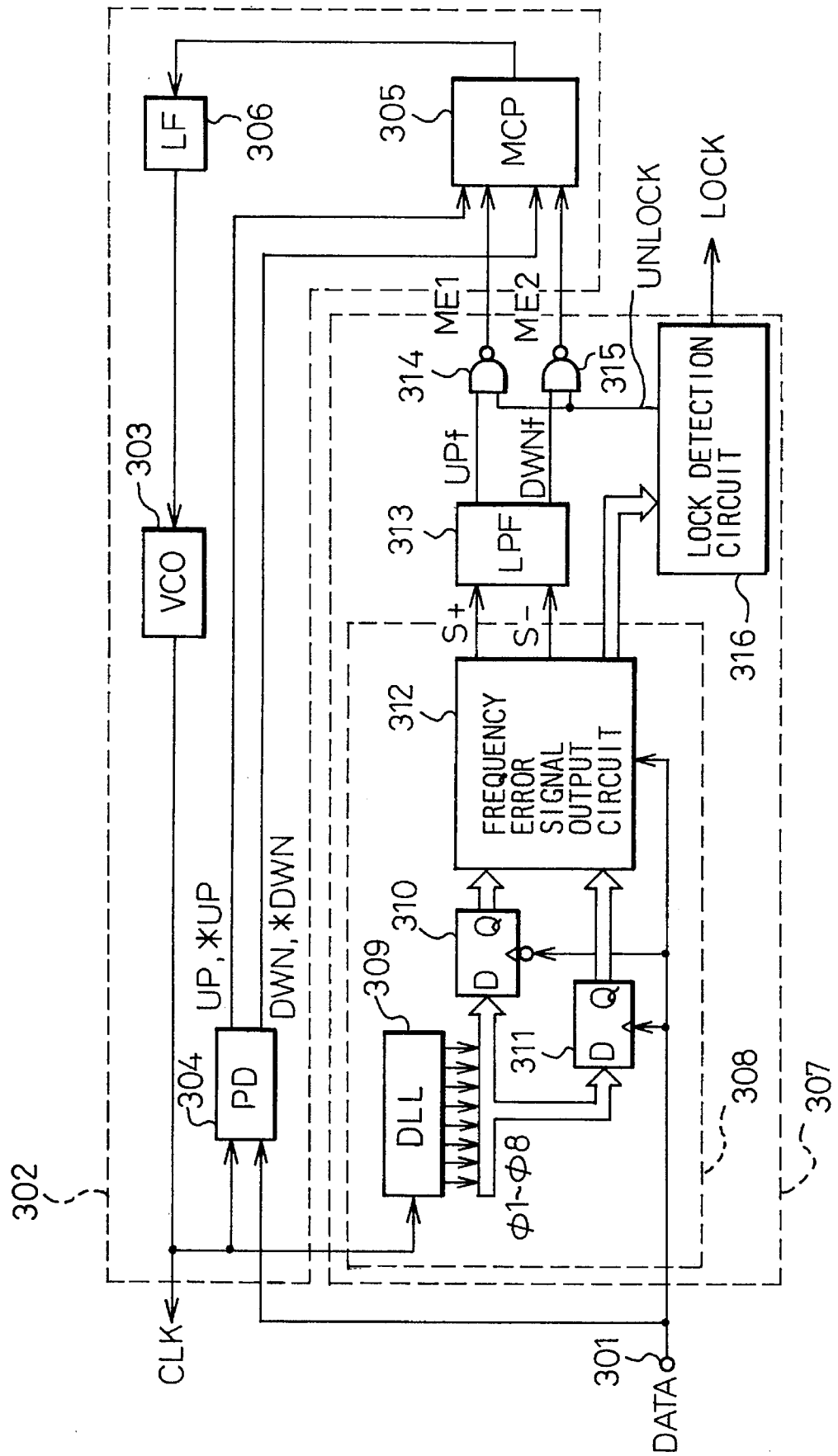
FIG. 32 is a block diagram showing the constitution of a clock reproduction circuit of the fourth embodiment.

A fourth embodiment will be described with reference to FIGS. 32 to 55. FIG. 32 is a circuit diagram showing a constitution of a clock reproduction circuit of the fourth embodiment. In FIG. 32, reference numeral 301 indicates a data input terminal to which a data signal DATA, from which a clock is reproduced, is applied; 302 indicates a phase-locked loop (PLL), 303 indicates a voltage control oscillator (VCO) for outputting a clock CLK, namely, a VCO clock, 304 indicates a phase detector (PD) for detecting a phase difference between the clock CLK and data signal DATA or a data clock include in the data signal, 305 indicates a multiplying charge pump, 306 indicates a loop filter and 307 indicates a phase-locked loop (PLL) control circuit. A frequency error detection circuit 308 is included in the PLL control circuit 307.

Figure 33:
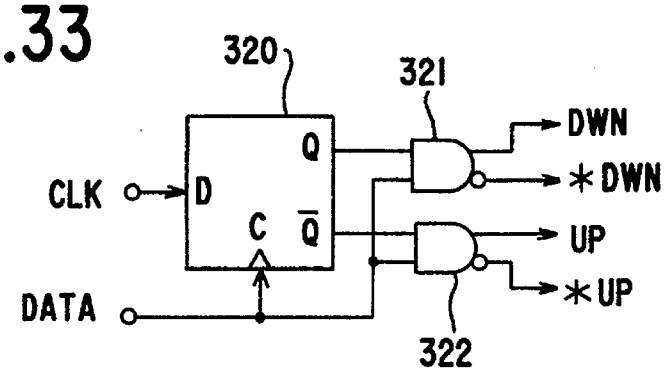
FIG. 33 is a circuit diagram showing a phase detector shown in FIG. 32.
Figure 34A:
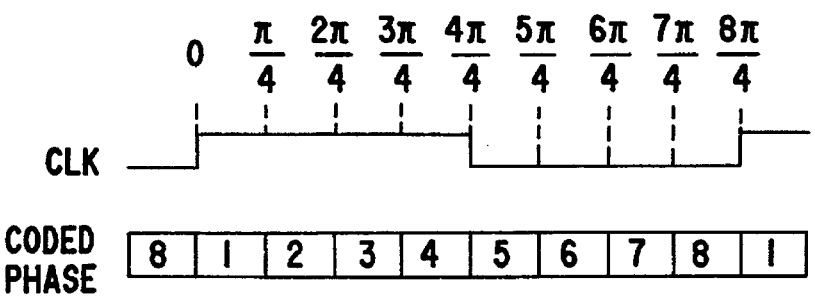
FIG. 34 is a time chart showing operations of a delay-locked loop included in a frequency error detection circuit incorporated in the clock reproduction circuit of the fourth embodiment.
Figure 34B:
Figure 34C:
Figure 34D:
Figure 34E:
Figure 34F:
Figure 34G:
Figure 34H:
Figure 34I:
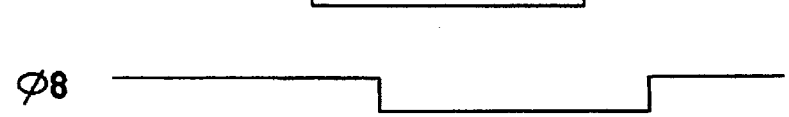

The phase detector 304 has the circuitry shown in FIG. 33. In FIG. 33, reference numeral 320 indicates a positive-edge type latch; and 321 and 322 indicate AND circuits. A clock CLK is applied to a data input terminal D of the latch 320, and a data signal DATA is applied to a latch timing signal input terminal C of the latch 320. The AND circuits 321 and 322 respectively receive a positive-phase output Q of the latch 320 and the data signal DATA. The AND circuit 321 outputs a down signal DWN and a down signal DWN* which are complementary each other. The AND circuit 322 outputs an up signal UP and a down signal *UP which are complementary each other.

When the data signal DATA goes high, if the clock CLK leads the data signal DATA, the output Q of the latch 320 is driven high and the output Q* thereof is driven low. As a result, when the data signal DATA remains high, the down signal DWN is high, the down signal DWN* is low, the up signal UP is low, and the up signal *UP is high. Thereafter, when the data signal DATA goes low, the down signal DWN is driven low and the down signal *DWN is driven high. The up signal UP remains low and the up signal *UP remains high.

By contrast, when the data signal DATA goes high, if the clock CLK lags behind the data signal DATA, the output Q of the latch 320 is driven low and the output *Q thereof is driven high. As a result, when the data signal DATA remains high, the down signal DWN is low, the down signal *DWN is high, the up signal UP is high, and the up signal *UP is low. Thereafter, when the data signal DATA goes low, the down signal DWN remains low and the down signal *DWN remains high. The up signal UP is driven low and the up signal *UP is driven high.

As mentioned above, the phase detector 304 calculates the AND of the clock CLK supplied from the voltage control oscillator (VCO) 303 and latched with the data signal DATA, and the data signal DATA, and thus provides the up signals UP and *UP or the down signals DWN and *DWN as charge pump drive signals. Since a one-shot pulse generator is unnecessary, a high-frequency data signal DATA can be handled properly.

The PLL control circuit 307 detects an error between the frequency of the clock CLK and the transmitter clock included in the data signal DATA and controls the PLL 302 so that the frequency of the clock CLK will become consistent with the data frequency of the data signal DATA.

The frequency error detection circuit 308 in the PLL control circuit 307 detects an error between the frequencies of the clock CLK and the data clock CLK0 on the basis of the relationship between a phase difference between the clock CLK and data signal DATA detected at the previous transition of the data signal DATA and a phase difference between the clock CLK and data signal DATA detected at the current transition of the data signal DATA.

In the frequency error detection circuit 308, the phase of the clock CLK ranging from 0 to 2 is quantized as shown in FIG. 34. Hereinafter, quantized values shall be referred to as quantized phases, and a difference between quantized phases shall be referred to as a quantized phase difference.

In the frequency error detection circuit 308, reference numeral 309 indicates a delay-locked loop (DLL). The DLL 65 divides one pulse spacing of the clock CLK into eight phases as shown in FIG. 34, and then produces eight phase-shifted clocks φ1 to φ8, which are shifted in units of π/4, including a clock φ1 that is in phase with the clock CLK.

Figure 35:
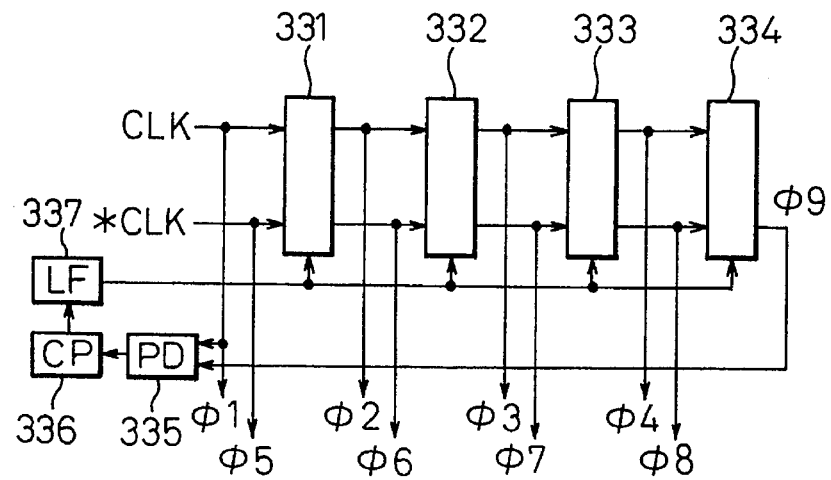
FIG. 35 is a circuit diagram showing the first example of a delay-locked loop shown in FIG. 32.

The DLL 309 has the circuitry shown in FIG. 35. The clock CLK is handled as the clock φ1, and a clock *CLK produced by inverting the clock CLK is handled as the clock φ5.

In FIG. 35, reference numeral 331 indicates a delay cell for use in delaying the clocks CLK and *CLK so as to produce the clocks φ2 and φ6; 332 indicates a delay cell for use in delaying the clocks φ2 and φ6 so as to produce the clocks φ3 and φ7; 333 indicates a delay cell for use in delaying the clocks φ3 and φ7 so as to produce the clocks φ4 and φ8; 334 indicates a delay cell for use in delaying the clock φ8 so as to produce a clock φ9 that will be synchronized in phase with the clock φ1; 335 indicates a phase detector (PD) that inputs the clocks φ1 and φ9 which are to be mutually synchronized in phase; 336 indicates a charge pump (CP); and 337 indicates a loop filter (LF).

Figure 36:
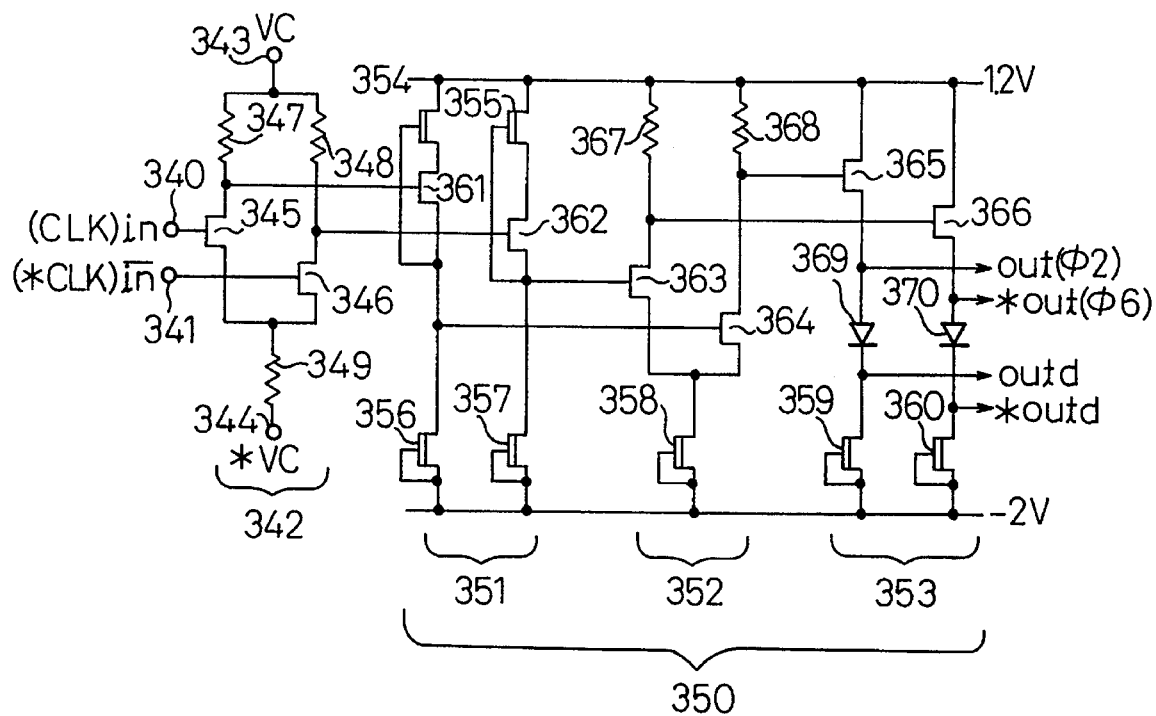
FIG. 36 is a circuit diagram showing an example of a delay cell usable for the delay cells shown in FIG. 35.

A delay cell shown in FIG. 36 may be used as each of the delay cells 331 to 334. In FIG. 36, reference numeral 30 indicates a signal input terminal to which a signal in to be delayed is applied. 341 indicates a signal input terminal to which a signal *in that is in inverse relation to the signal in, and is to be delayed, is applied.

For using the delay cell as the delay cell 331 lying in the first stage in FIG. 35, the clock CLK is applied to the signal input terminal 340 and the clock *CLK is applied to the inverse signal input terminal 341.

Reference numeral 342 indicates a delay unit. 343 indicates a delay control voltage input terminal to which a delay control voltage VC is applied. 344 indicates an negative delay control voltage input terminal to which a negative delay control voltage *VC, that is in inverse relation to the delay control voltage VC, is applied. 345 and 346 indicate enhancement type MOS FETs. 347 and 348 indicate resistors.

For using the delay cell as each of the delay cells 331 to 334 shown in FIG. 35, a output voltage of the loop filter 337 is applied to the delay control voltage input terminal 343 and a negative output voltage thereof is applied to the negative delay control voltage input terminal 344.

Reference numeral 350 indicates a buffer; indicates a source follower; 352 indicates a differential amplifier; 353 indicates an output unit; 354 to 360 indicate depletion type MOS FETs; 361 to 366 indicate enhancement type MOS FETs; 367 and 368 indicate resistors; and 369 and 370 indicate diodes.

Reference characters out indicates an output signal associated with the input signal in; *out indicates an output signal associated with the input signal *in; outd indicates an output signal produced by shifting in phase the output signal out by means of the diode 369; and *outd indicates an output signal produced by shifting in phase the output signal *out by means of the diode 105.

When the delay cell having the foregoing circuit is used as the delay cell 331 shown in FIG. 35, the clock φ2 can be provided as the output signal out and the clock φ6 can be provided as the output signal *out.

Figure 37:
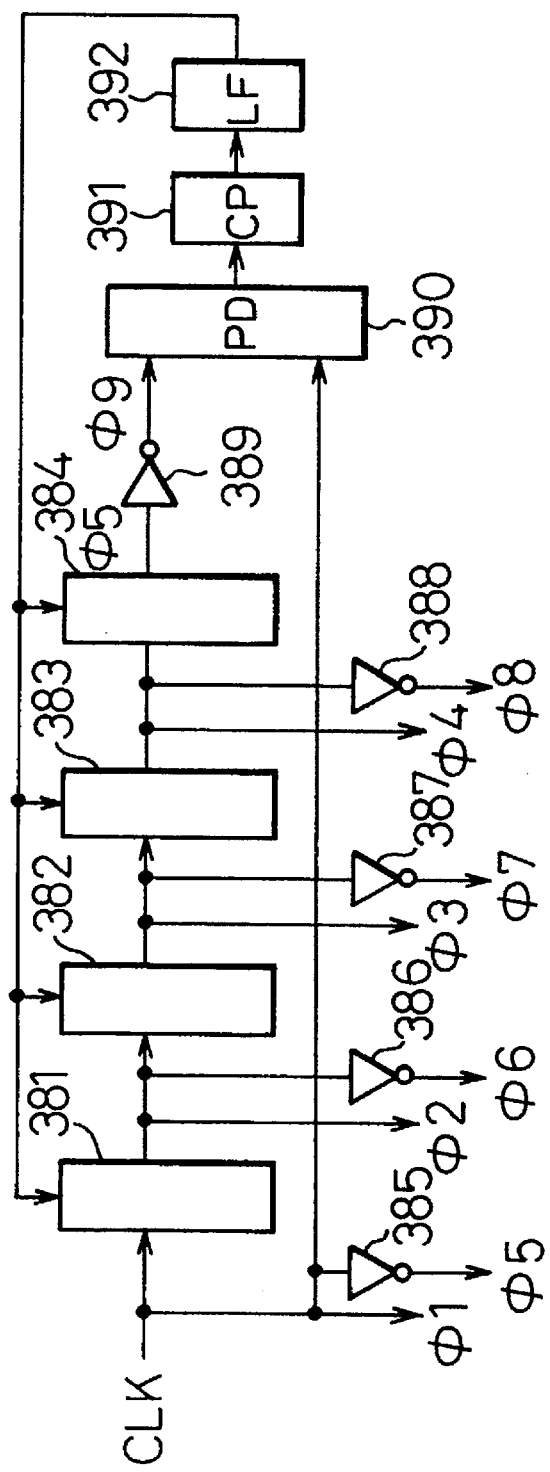
FIG. 37 is a circuit diagram showing the second example of the delay-locked loop shown in FIG. 32.

The delay-locked loop (DLL) 309 may have the circuitry shown in FIG. 37. In this case, the clock CLK is handled as the clock φ1.

In FIG. 37, reference numeral 381 indicates a delay cell for use in delaying the clock CLK so as to produce the clock φ2. 382 indicates a delay cell for use in delaying the clock φ2 so as to produce the clock φ3.

Reference numeral 383 indicates a delay cell for use in delaying the clock φ3 so as to produce the clock φ4. 384 indicates a delay cell for use in delaying the clock φ4 so as to produce the clock φ5.

Reference numeral 385 indicates an inverter for inverting the clock φ1 so as to produce the clock φ 5; 386 indicates an inverter for inverting the clock φ2 so as to produce the clock φ6; 387 indicates an inverter for inverting the clock φ3 so as to produce the clock 7; 388 indicates an inverter for inverting the clock φ4 so as to produce the clock φ8; 389 indicates an inverter for inverting the clock φ5 supplied from the delay cell 110 so as to produce the clock φ9 that will be synchronized in phase with the clock φ1; 390 indicates a phase detector (PD) that accepts the clocks φ1 and φ9 that are to be synchronized with each other; 391 indicates a charge pump (CP); and 392 indicates a loop filter (LF).

In FIG. 32, reference numeral 200 indicates a negative edge type latch for latching the clocks φ1 to φ8 at the high-to-low transition of the data signal DATA so as to learn the levels of the clocks, and thus storing a quantized phase difference $\Delta\beta_{H-L}$ between the clock CLK and data signal DATA detected at the high-to-low transition of the data signal DATA.

Reference numeral 401 indicates a positive edge type latch for latching the clocks φ1 to φ8 at the low-to-high transition of the data signal DATA so as to learn the levels of the clocks, and thus storing a quantized phase difference V-H between the clock CLK and data signal DATA at the low-to-high transition of the data signal DATA.

Figure 38:
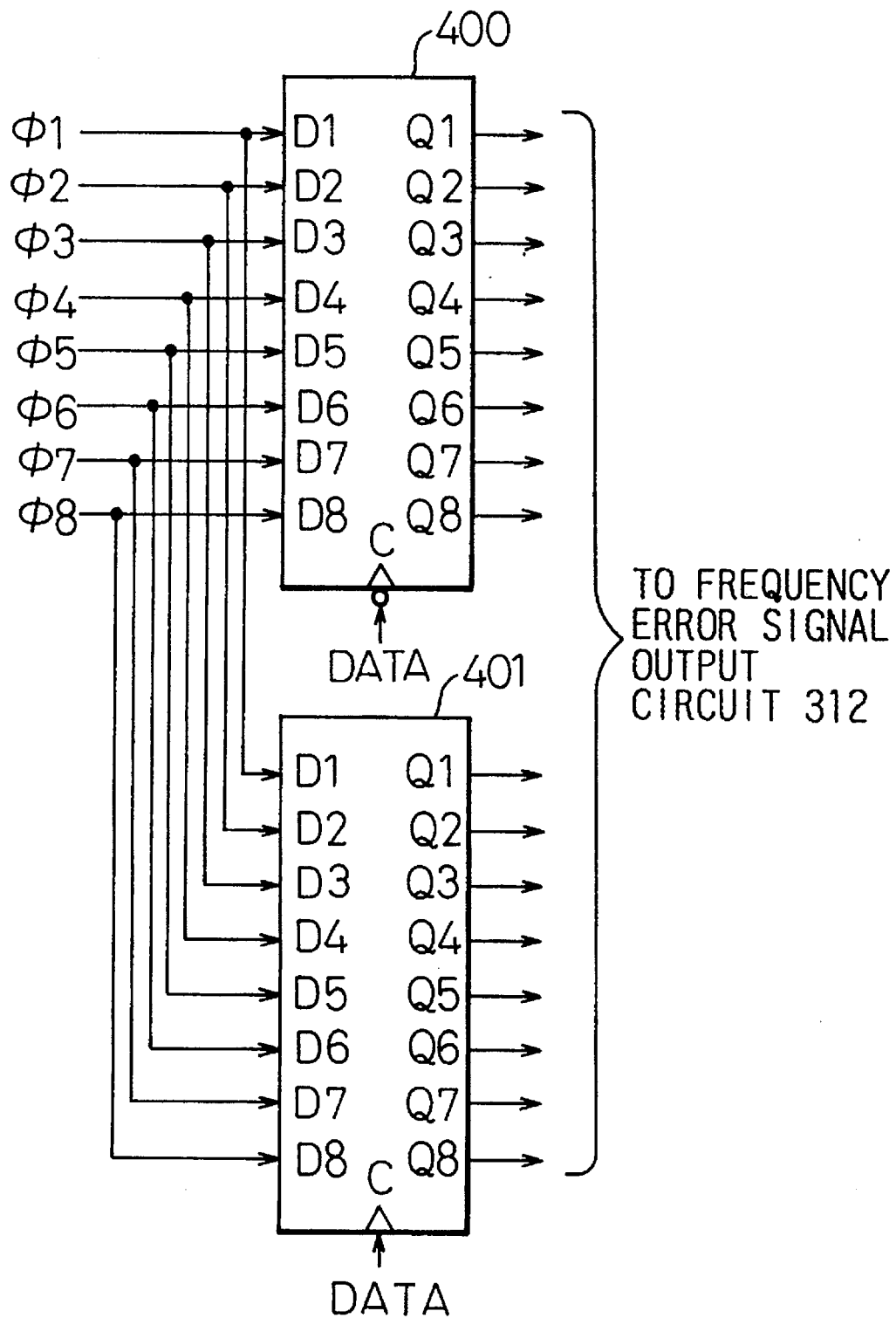
FIG. 38 is a circuit diagram showing latches shown in FIG. 32.

FIG. 38 shows the latches 400 and 401. In the latches 400 and 401, the clocks φ1 to φ8 are applied to data input terminals D1 to D8. The data signal DATA is applied to a latch timing signal input terminal C. As a result, the relationships listed in FIG. 39 are established between a quantized phase difference $\Delta\beta_{H-L}$, and the outputs Q1 to Q8 of the latch circuit 310. The relationships listed in FIG. 40 are established between the quantized phase difference $\Delta\beta_{L-H}$, between the clock CLK and the data signal DATA detected at the low-to-high transition of the data signal, and the outputs Q1 to Q8 of the latch circuit 311.

In FIG. 32, reference numeral 312 indicates a frequency error signal output circuit for decoding the outputs Q1 to Q8 of the latches 400 and 401 so as to provide a frequency excess signal S+, which indicates that the frequency of the clock CLK exceeds the data frequency of the data signal DATA, or a frequency short signal S−, which indicates that the frequency of the clock CLK falls short of the frequency of the data signal DATA, as a frequency error signal.

Figure 41:
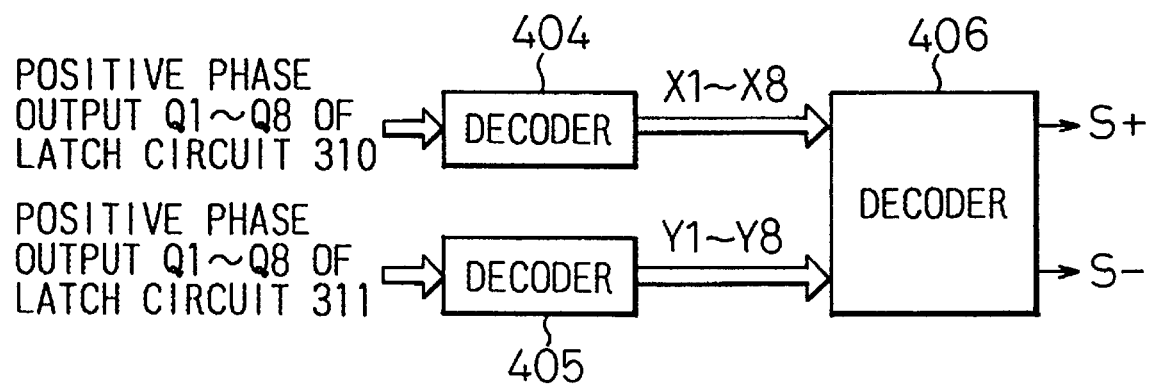
FIG. 41 is a block diagram showing a frequency short/excess signal output circuit shown in FIG. 32.

The frequency error signal output circuit 312 has the circuitry shown in FIG. 41. In FIG. 41, reference numeral 404 indicates a decoder for decoding the outputs Q to Q8 of the latch 310 so as to provide quantized phase difference signals X1 to X8 that indicate the quantized phase difference $\Delta\beta_{H-L}$ between the clock CLK and data signal DATA detected at the high-to-low transition of the data signal DATA. Reference numeral 405 indicates a decoder for decoding the outputs Q1 to Q8 of the latch 311 so as to provide quantized phase difference signals Y1 to Y8 that indicate the quantized phase difference $\Delta\beta_{L-H}$ between the clock CLK and data signal DATA detected at the low-to-high transition of the data signal DATA.

Reference numeral 406 indicates a decoder for decoding the quantized phase difference signals X1 to X8, and Y1 to Y8, supplied from the decoders 404 and 405, and outputting the frequency excess signal S+ or frequency short signal S− on the basis of the relationship between the quantized phase difference $\Delta\beta_{n-1}$ between the clock CLK and data signal DATA detected at the previous transition of the data signal DATA and the quantized phase difference $\Delta\beta_{n-1}$ between the clock CLK and data signal DATA detected at the current transition of the data signal DATA.

Figure 42:
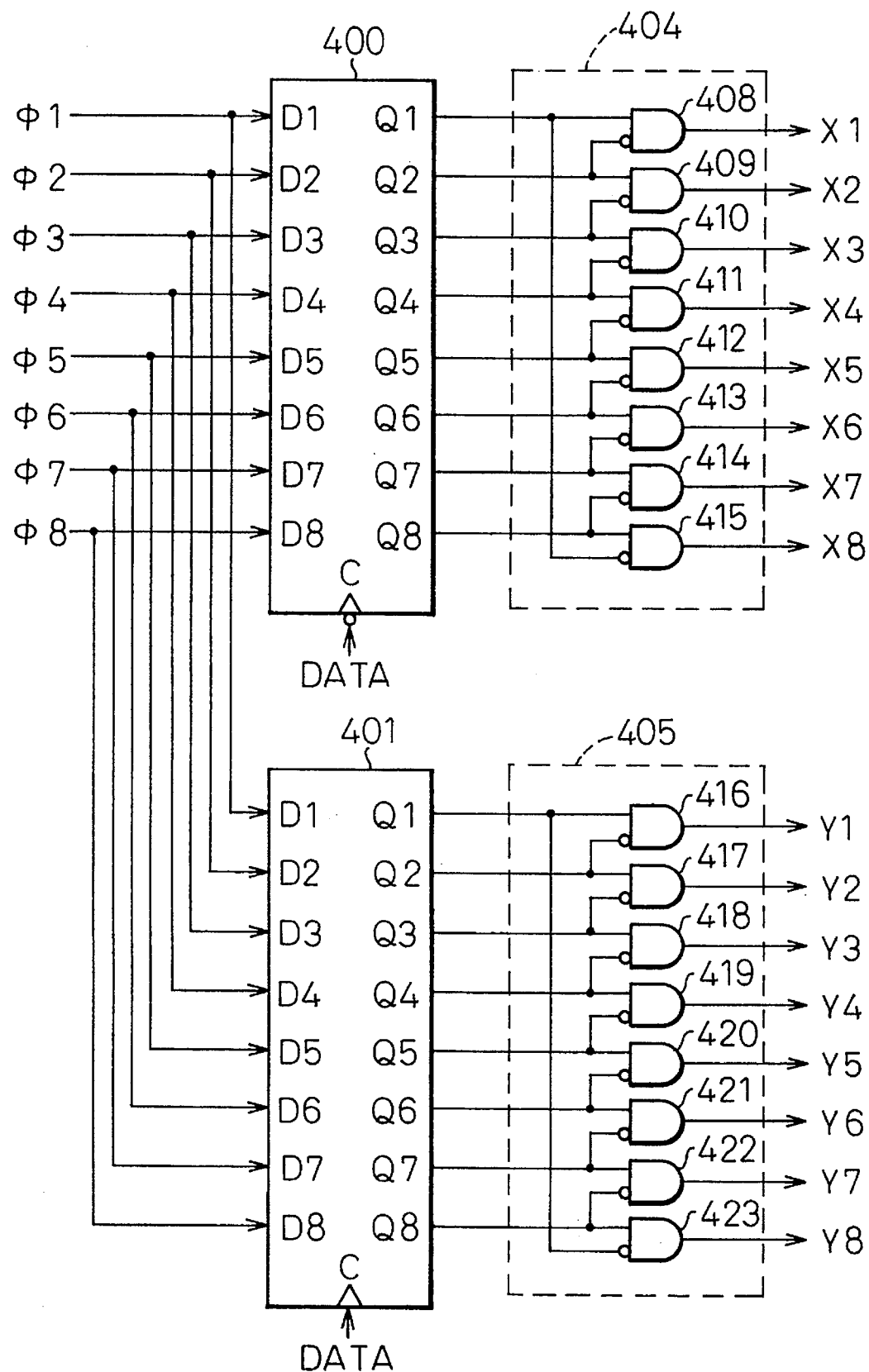
FIG. 42 is a circuit diagram showing decoders shown in FIG. 41.

The decoders 404 and 405 have the circuitry shown in FIG. 42. In FIG. 42, reference numerals 408 to 423 indicate AND circuits each having a low-active signal input terminal.

The relationships listed in FIG. 43 are established between the outputs Q1 to Q8 of the latch 400, the quantized phase difference signals X1 to X8, and the quantized phase difference $\Delta\beta_{H-L}$.

In contrast, the relationships listed in FIG. 44 are established between the outputs Q1 to Q8 of the latch 121, the quantized phase difference signals Y1 to Y8, and the quantized phase difference $\Delta\beta_{L-H}$.

Figure 45:
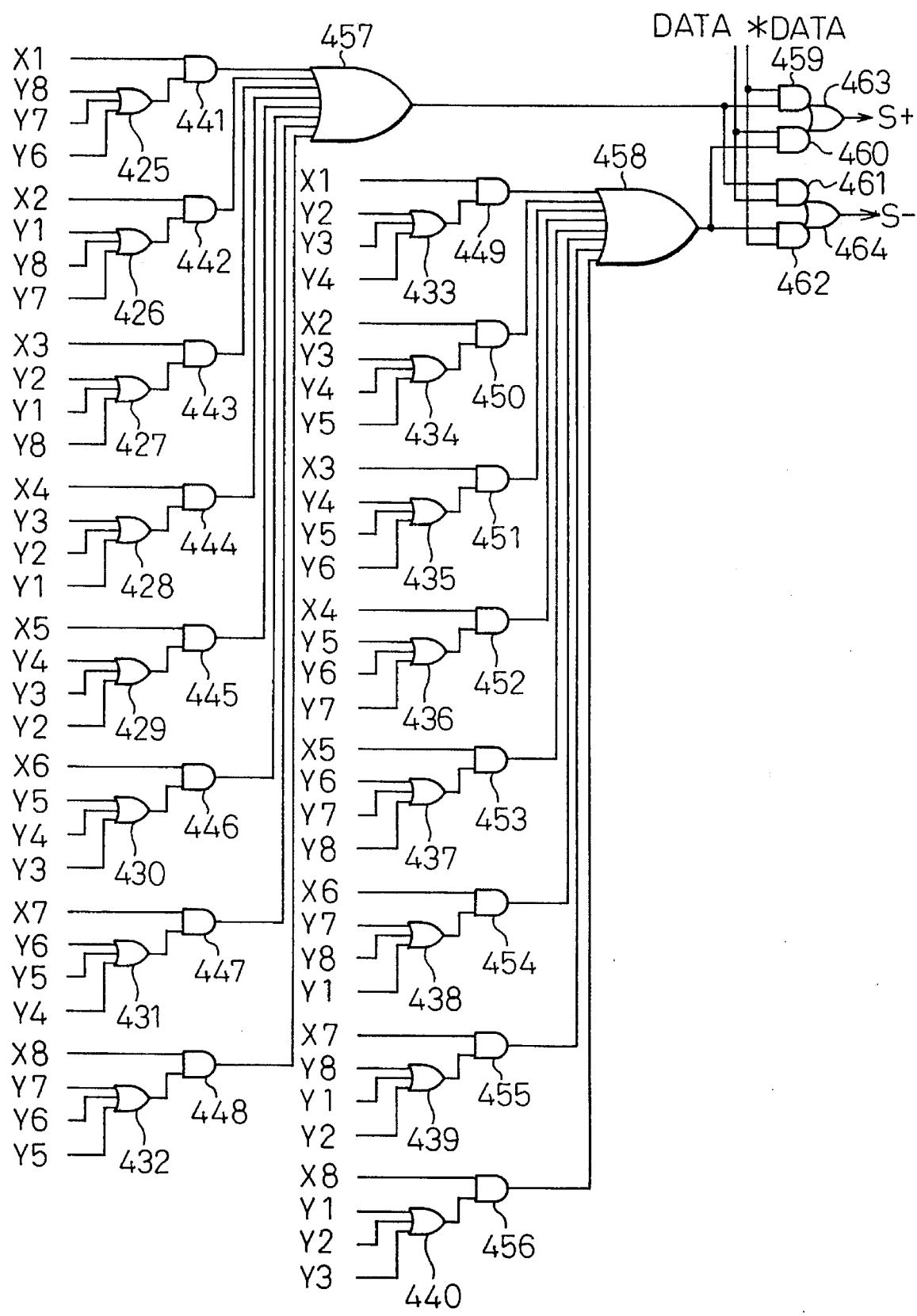
FIG. 45 is a circuit diagram showing a decoder shown in FIG. 41.

The decoder 206 has the circuitry shown in FIG. 45. In FIG. 45, reference numerals 425 to 440 indicate OR circuits; 441 to 456 indicate AND circuits; 457 and 458 indicate OR circuits; 459 to 462 indicate AND circuits; and 463 and 464 indicate OR circuits.

Figure 46:
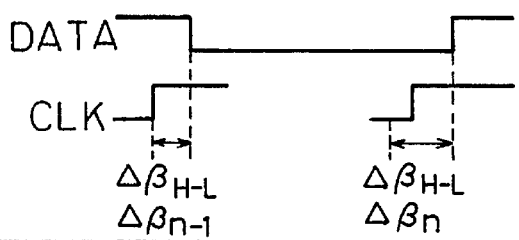
FIG. 46 is a table showing values of the frequency short/excess signal related to a coded phase error at one pair of transitions.

FIG. 46 is a truth table describing the capability of the decoder 406, wherein the quantized phase difference $\Delta\beta_{H-L}$, between the clock CLK and data signal DATA detected at the high-to-low transition of the data signal DATA, is regarded as the previous quantized phase difference $\Delta\beta_{n-1}$, and the quantized phase difference $\Delta\beta_{L-H}$, between the clock CLK and data signal DATA detected at the low-to-high transition of the data signal DATA, is regarded as the current quantized phase difference $\Delta\beta_n$.

Figure 47:
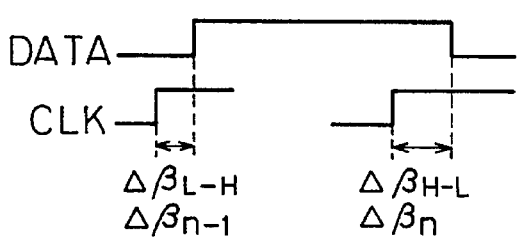
FIG. 47 is a table showing values of the frequency short/excess signal related to a coded phase error at the other pair of transitions.

FIG. 47 is a truth table describing the capability of the decoder 406, wherein the quantized phase difference $\Delta\beta_{L-H}$, between the clock CLK and data signal DATA detected at the low-to-high transition of the data signal DATA, is regarded as the previous quantized phase difference $\Delta\beta_{n-1}$, and the quantized phase difference $\Delta\beta_{H-L}$, between the clock CLK and data signal DATA detected at the high-to-low transition of the data signal DATA, is regarded as the current quantized phase difference $\Delta\beta_n$.

Using the frequency error detection circuit 308, an error between the frequency of the clock CLK and the data frequency of the data signal DATA can be detected without waiting for a cycle slip. Frequency error detection can therefore be speeded up.

In FIG. 32, reference numeral 313 indicates a low-pass filter (LPF) for outputting an up signal UPf indicating that the frequency of the clock CLK should be raised or a down signal DWNf indicating that the frequency of the clock CLK should be lowered.

Figure 48:
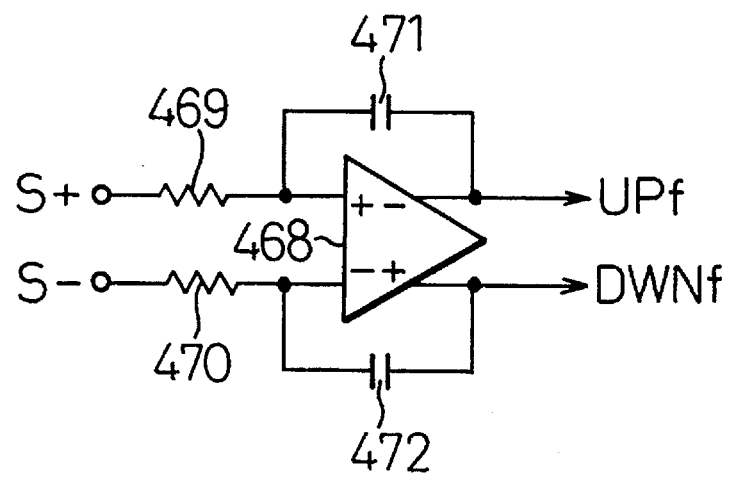
FIG. 48 is a circuit diagram showing a low-pass filter shown in FIG. 32.

The low-pass filter 313 has the circuitry shown in FIG. 48. In FIG. 48, reference numeral 468 indicates a full-differential amplifier having complementary output terminals; 469 and 470 indicate resistors; and 471 and 472 indicate capacitors.

Figure 49:
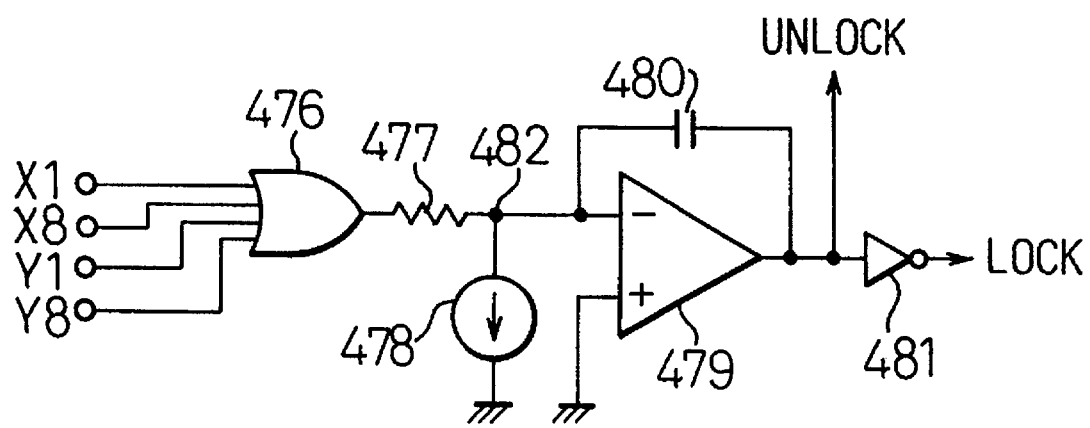
FIG. 49 is a circuit diagram showing a first example of the lock detector shown in FIG. 32.

In FIG. 32, reference numeral 316 indicates a lock detector for detecting a locked state. FIG. 49 is a circuit diagram showing a first example of lock detector 316.

In FIG. 49, reference numeral 476 indicates an OR circuit for calculating the OR of the quantized phase difference signals X1 and X8, and Y and Y8; 477 indicates a resistor; 478 indicates a constant current source; 479 indicates a differential amplifier; 480 indicates a capacitor; and 481 indicates an inverter. UNLOCK indicates an unlock signal indicating an unlocked state; and LOCK indicates a lock signal indicating a locked state.

In the lock detector 316 having the circuitry of the first example, if all of the quantized phase difference signals X, X8, Y1, and Y8 go low frequently, the unlocked state is identified.

In this case, a node 482 is placed in a low-level state, the output of the differential amplifier 479 is driven high, the unlock signal UNLOCK is driven high, and the lock signal LOCK is driven high.

In contrast, if any of the quantized phase difference signals X1, X8, Y1, and Y8 go high frequently, the locked state is identified.

In this case, the node 82 is placed in a high-level state, the output of the differential amplifier 479 is driven low, the unlock signal UNLOCK is driven low, and the lock signal LOCK is driven low.

Figure 50:
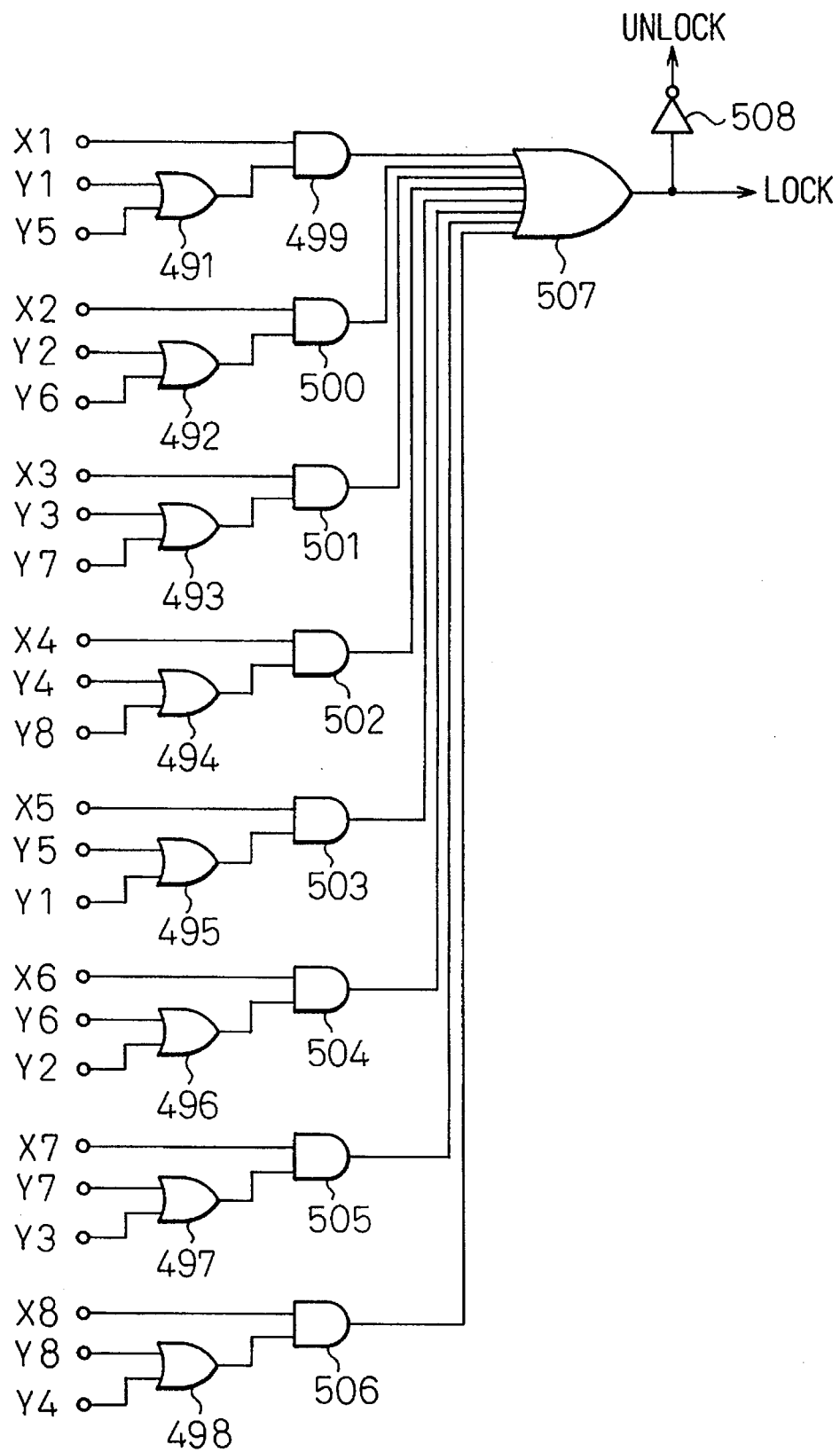
FIG. 50 is a circuit diagram showing a second example the lock detector shown in FIG. 32

FIG. 50 is a circuit diagram showing the second example of the lock detector 316. In FIG. 50, reference numerals 491 to 498 indicate OR circuits. 499 to 506 indicate AND circuits, 507 indicates an OR circuit and 508 indicates an inverter.

In the lock detector 316 having circuitry of the second example, when the quantized phase difference signal Xi does not represent a 1 (Xi is not 1) and the quantized phase difference signals Yi and Yi+4 (where i indicates 1, 2, 3, or 4) do not represent 1s (Yi and Yi+4 are not 1), or when the quantized phase difference signal Xk does not represent a 1 (Xk is not 1) and the quantized phase difference signals Yk and Yk–4 (where k indicates 5, 6, 7, or 8) do not represent 1s (Yk and Yk–4 are not 1), the unlocked state is identified.

In this case, the outputs of the AND circuit 499 to 506 are low and the output of the OR circuit 507 is low; that is, the unlock signal UNLOCK is high and the lock signal LOCK is low.

In contrast, when the quantized phase difference signal X1 represents a 1 and the quantized phase difference signal Y1 or Y5 represents a 1, when the quantized phase difference signal X2 represents a 1 and the quantized phase difference signal Y2 or Y6 represents a 1, etc., or when the quantized phase difference signal X8 represents a 1 and the quantized phase difference signal Y8 or Y4 represents a 1, the locked state is identified.

In this case, any or all of the outputs of the AND circuits 499 to 506 are high and the output of the OR circuit 507 is high. That is, the unlock signal UNLOCK is low and the lock signal LOCK is high.

Figure 51:
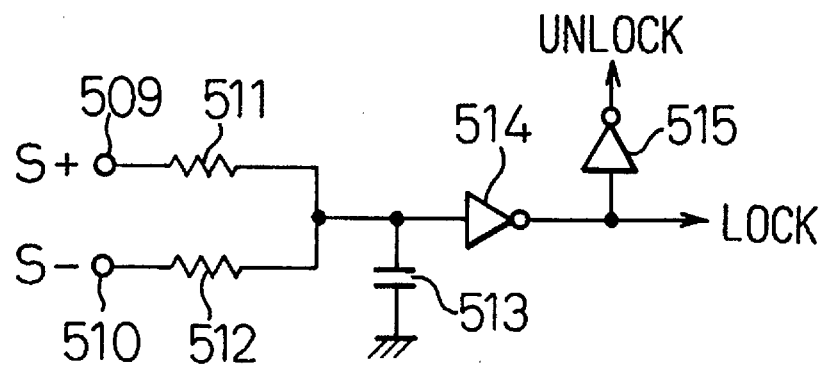
FIG. 51 is a circuit diagram showing a third example of the lock detector shown in FIG. 32.

FIG. 51 is a circuit diagram showing the third example of circuitry of the lock detector 316. In FIG. 51, reference numeral 509 indicates a frequency excess signal input terminal to which the frequency excess signal S+ is applied; 510 indicates a frequency short signal input terminal to which the frequency short signal S– is applied; 511 and 512 indicate resistors; 513 indicates a capacitor; and 514 and 515 indicate inverters.

In the lock detector 316 having circuitry of the third example, when the frequency excess signal S+ or frequency short signal S– goes high frequently, the unlocked state is identified.

In this case, the capacitor 513 is charged. The input of the inverter 514 is driven high and the output of the inverter 514 is driven low. That is, the unlock signal UNLOCK is driven high and the lock signal LOCK is driven low.

In contrast, when the frequency excess signal S+ or frequency short signal S– goes low frequently, the locked state is identified.

In this case, the capacitor 513 is discharged through the resistors 511 and 512. The input of the inverter 514 is driven low and the output of the inverter 514 is driven high. That is, the unlock signal UNLOCK is driven low and the lock signal LOCK is driven high.

Figure 52:
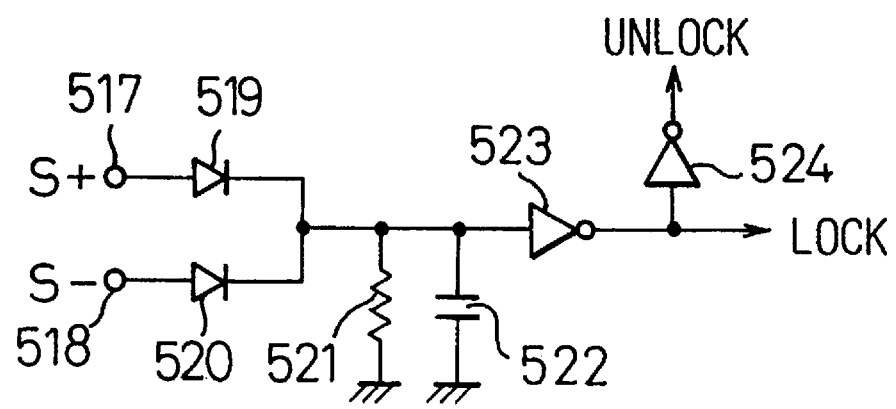
FIG. 52 is a circuit diagram showing a fourth example of the lock detector shown in FIG. 32.

FIG. 52 is a circuit diagram showing the fourth example of the circuitry of the lock detector 316. In FIG. 52, reference numeral 517 indicates a frequency excess signal input terminal to which the frequency excess signal S+ is applied; 518 indicates a frequency short signal input terminal to which the frequency short signal S– is applied; 519 and 520 indicate diodes; 521 indicates a resistor; 522 indicates a capacitor; and 523 and 524 indicate inverters.

In the lock detector 316 having circuitry of the fourth example, when the frequency excess signal S+ or frequency short signal S– goes high frequently, the unlocked state is identified.

In this case, the capacitor 522 is charged. The input of the inverter 523 is driven high and the output of the inverter 523 is driven low. That is, the unlock signal UNLOCK is driven high and the lock signal LOCK is driven low.

In contrast, when the frequency excess giansl S+ or frequency short signal S– goes low frequently, the locked state is identified.

In this case, the capacitor 522 is discharged through the resistor 521. The input of the inverter 523 is driven low and the output of the inverter 523 is driven high. That is, the Unlock signal UNLOCK is driven low and the lock signal LOCK is driven high.

In FIG. 32, reference numeral 314 indicates a NAND circuit for calculating the NAND of the up signal UPf supplied from the low-pass filter 313 and the unlock signal UNLOCK supplied from the lock detector 316. ME1 indicates an output signal of the NAND circuit 314.

Reference numeral 315 indicates a NAND circuit for calculating the NAND of the down signal DWNf supplied from the low-pass filter 186 and the unlock signal UNLOCK supplied from the lock detector 316. ME1 indicates an output signal of the NAND circuit 315.

In FIG. 32, reference numeral 305 indicates a multiplying charge pump (MCP). The multiplying charge pump 303 has the circuitry shown in FIG. 53.

Figure 53:
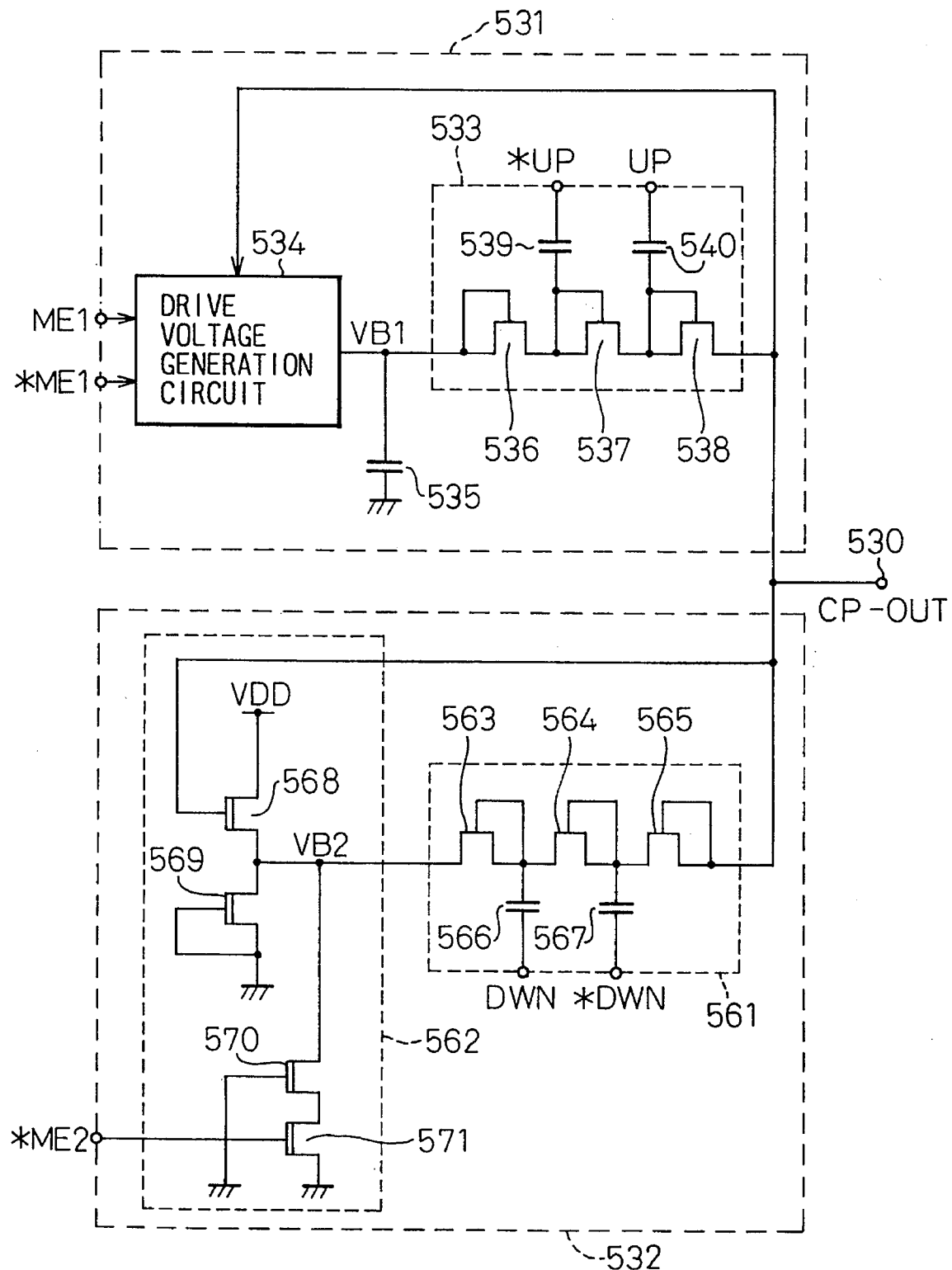
FIG. 53 is a circuit diagram showing a multiplying charge pump shown in FIG. 32.

In FIG. 53, reference numeral 530 indicates an output terminal. 531 indicates a current outflow circuit for causing current to flow out to the output terminal 530. 532 indicates a current inflow circuit for causing current to flow in from the output terminal 530.

As for the current outflow circuit 531, reference numeral 533 indicates a pump. 534 indicates a drive voltage generator for supplying a drive voltage VB1 to the pump 533. *ME1 indicates a signal produced by inverting the output signal ME1 of the NAND circuit 314. 535 indicates a capacitor.

In the pump 533, reference numerals 536 to 538 indicate enhancement type MOS FETs. 539 and 540 indicate capacitors.

The MOS FET 536 has a gate thereof connected to a drain thereof, and the drain thereof connected to an output terminal of the drive voltage generator 534. Thus, the MOS FET 536 serves as a reverse-current prevention element for preventing current from flowing from the source to the drain.

The MOS FETs 537 and 538 are transistors performing pumping. The MOS FET 537 has a drain thereof connected to a source of the MOS FET 536. The MOS FET 538 has a drain thereof connected to a source of the MOS FET 537, and a source thereof connected to the output terminal 530.

The capacitor 539 has one terminal thereof connected to the gate and drain of the MOS FET 537, and inputs a signal *UP supplied from the phase detector 304 through the other terminal thereof.

The capacitor 540 has one terminal connected to the gate and drain of the MOS FET 538, and inputs an up signal UP supplied from the phase detector 304 through the other terminal thereof.

Figure 54:
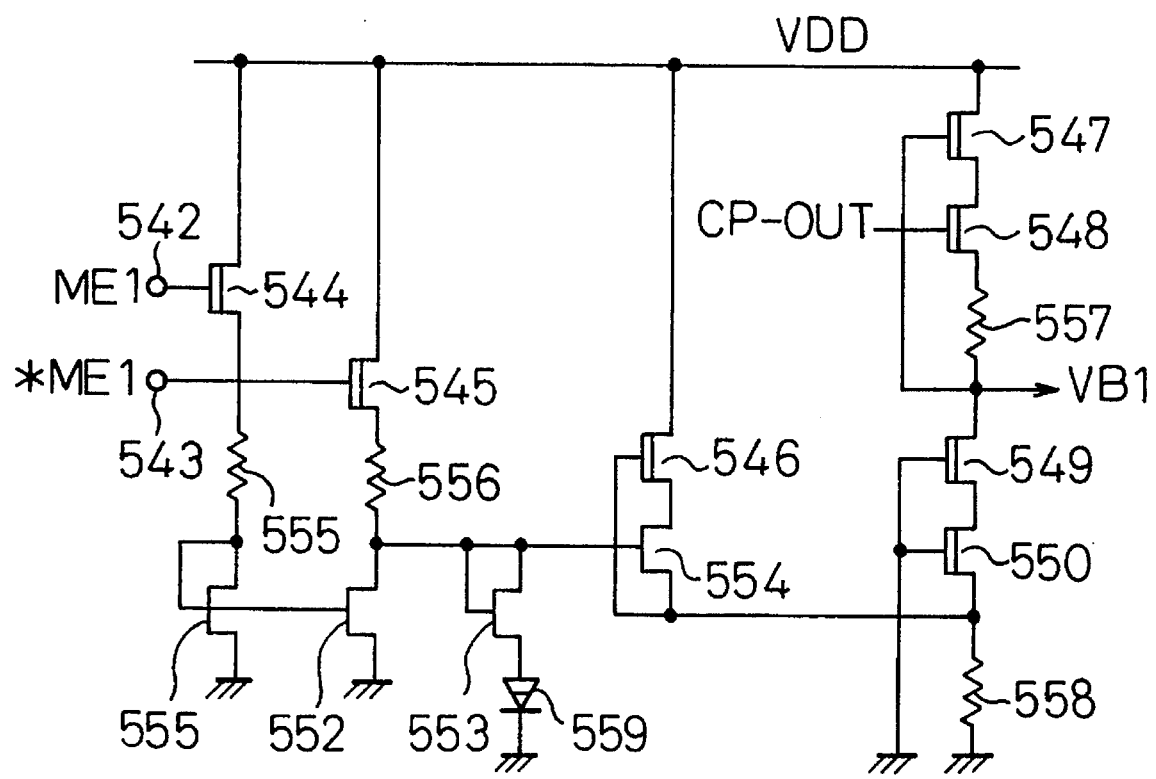
FIG. 54 is a circuit diagram showing a drive voltage generator shown in FIG. 53.

The drive voltage generator 534 has the circuitry shown in FIG. 54. In FIG. 54, reference numeral 542 indicates an input terminal to which the signal ME1 is applied. 543 indicates an input terminal to which the signal *E1 is applied.

Reference numerals 544 to 550 indicate depletion type MOS FETs, 551 to 554 indicate enhancement type MOS FETs, 555 to 558 indicate resistors and 559 indicates a diode including a depletion type MOS FET.

The circuit composed of the MOS FETs 547 and 548 and the resistor 557 has the same circuit elements as the circuit composed of the MOS FETs 549 and 550 and the resistor 558. A voltage CP-OUT developed at the output terminal 530 of the multiplying charge pump 305 is applied to the gate of the MOS FET 548, so that the drive voltage VB1 will have the same value as the voltage CP-OUT at the output terminal 530 of the multiplying charge pump 305.

As for the current inflow circuit 532 in FIG. 53, reference numeral 561 indicates a pump. 562 indicates a drive voltage generator for supplying a drive voltage VB2 to the pump 561. *ME2 indicates a signal produced by inverting the output signal ME2 of the NAND circuit 227.

As for the pump 561, reference numerals 563 to 565 indicate enhancement type MOS FETs. 566 and 567 indicate capacitors.

The MOS FETs 563 and 564 are transistors that perform pumping. The MOS FET 563 has a source thereof connected to the output terminal of the drive voltage generator 562. The MOS FET 564 has a source thereof connected to the drain of the MOS FET 563.

The MOS FET 565 has a source thereof connected to the drain of the MOS FET 564, a gate thereof connected to a drain thereof, and the drain thereof connected to the output terminal 530. The MOS FET 565 thus serves as a reverse-current prevention element for preventing current from flowing from the source to the drain thereof.

The capacitor 566 has one terminal thereof connected to the gate and drain of the MOS FET 563, and inputs a down signal DWN supplied from the phase detector 304 through the other terminal thereof.

The capacitor 567 has one terminal thereof connected to the gate and drain of the MOS FET 564, and inputs a down signal *DWN supplied from the phase detector 304 through the other terminal thereof.

As for the drive voltage generator 562, reference numerals 568 to 570 indicate depletion type MOS FETs and 571 indicates an enhancement type MOS FET. A voltage CP-OUT developed at the output terminal 530 of the multiplying charge pump 528 is applied to the gate of the MOS FET 568, so that the drive voltage VB2 will have the same value as the voltage CP-OUT at the output terminal 530 of the multiplying charge pump 528.

In the multiplying charge pump 528, when the signal ME1 is high, the signal *ME1 is low, and the signal ME2 is low; that is, when the unlock signal UNLOCK is high (unlocked state), the up signal UPf is low, and the down signal DWNf is low, or when the unlock signal UNLOCK is low (locked state), the MOS FET 544 in the drive voltage generator 534 is turned on, the MOS FET 545 therein is turned off, the gate of the MOS FET 554 therein is placed in a low-level state, and the MOS FET 554 therein is turned off. The circuit composed of the MOS FETs 547 to 550 and the resistors 557 and 558 is disconnected from the circuit installed in the previous stage and composed of the MOS FETs 546 and 554. The drive voltage VB1 is half of the supply voltage VDD.

In the drive voltage generator 562, the MOS FET 571 is turned off. The drive voltage VB2 is half of the supply voltage VDD.

In contrast, when the signal ME1 is low, the signal *ME1 is high, and the signal ME2 is low; that is, when the unlock signal UNLOCK is high (unlocked state), the up signal UPf is high, and the down signal DWNf is low, the MOS FET 544 in the drive voltage generator 534 is turned off, the MOS FET 545 therein is turned on, the gate of the MOS FET 554 therein is placed in a high-level state, and the MOS FET 554 therein is turned on. The source voltage of the MOS FET 550 rises.

As a result, the drive voltage VB1 supplied from the drive voltage generator 534 has a value larger than half of the supply voltage VDD. The voltage CP-OUT at the output terminal 530 of the multiplying charge pump 305 rises.

In the drive voltage generator 562, the MOS FET is turned off. The drive voltage VB2 is controlled so that it will have the same value as the voltage CP-OUT at the output terminal 530 of the multiplying charge pump 305.

When the signal ME1 is high, the signal *ME1 is low, and the signal ME2 is high; that is, when the unlock signal UNLOCK is high (unlocked state), the up signal UPf is low, and the down signal DWNf is high, the MOS FET 571 in the drive voltage generator 562 is turned on. The drive voltage VB2 supplied from the drive voltage generator 562 falls below half of the supply voltage VDD. As a result, the voltage CP-OUT at the output terminal 530 of the multiplying charge pump 305 falls.

In the drive voltage generator 534, the MOS FET 544 is turned on, the MOS FET 545 is turned off, the gate of the MOS FET 554 is placed in a low-level state, and the MOS FET 554 is turned off. The circuit composed of the MOS FETs 547 to 550 and the resistors 557 and 558 is disconnected from the circuit in the previous stage and including the MOS FETs 546 and 554. The drive voltage VB1 is controlled so that it will have the same value as the voltage CP-OUT at the output terminal 530 of the multiplying charge pump 305.

FIG. 55 is a timing chart describing the operation of the multiplying charge pump 305. In FIG. 55, the unlock signal UNLOCK, the up signal UPf and down signal DWNf, the up signal UP, the down signal DWN, a current $i_{UP}$ flowing out to the output terminal 530, a current $i_{DWN}$ flowing in from the output terminal 530, and the data signal DATA are shown.

When the unlock signal UNLOCK is high (unlocked state), the up signal UPf is high, and the down signal DWNf is low; that is, when the frequency of the clock CLK is lower than the data frequency of the data signal DATA, the drive voltage VB1 supplied from the drive voltage generator 534 rises and the voltage CP-OUT at the terminal 530 also rises.

When the up signal UP is driven high, the MOS FET 538 performs pumping so as to cause the current $i_{UP}$ to flow from the current outflow circuit 531 into the output terminal 530. In this case, the voltage CP-OUT at the output terminal 530 has a value determined by adding a value of a voltage rise occurring when the signal ME1 and signal ME2 are driven high and a value of a voltage rise occurring when the down signal DWVf is driven high.

Thereafter, when the up signal UPf goes low and the down signal DWNf goes high; that is, when the frequency of the clock CLK becomes lower than the data frequency of the data signal DATA, namely, the bit transfer frequency of the data signal, the drive voltage VB2 supplied from the drive voltage generator 562 falls and the voltage CP-OUT at the output terminal 530 falls.

In this state, when the up signal UP goes high, the MOS FET 238 performs pumping to cause the current $i_{UP}$ to flow from the current outflow circuit 531 to the output terminal 530. At this time, the voltage CP-OUT at the output terminal 530 has a value determined by subtracting a value of a voltage drop occurring when the down signal DWNf is driven high from a sum of a value attained when the signal ME1 is high and the signal ME2 is high, a value of a voltage rise induced by the current $i_{UP}$, and a value of a voltage rise occurring when the up signal UPf is driven high.

In this state, when the down signal DWN goes high, the MOS FET 563 performs pumping so as to cause the current $i_{DWN}$ to flow in from the output terminal 530. At this time, the voltage CP-OUT at the output terminal 530 has a value determined by subtracting the sum of a value of a voltage drop induced by the current $i_{DWN}$ and a value of a voltage drop occurring when the down signal DWNf is driven high from a value attained when the signal ME1 is high and the signal ME2 is high.

Thereafter, when the unlock signal UNLOCK goes low (locked state); that is, when the frequency of the clock CLK becomes consistent with or substantially consistent with the data frequency of the data signal DATA, the drive voltage VB2 supplied from the drive voltage generator 562 returns to a value attained when the signal ME1 is high and the signal ME2 is high.

In this state, when the down signal DWN goes high, the MOS FET 563 performs pumping so as to cause the current $i_{DN}$ to flow from the output terminal into the current inflow circuit 532. At this time, the voltage CP-OUT at the output terminal 530 has a value determined by subtracting the value of a voltage drop induced by the current $i_{DWN}$ from a value attained when the signal ME1 is high and the signal ME2 is high.

Using the multiplying charge pump 305, the pulse duration required for the charge pump drive signals is determined by the capacitors 539, 540, 566, and 567. This obviates the necessity of using a one-shot pulse produced from the data signal DATA to determine the pulse duration for the charge pump drive signals. A high-frequency data signal DATA can therefore be handled properly.

Using the multiplying charge pump 305, the drive voltages VB1 and VB2 are controlled so that they will have the same value as the voltage CP-OUT developed at the output terminal 530. The output impedance can therefore be raised, and the influence of power-supply noise can be minimized.

In the clock reproduction circuit of the first embodiment having the aforesaid components, with the input of a data signal DATA, the phase detector 304 detects a phase difference between the clock CLK supplied from the voltage controlled oscillator (VCO) 303 and the data signal DATA. The phase-locked loop 306 operates so that the clock CLK will be synchronized in phase with the data signal DATA.

In this case, the PLL control circuit 307 detects the phase difference between the clock CLK and data signal DATA, without waiting for a cycle slip, at every transition of the data signal DATA.

Base on the relationship between the quantized phase difference $\Delta\beta_{n-1}$, between the clock CLK and data signal detected at the previous transition of the data signal DATA and the quantized phase difference $\Delta\beta_n$, between the clock CLK and data signal DATA detected at the current transition of the data signal DATA, a difference between the frequency of the clock CLK and the data frequency of the data signal DATA is detected. The multiplying charge pump 305 is controlled so that the frequency of the clock CLK will become consistent with the data frequency of the data signal DATA.

When the frequency of the clock CLK is lower than the data frequency of the data signal DATA; that is, when the frequency of the clock CLK falls short of the data frequency of the data signal DATA, the Frequency Short signal S– is driven high.

As a result, the up signal UPf is driven high. The output voltage CP-OUT of the multiplying charge pump 305 is raised, and the frequency of the clock CLK is raised.

In contrast, when the frequency of the clock CLK is higher than the data frequency of the data signal DATA; that is, the frequency of the clock CLK exceeds the data frequency of the data signal DATA, the Frequency Excess signal S+ is driven high.

As a result, the down signal DWNf is driven high. The output voltage CP-OUT of the multiplying charge pump 305 is lowered, and the frequency of the clock CLK is lowered.

When the frequency of the clock CLK becomes consistent with or close to the data frequency of the data signal DATA, the signal UNLOCK supplied by the lock detector 316 is driven low. The PLL 302 continues to lock the phase without being controlled by the PLL circuit 307.

As mentioned above, according to the clock reproduction circuit of the first embodiment, a difference between the frequency of the clock CLK and the data frequency is detected without a wait for a cycle slip so that the frequency of the clock CLK will be consistent with the data frequency of the data signal DATA. The gain of the phase detector 304 will not be raised; that is, the amount of timing jitter will not increase, whereas the speed of frequency detection can be increased and a speedup of clock reproduction can be achieved.

Figure 56:
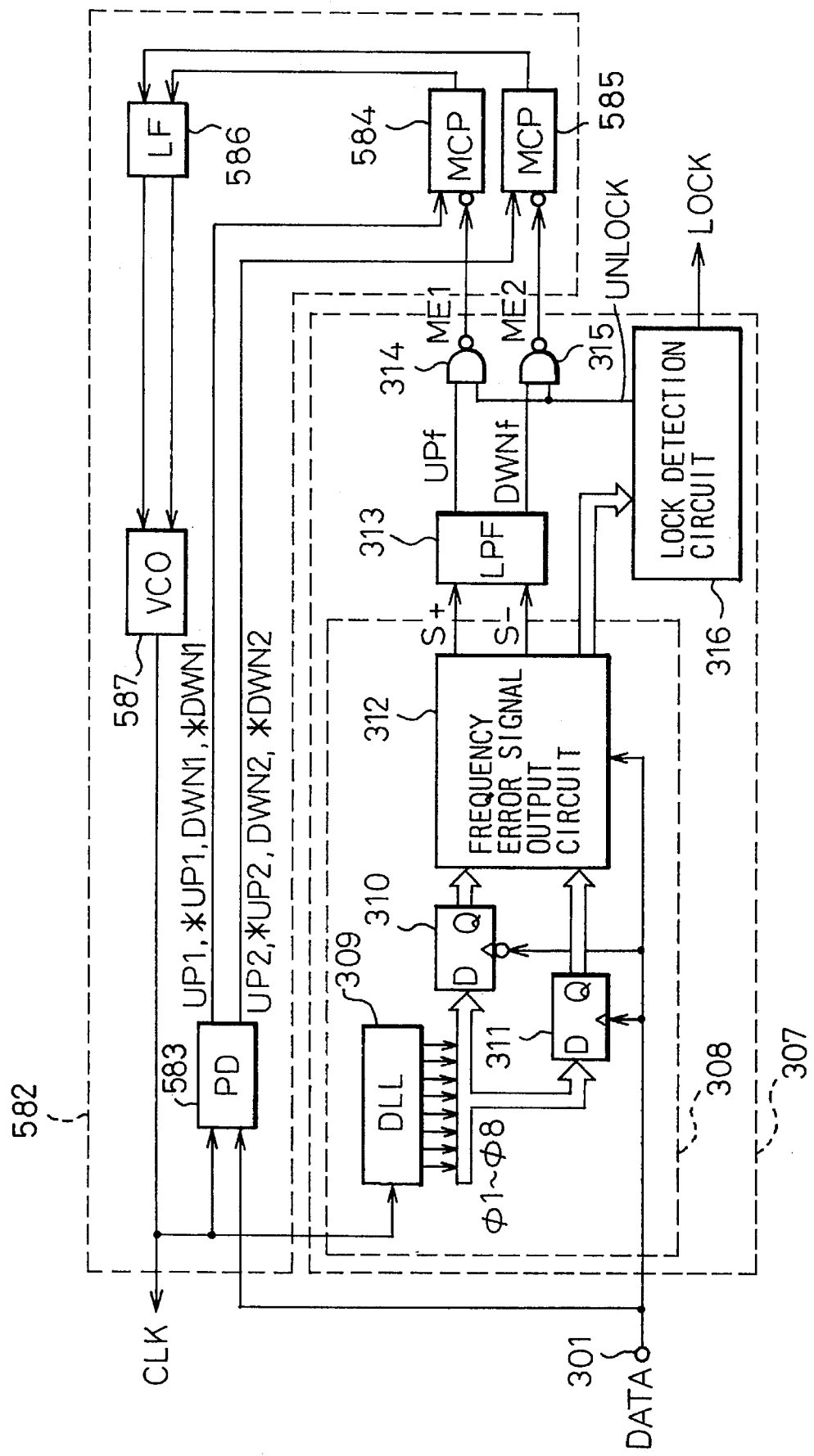
FIG. 56 is a circuit diagram showing a constitution of a clock reproduction circuit of a fifth embodiment.

FIG. 56 is a circuit diagram showing a constitution of a clock reproduction circuit of a fifth embodiment in accordance with the present invention. According to this embodiment, a clock reproduction circuit has a phase-locked loop (PLL) 582 whose circuitry is different from that of the PLL 302 in the fourth embodiment shown in FIG. 32. The other components are identical to those of the clock reproduction circuit of the fourth embodiment shown in FIG. 32.

As for the PLL 582, reference numeral 583 indicates a phase detector (PD), 584 and 585 indicate multiplying charge pumps (MCP), 586 indicates a loop filter (LF) and 587 indicates a voltage controlled oscillator (VCO).

Figure 57:
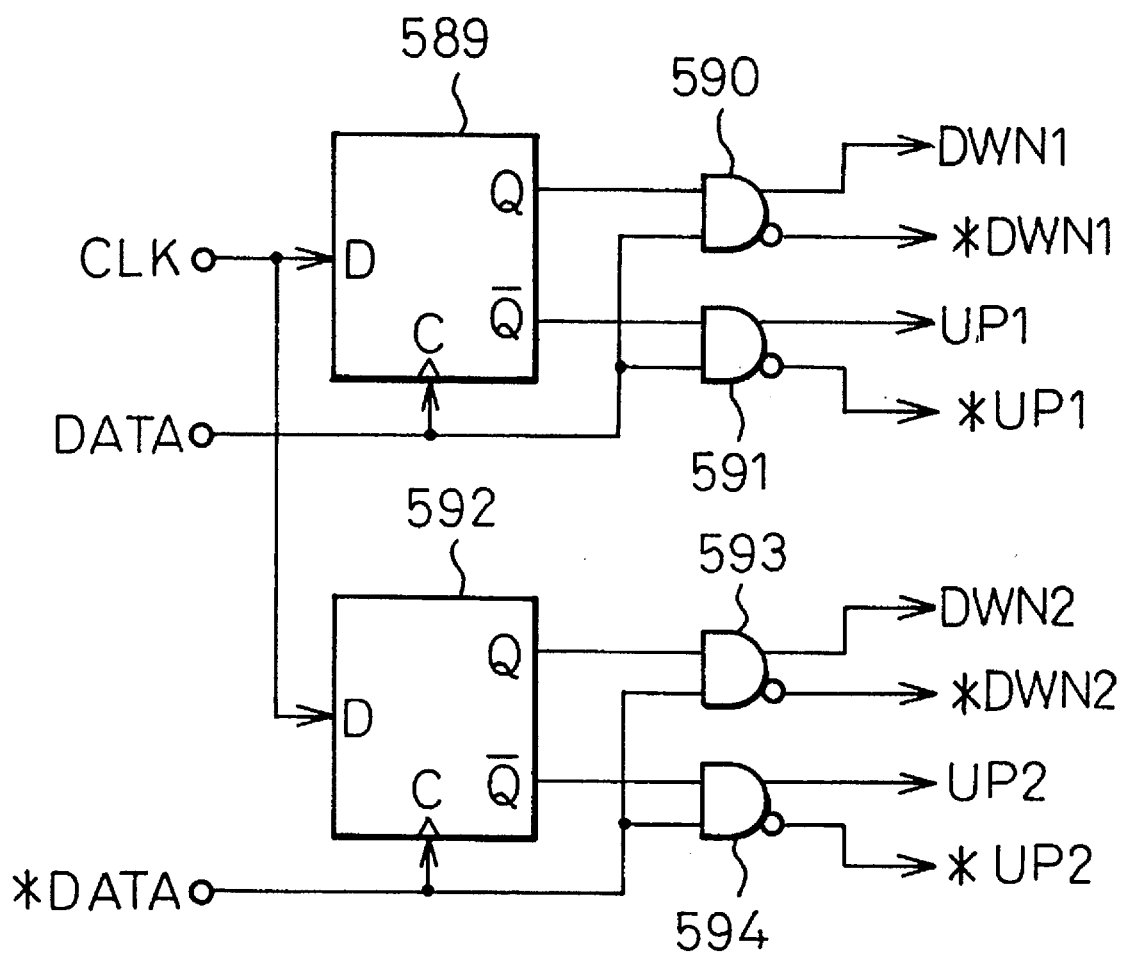
FIG. 57 is a circuit diagram showing a phase detector shown in FIG. 56.

The phase detector 583 has the circuitry shown in FIG. 57. In FIG. 57, reference numeral 589 indicates a positive edge type latch that inputs a clock CLK through a data input terminal D thereof and a data signal DATA through a latch signal input terminal C.

Reference numeral 590 indicates an AND circuit having complementary output terminals that produces a positive-phase down signal DWN1 and a negative-phase down signal *DWN1 from a positive-phase output Q of the latch 589 and the data signal DATA. In the following, terms "positive phase" and "negative phase" are omitted.

Reference numeral 591 indicates an AND circuit having complementary output terminals that produces an up signal UP1 and a up signal *UP1 from a output *Q and the data signal DATA. When the data signal DATA goes high, if the clock CLK leads the data signal DATA, the output Q of the latch 589 is driven high and the output *Q thereof is driven low.

As a result, when the data signal DATA remains high, the down signal DWN1 is high, the down signal *DWN1 is low, the up signal UP1 is low, and the up signal *UP1 is high.

Thereafter, when the data signal DATA is driven low, the down signal DWN1 goes low and the down signal *DWN1 goes high. The up signal UP1 remains low and the up signal *UP1 remains high.

In contrast, when the data signal DATA goes low, if the clock CLK lags behind the data signal DATA, the output Q of the latch 589 is driven low and the output *Q thereof is driven low.

As a result, when the data signal DATA remains high, the down signal DWN1 is low, the down signal *DWN1 is high, the up signal UP1 is high, and the up signal *UP1 is low.

Thereafter, when the data signal DATA is driven low, the down signal DWN1 remains low and the down signal *DWN1 remains high, while the up signal UP1 goes low and the up signal *UP1 goes high.

Reference numeral 592 indicates a positive edge type latch that inputs the clock CLK through a data input terminal D thereof and the data signal *DATA through a latch signal input terminal C thereof.

Reference numeral 593 indicates an AND circuit having a output terminal that produces a down signal DWN2 and a down signal *DWN2 from the output Q of the latch 592 and the data signal *DATA.

Reference numeral 594 indicates an AND circuit having a output terminal that produces an up signal UP2 and an up signal *UP2 from the output *Q of the latch 292 and the inverse data signal *DATA.

When the data signal *DATA goes high, if the clock CLK leads the data signal DATA, the output Q of the latch 592 is driven high and the output *Q thereof is driven low.

As a result, when the data signal *DATA remains high, the down signal DWN2 is high, the down signal *DWN2 is low, the up signal UP2 is low, and the up signal *UP2 is high.

Thereafter, when the data signal DATA is driven low, the down signal DWN2 goes low and the down signal *DWN2 goes high. The up signal UP2 remains low and the up signal *UP2 remains high.

In contrast, when the data signal *DATA goes low, if the clock CLK lags behind the data signal DATA, the output Q of the latch 592 is driven low and the output *Q thereof is driven high.

As a result, when the data signal *DATA remains high, the down signal DWN2 is low, the down signal *DWN2 is high, the up signal UP2 is high, and the up signal *UP2 is low.

Thereafter, when the data signal *DATA is driven low, the down signal DWN2 remains low and the down signal *DWN2 remains high, while the up signal UP2 goes low and the up signal *UP2 goes high.

The circuit composed of the latch 589 and AND circuits 590 and 591, and the circuit composed of the latch 592 and AND circuits 593 and 594 operate mutually complimentarily.

Figure 58:
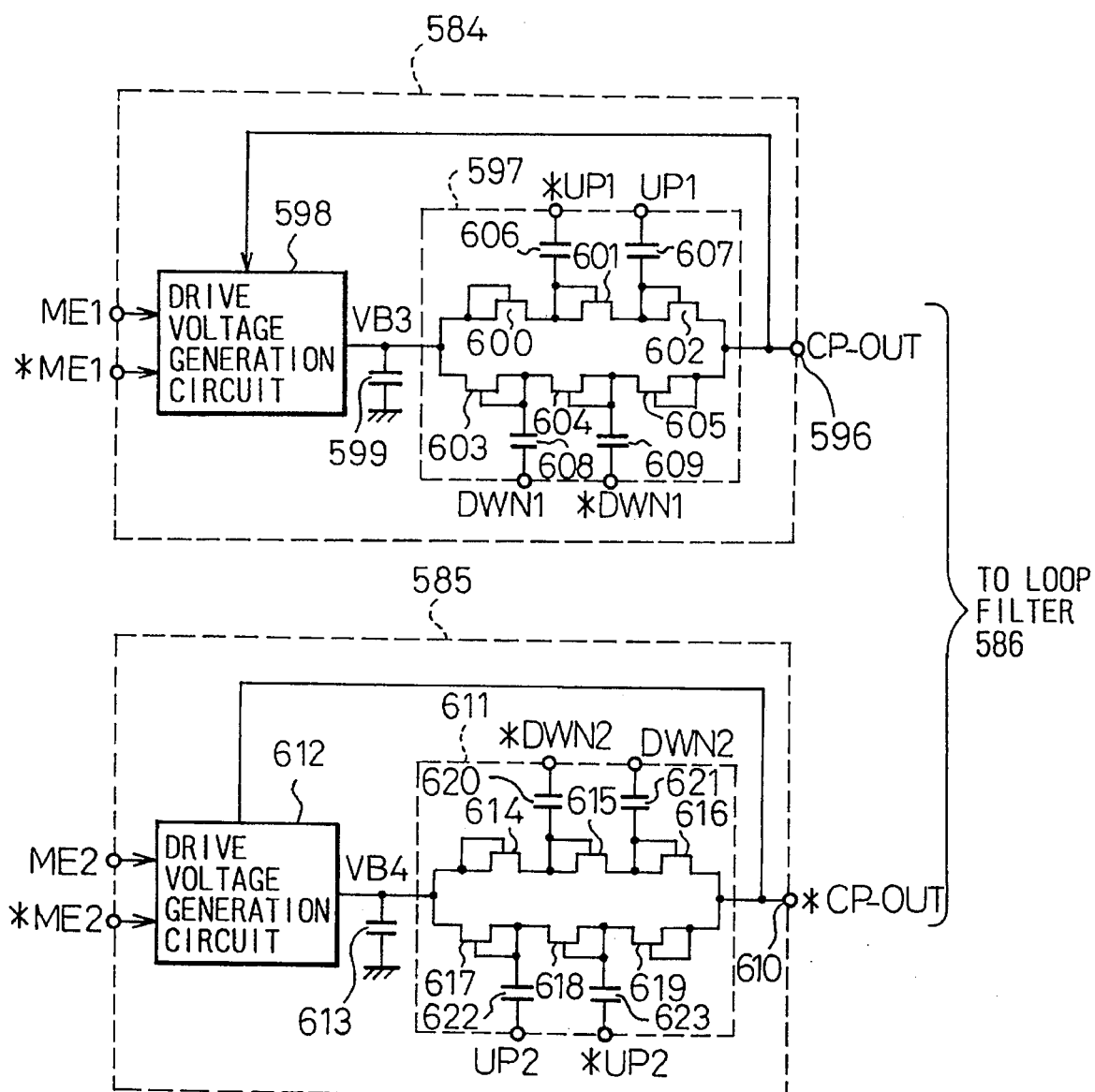
FIG. 58 is a circuit diagram showing a multiplying charge pump shown in FIG. 56.

The multiplying charge pumps 584 and 585 have the circuitry shown in FIG. 58. As for the multiplying charge pump 584, reference numeral 596 indicates an output terminal, 597 indicates a pump, 598 indicates a drive voltage generator for supplying a drive voltage VB3 to the pump 597 and 599 indicates a capacitor.

As for the pump 597, reference numerals 600 to 605 indicate enhancement type MOS FETs; and 606 to 609 indicate capacitors.

The MOS FET 600 has a gate thereof connected to a drain thereof, and the drain thereof connected to the output terminal of the drive voltage generator 598. The MOS FET 600 thus serves as a reverse-current prevention element for preventing current from flowing from the source to the drain.

The MOS FETs 601 and 602 are transistors serving as a pump for pumping current to the output terminal 596. The MOS FET 601 has a drain thereof connected to the source of the MOS FET 600. The MOS FET 602 has a drain thereof connected to the source of the MOS FET 601 and a source thereof connected to the output terminal 596.

The capacitor 606 has one terminal connected to the gate and drain of the MOS FET 601, and inputs the up signal UP1* supplied from the phase detector 583 through the other terminal thereof.

The capacitor 607 has one terminal thereof connected to the gate and drain of the MOS FET 602, and inputs the up signal UP1 supplied from the phase detector 583 through the other terminal thereof.

The MOS FETs 603 and 604 are transistors that perform pumping to pump current in through the output 596. The MOS FET 603 has a source thereof connected to the output terminal of the drive voltage generator 598. The MOS FET 604 has a source thereof connected to the drain of the MOS FET 603.

The MOS FET 605 has a source connected to the drain of the MOS FET 604, a gate thereof connected to the drain thereof, and the drain thereof connected to the output terminal 596. The MOS FET 605 thus serves as a reverse-current prevention element for preventing current from flowing from the source to the drain.

The capacitor 608 has one terminal thereof connected to the gate and drain of the MOS FET 603, and inputs the down signal DWN1 supplied from the phase detector 583 through the other terminal thereof.

The capacitor 609 has one terminal thereof connected to the gate and drain of the MOS FET 604, and inputs the down signal *DWN1 supplied from the phase detector 283 through the other terminal thereof.

As for the multiplying charge pump 585, reference numeral 610 indicates an output terminal, 611 indicates a pump, 612 indicates a drive voltage generator for supplying a drive voltage VB4 to the pump 611 and 613 indicates a capacitor.

As for the pump 611, reference numerals 614 to 619 indicate enhancement type MOS FETs. 620 to 623 indicate capacitors.

The MOS FET 614 has a gate thereof connected to a drain thereof, and the drain thereof connected to the output terminal of the drive voltage generator 612. The MOS FET 314 thus serves as a reverse-current prevention element for preventing current from flowing from the source to the drain.

The MOS FETs 615 and 616 are transistors that perform pumping to pump current to the output terminal 610. The MOS FET 615 has a drain thereof connected to the source of the MOS FET 614. The MOS FET 616 has a drain thereof connected to the source of the MOS FET 615 and a source thereof connected to the output terminal 610.

The capacitor 620 has one terminal connected to the gate and drain of the MOS FET 615, and inputs the inverse down signal *DWN2 supplied from the phase detector 583 through the other terminal thereof.

The capacitor 621 has one terminal connected to the gate and drain of the MOS FET 616, and inputs the down signal DWN2 supplied from the phase detector 583 through the other terminal thereof.

The MOS FETs 617 and 618 are transistors that perform pumping to pump current from the output terminal 610. The MOS FET 617 has a source thereof connected to the output terminal of the drive voltage generator 612. The MOS FET 618 has a source thereof connected to the drain of the MOS FET 617.

The MOS FET 619 has a source thereof connected to the drain of the MOS FET 618, a source thereof connected to a drain thereof, and the drain thereof connected to the output terminal 610. The MOS FET 619 thus serves as a reverse-current prevention element for preventing current from flowing from the source to the drain.

The capacitor 622 has one terminal thereof connected to the gate and drain of the MOS FET 617, and inputs the up signal UP2 supplied from the phase detector 583 through the other terminal thereof.

The capacitor 623 has one terminal thereof connected to the gate and drain of the MOS FET 618, and inputs the up signal *UP2 supplied from the phase detector 583 through the other terminal thereof.

Figure 59:
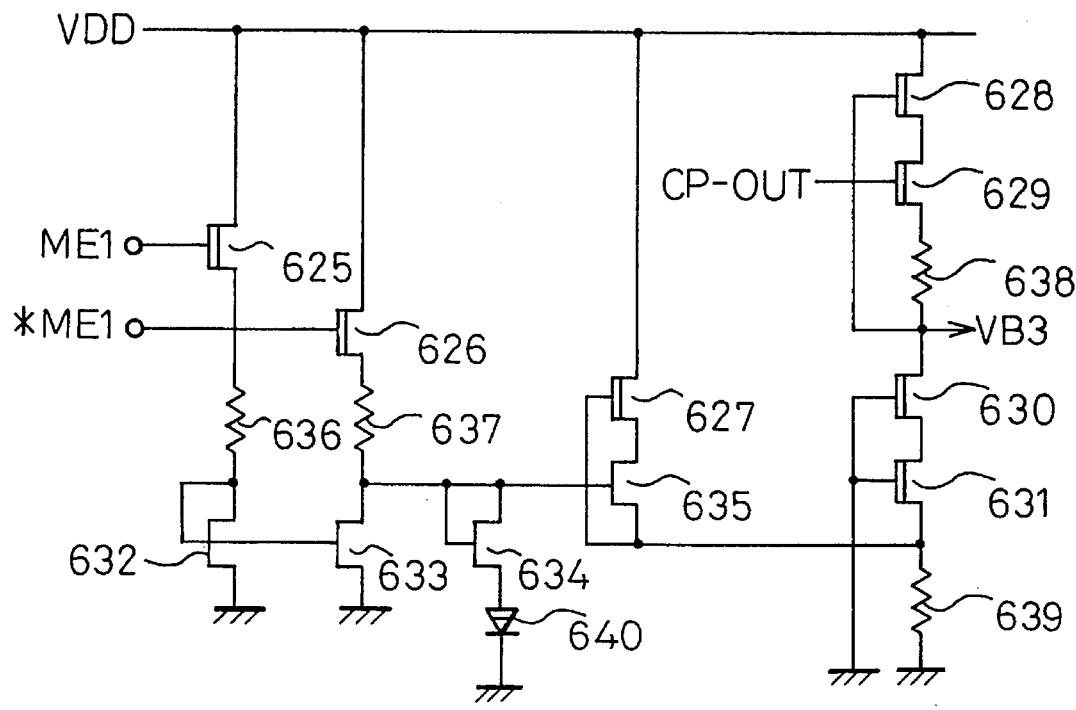
FIG. 59 is a circuit diagram showing one of the drive voltage generators shown in FIG. 58.

The drive voltage generator 598 has the circuitry shown in FIG. 59. In FIG. 59, reference numerals 625 to 631 indicate depletion type MOS FETs, 632 to 635 indicate enhancement type MOS FETs, 636 to 639 indicate resistors and 640 indicates a diode formed by a depletion type MOS FET.

Figure 60:
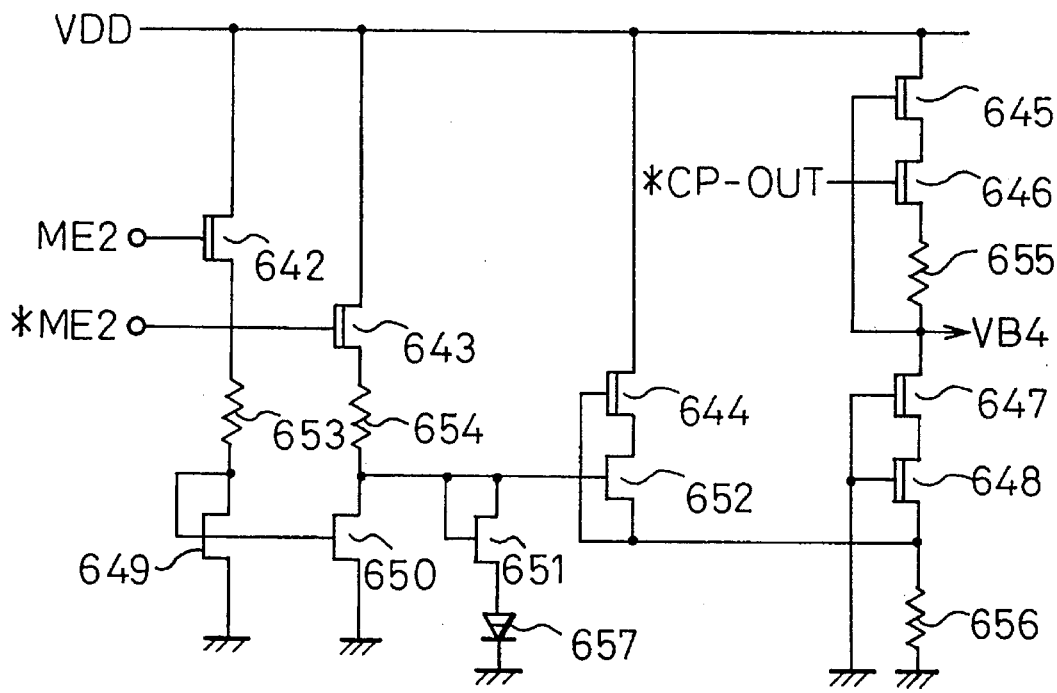
FIG. 60 is a circuit diagram showing the other one of the drive voltage generators shown in FIG. 58.

The drive voltage generator 612 has the circuitry shown in FIG. 60. In FIG. 60, reference numerals 642 to 648 indicate depletion type MOS FETs, 649 to 652 indicate enhancement type MOS FETs, 653 to 656 indicate resistors and 657 indicates a diode formed by a depletion type MOS FET.

These drive voltage generators 598 and 612 have the same circuitry as the drive voltage generator 534 shown in FIG. 54. In the drive voltage generator 598, signals ME1 and *ME1 are fed to the MOS FETs 625 and 626 respectively. The voltage CP-OUT developed at the output terminal 596 of the multiplying charge pump 584 is fed to the MOS FET 329.

In the drive voltage generator 612, signals ME2 and ME2* are fed to the MOS FETs 642 and 643 respectively. The voltage *CP-OUT developed at the output terminal 596 of the multiplying charge pump 585 is fed to the MOS FET 646.

In the drive voltage generator 598, when the signal ME1 is high and the signal *ME1 is low, that is, when the unlock signal UNLOCK is high (unlocked state) and the up signal UPf is low, or when the unlock signal UNLOCK is low (locked state), the MOS FET 625 is turned on, the MOS FET 626 is turned off, the gate of the MOS FET 635 is placed in a low-level state, and the MOS FET 635 is turned off. The circuit composed of the MOS FETs 628 to 631 and the resistors 638 and 639 is disconnected from the previous stage circuit including the MOS FETs 627 and 635. The drive voltage VB3 is half the value of the supply voltage VDD.

In contrast, when the signal ME1 is low and the signal *ME1 is high; that is, when the unlock signal UNLOCK is high (unlocked state) and the up signal UPf is high, the MOS FET 625 is turned off, the MOS FET 626 is turned on, the gate of the MOS FET 635 is placed in a high-level state, and the MOS FET 635 is turned on. The source voltage of the MOS FET 631 rises, and the drive voltage VB3 has a value larger than half of the supply voltage VDD.

In the drive voltage generator 612, when the signal ME2 is high and the signal *ME2 is low; that is, when the unlock signal UNLOCK is high (unlocked state) and the down signal DWNf is low, or when the unlock signal UNLOCK is low (locked state), the MOS FET 642 is turned on, the MOS FET 643 is turned off, the gate of the MOS FET 652 is placed in a low-level state, and the MOS FET 652 is turned off. The circuit composed of the MOS FETs 645 to 648 and the resistors 655 and 656 is disconnected from the previous stage circuit including the MOS FETs 644 and 652. The drive voltage VB has half the value of the supply voltage VDD.

In contrast, when the signal ME2 is low and the signal *ME2 is high; that is, when the unlock signal UNLOCK is high (unlocked state) and the down signal DWNf is high, the MOS FET 642 is turned off, the MOS FET 643 is turned on, the gate of the MOS FET 652 is placed in a high-level state, and the MOS FET 652 is turned on. The source voltage of the MOS FET 648 rises, and the drive voltage VB has a value larger than half of the supply voltage VDD.

FIG. 61 is a timing chart describing the operation of the multiplying charge pumps 584 and 585. In FIG. 61, the data signal DATA, the clock CLK, the up signal UP1, the up signal UP2, the down signal DWN1, the down signal DWN2, an output current $i_{584}$ of the multiplying charge pump 58, an output current $i_{585}$ of the multiplying charge pump 585 are shown.

When the data signal DATA makes a low-to-high transition, and if the clock CLK leads the data signal DATA, the down signal DWN1 is driven high and the down signal *DWN1 is driven low. The MOS FET 603 performs pumping, whereby current flows from the output terminal 596 into the multiplying charge pump 584. The voltage CP-OUT at the output terminal 596 falls.

When the data signal DATA makes a high-to-low transition (when the inverse data signal *DATA makes a low-to-high transition), if the clock CLK lags behind the data signal DATA, the up signal UP2 is driven high and the up signal *UP2 is driven low. The MOS FET 617 performs pumping, whereby current flows from the output terminal 610 into the multiplying charge pump 585. The voltage *CP-OUT at the output terminal 610 falls.

When the data signal DATA makes a low-to-high transition, if the clock CLK lags behind the data signal DATA, the up signal UP1 is driven high and the up signal *UP1 is driven low. The MOS FET 602 performs pumping, whereby current flows from the multiplying charge pump 585 to the output terminal 610. The voltage *CP-OUT at the output terminal 610 rises.

When the data signal DATA makes a high-to-low transition (when the data signal *DATA makes a low-to-high transition), if the clock CLK leads the data signal DATA, the down signal DWN2 is driven high and the down signal *DWN2 is driven low. The MOS FET 616 performs pumping, whereby current flows from the multiplying charge pump 585 to the output terminal 610. The voltage *CP-OUT at the output terminal 610 rises.

The loop filter 586 has the circuitry shown in FIG. 62. In FIG. 62, reference numeral 659 indicates a full-differential amplifier. 660 and 661 indicate resistors. 662 and 663 indicate capacitors. VC and *VC indicate control voltages that are in relation to each other and are supplied to the voltage controlled oscillator 587.

The voltage controlled oscillator 587 is designed to supply a clock CLK whose frequency is consistent with the frequency of the control voltage VC or *VC supplied from the loop filter 586.

When the voltage CP-OUT at the output terminal 596 of the multiplying charge pump 584 rises or when the voltage *CP-OUT at the output terminal 610 of the multiplying charge pump 685 falls, the control voltage VC rises and the control voltage *VC falls.

In contrast, when the voltage CP-OUT at the output terminal 596 of the multiplying charge pump 584 falls or when the voltage *CP-OUT at the output terminal 610 of the multiplying charge pump 585 rises, the control voltage VC falls and the control voltage *VC rises.

In the clock reproduction circuit of the second embodiment having the aforesaid configuration, with the input of the data signal DATA, the phase detector 583 detects a phase difference between the clock CLK supplied from the voltage controlled oscillator 587 and the data signal DATA. The phase-locked loop 582 operates so that the clock CLK will be synchronized in phase with the data signal DATA.

In this case, the phase-locked loop control circuit 307 detects a phase difference between the clock CLK and data signal DATA, without waiting for a cycle slip, at every transition of the data signal DATA.

Based on the quantized phase difference $\Delta\beta_{n-1}$, between the clock CLK and data signal detected at the previous transition of the data signal DATA, and the quantized phase difference $\Delta\beta_n$, between the clock CLK and data signal DATA detected at the current transition of the data signal DATA, a difference between the frequency of the clock CLK and the bit transfer frequency of the data signal DATA is detected. The multiplying charge pumps 584 and 585 are controlled so that the frequency of the clock CLK will become consistent with the bit transfer frequency of the data signal DATA.

When the frequency of the clock CLK is lower than the data frequency of the data signal DATA; that is, when the frequency of the clock CLK falls short of the bit transfer frequency of the data signal DATA, the Frequency short signal S− is driven high.

As a result, the up signal UPf is driven high, the output voltage CP-OUT of the multiplying charge pump 584 is raised, the control voltage VC is raised, the control voltage *VC is lowered, and the frequency of the clock CLK is raised.

In contrast, when the frequency of the clock CLK is higher than the data frequency; that is, when the frequency of the clock CLK exceeds the bit transfer frequency of the data signal DATA, the frequency excess signal S+ is driven high.

As a result, the down signal DWNf is driven high, the output voltage CP-OUT of the multiplying charge pump 585 is raised, the control voltage VC is lowered, the control voltage *VC is raised, and the frequency of the clock CLK is lowered.

When the frequency of the clock CLK becomes consistent with or close to the data frequency, the signal UNLOCK supplied from the lock detector 316 is driven low. The phase-locked loop 582 continues to lock the phase without being controlled by the phase-locked loop control circuit 307.

As mentioned above, using the clock reproduction circuit of the fifth embodiment, a difference between the frequency of the clock CLK and the data frequency is detected without waiting for a cycle slip, so that the frequency of the clock CLK will be consistent with the data frequency of the data signal DATA. The gain of the phase detector 583 will not be raised; that is, the amount of timing jitter will not increase, whereas the frequency detection can be speeded up and a speedup of clock signal reproduction can be achieved.

Figure 63:
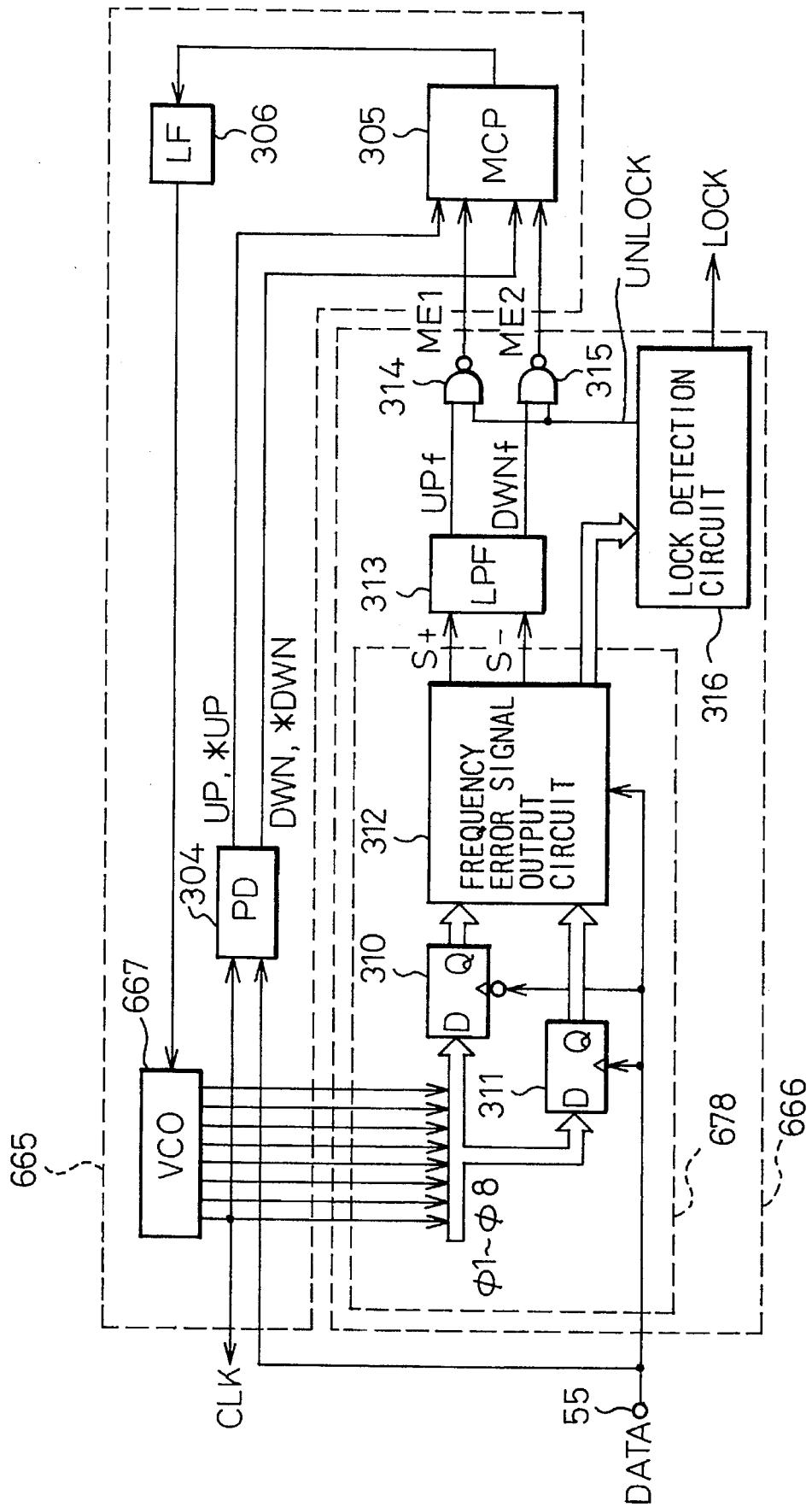
FIG. 63 is a circuit diagram showing a constitution of a clock reproduction circuit of the sixth embodiment.

FIG. 63 is a circuit diagram showing the constitution of a clock reproduction circuit of a sixth embodiment in accordance with the present invention. In FIG. 63, reference numeral 665 indicates a phase-locked loop (PLL). 666 indicates a phase-locked loop control circuit.

The phase-locked loop 665 has a voltage controlled oscillator 667 whose circuitry is different from that of the voltage controlled oscillator 303 shown in FIG. 32. The other circuit elements are identical to those of the phase-locked loop 302 shown in FIG. 32.

Figure 64:
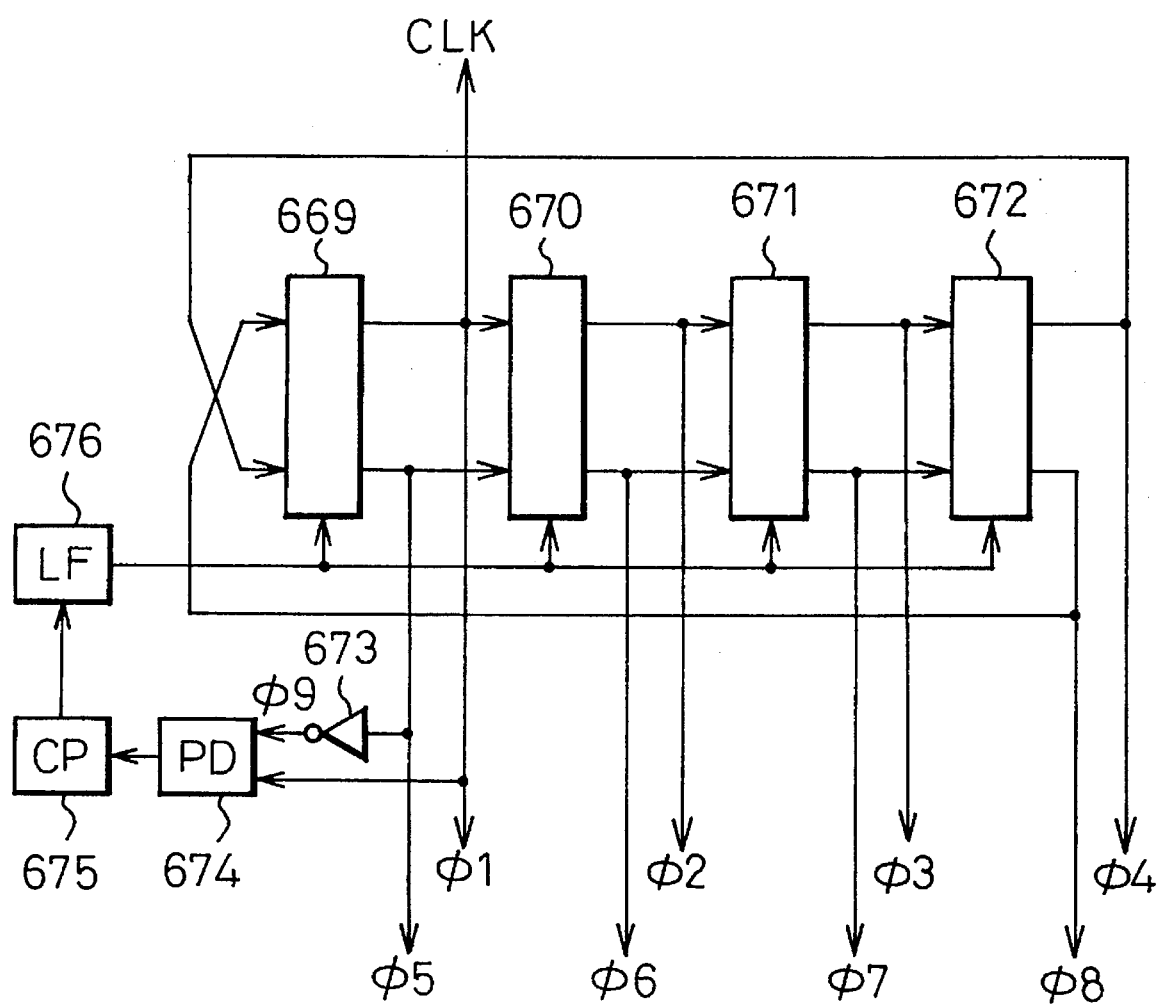
FIG. 64 is a circuit diagram showing a voltage controlled oscillator (VCO) shown in FIG. 63.

The voltage controlled oscillator 667 has the circuitry shown in FIG. 64. In FIG. 64, reference numerals 669 to 672 indicate delay cells constituting a ring oscillator. The delay cell 669 supplies clocks $\phi1$ and $\phi5$, the delay cell 670 supplies clocks $\phi2$ and $\phi6$, the delay cell 671 supplies clocks $\phi3$ and $\phi7$, and the delay cell 671 supplies clocks $\phi4$ and $\phi8$.

Reference numeral 673 indicates an inverter for inverting the clock $\phi5$ so as to supply a clock $\phi9$ that is to be synchronized with the clock $\phi1$. 674 indicates a phase detector (PD) to which the clocks $\phi1$ and $\phi9$ are fed. 675 indicates a charge pump (CP). 676 indicates a loop filter (LF). Depending on the output voltage of the loop filter 676, the delay times of the delay cells 669 to 672 are controlled.

The phase-locked loop control circuit 666 has a frequency error detector 678 whose circuitry is different from that of the frequency error detector 308 shown in FIG. 32. The other circuit elements are identical to those of the phase-locked loop control circuit 307 shown in FIG. 32.

The frequency error detector 678 uses the clocks $\phi1$ to $\phi8$ supplied by the voltage controlled oscillator 667 but does not have the delay-locked loop 309 shown in FIG. 32. Except for the point that the delay-locked loop 309 shown in FIG. 32 is not included, the frequency error detector 678 has the same circuitry as the frequency error detector 308 shown in FIG. 32.

In the clock reproduction circuit of the third embodiment having the aforesaid configuration, with the input of the data signal DATA, the phase detector 304 detects a phase difference between the clock CLK supplied from the voltage controlled oscillator 667 and data signal DATA. The phase-locked loop 665 operates so that the clock CLK will be synchronized in phase with the data signal DATA.

In this case, the phase-locked loop control circuit 666 detects a phase difference between the clock CLK and data signal DATA, without waiting for a cycle slip, at every transition of the data signal DATA.

Based on the relationship between the quantized phase difference $\Delta\beta_{n-1}$, between the clock CLK and data signal detected at the previous transition of the data signal DATA, and the quantized phase difference $\Delta\beta_n$, between the clock CLK and data signal DATA detected at the current transition of the data signal DATA, a difference between the frequency of the clock CLK and the data frequency of the data signal DATA is detected. The phase-locked loop 665 is then controlled so that the frequency of the clock CLK will become consistent with the data frequency of the data signal DATA.

When the frequency of the clock CLK is lower than the data frequency of the data signal DATA; that is, when the frequency of the clock CLK falls short of the data frequency of the data signal DATA, the Frequency Short signal S− is driven high.

As a result, the up signal UPf is driven high, the output voltage CP-OUT of the multiplying charge 305 is raised, and the frequency of the clock CLK is raised.

In contrast, when the frequency of the clock CLK is higher than the data frequency of the data signal DATA, the frequency excess signal S+ is driven high.

As a result, the down signal DWNf is driven high, the output voltage CP-OUT of the multiplying charge 305 is lowered, and the frequency of the clock CLK is lowered.

When the frequency of the clock CLK becomes consistent with or close to the data frequency of the data signal DATA, the signal UNLOCK supplied from the lock detector 316 is driven low. The phase-locked loop 665 continues lock the phase without being controlled by the phase-locked loop control circuit.

As mentioned above, in the clock reproduction circuit of the third embodiment, a difference between the frequency of the clock CLK and the data frequency of the data signal DATA is detected, without waiting for a cycle slip, so that the frequency of the clock CLK will become consistent with the data frequency of the data signal DATA. The gain of the phase detector 674 need not be raised; that is, the amount of timing jitter will not increase, whereas frequency detection can be speeded up and a speedup of clock signal reproduction can be achieved.

Figure 65:
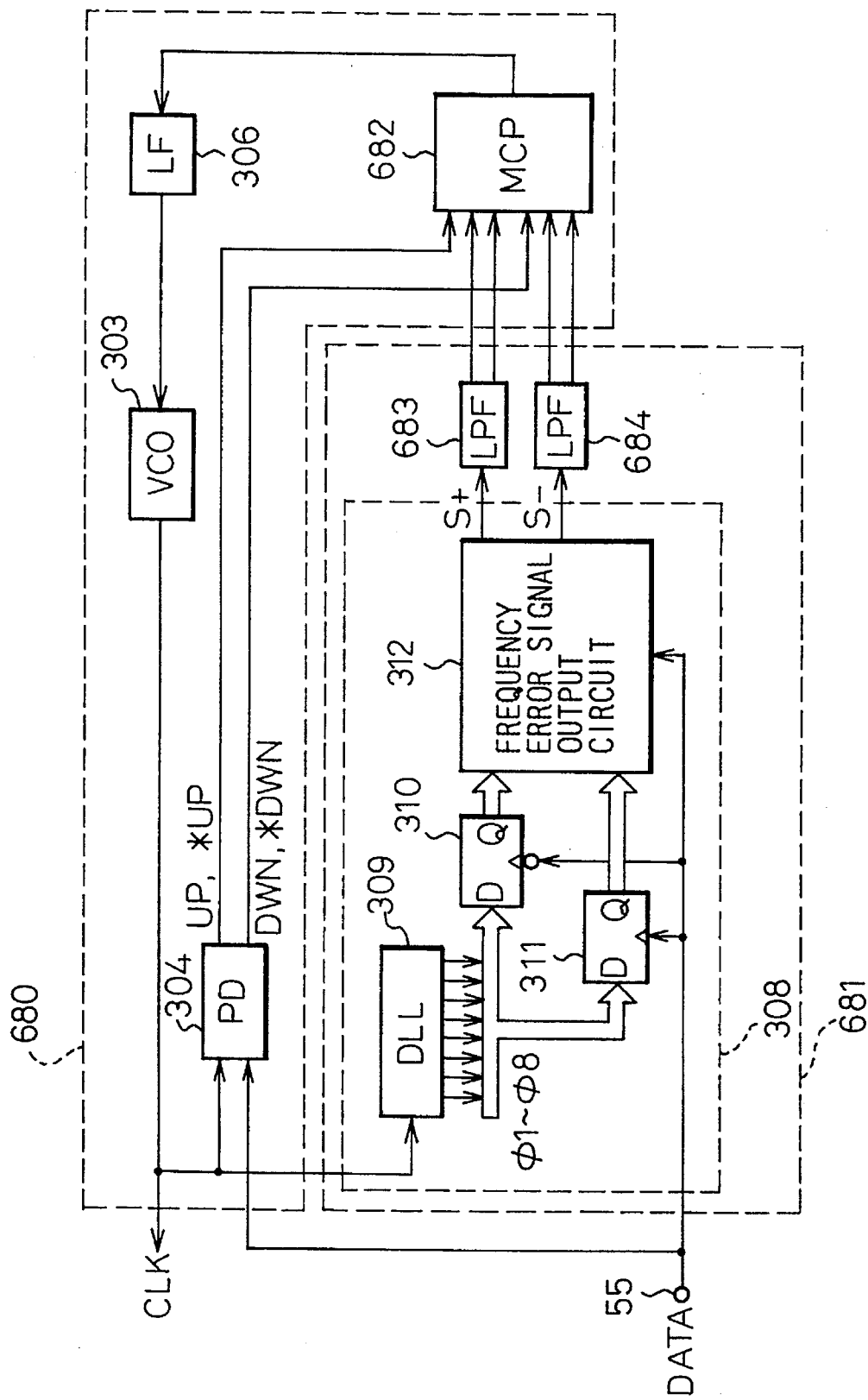
FIG. 65 is a circuit diagram showing a constitution of a clock reproduction circuit of the seventh embodiment.

FIG. 65 is a circuit diagram showing a constitution of a clock reproduction circuit of a seventh embodiment. In FIG. 65, reference numeral 680 indicates a phase-locked loop; and 681 indicates a phase-locked loop control circuit for controlling the phase-locked loop 680.

The phase-locked loop 680 has a multiplying charge pump 682 whose circuitry is different from that of the multiplying charge pump 305 shown in FIG. 32. The other circuit elements are identical to those of the phase-locked loop 302 shown in FIG. 32.

The phase-locked loop control circuit 681 does not include the lock detector 316, NAND circuits 314 and 315, and low-pass filter 313 which are shown in FIG. 32. On behalf of these elements, the phase-locked loop control circuit 681 includes low-pass filters (LPF) 683 and 684 whose circuitry is different from that of the low-pass filter 313 shown in FIG. 32. The other circuit elements are identical to those of the phase-locked loop control circuit 307 shown in FIG. 32.

Figure 66:
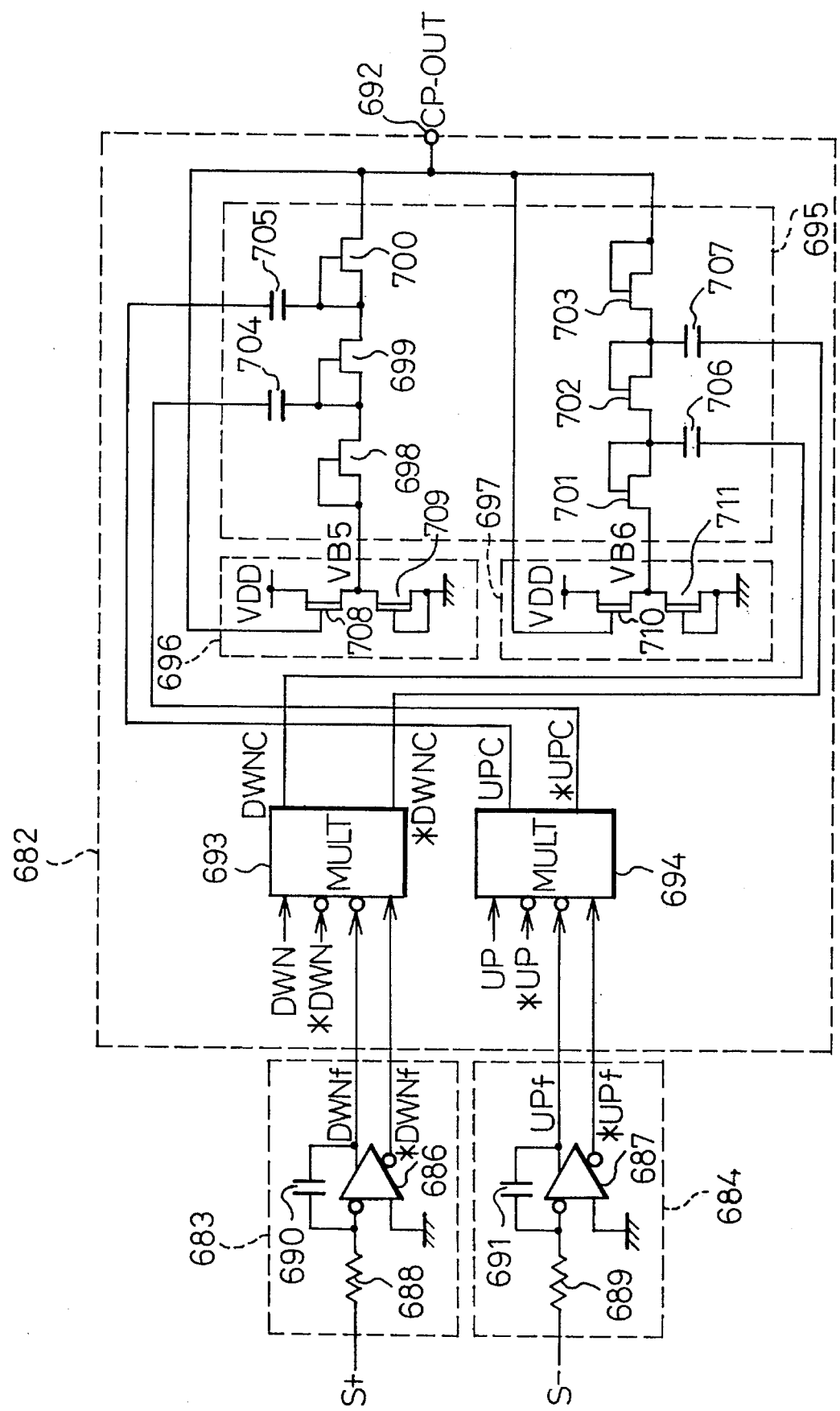
FIG. 66 is a circuit diagram showing low pass filters and a multiplying charge pump shown in FIG. 65.

The low-pass filters 683 and 684, and the multiplying charge pump 682, have the circuitry shown in FIG. 66.

As for the low-pass filters 683 and 684, reference numerals 686 and 687 indicate full-differential amplifiers; 688 and 689 indicate resistors; and 690 and 691 indicate capacitors.

As for the multiplying charge pump 682, reference numeral 692 indicates an output terminal; 683 and 694 indicate multipliers (for example, Gilbert cells); 695 indicates a pump; and 696 and 697 indicate drive voltage generators for supplying drive voltages VB5 and VB6 respectively to the pump 695.

As for the pump 695, reference numerals 698 to 703 indicate enhancement type MOS FETs and 704 to 707 indicate capacitors.

The MOS FET 698 has a gate thereof connected to a drain thereof, and the drain thereof is connected to the output terminal of the driven voltage generator 696. The MOS FET 698 thus serves as a reverse-current prevention element for preventing current from flowing from the source to the drain.

The MOS FETs 699 and 700 are transistors that perform pumping so as to pump current to the output terminal 692. The MOS FET 699 has a drain thereof connected to the source of the MOS FET 698. The MOS FET 700 has a drain thereof connected to the source of the MOS FET 699 and a source thereof connected to the output terminal 692.

The capacitor 704 has one terminal connected to the gate and drain of the MOS FET 699, and inputs an up signal *UPB supplied by the multiplier 694 through the other terminal.

The capacitor 705 has one terminal connected to the gate and drain of the MOS FET 700, and inputs an up signal UPB supplied by the multiplying 694 through the other terminal.

The MOS FETs 701 and 702 are transistors that perform pumping so as to pump charge from the output terminal 692. The MOS FET 701 has a source thereof connected to the output terminal of the drive voltage generator 697. The MOS FET 702 has a source thereof connected to the drain of the MOS FET 701.

The MOS FET 703 has a source thereof connected to the drain of the MOS FET 702, a gate thereof connected to a drain thereof, and the drain thereof connected to the output terminal 692. The MOS FET 703 thus serves as a reverse-current prevention element for preventing current from flowing from the source to the drain.

The capacitor 706 has one terminal connected to the gate and drain of the MOS FET 701, and inputs a down signal DWNB, supplied by the multiplier 693, through the other terminal.

The capacitor 707 has one terminal connected to the gate and drain of the MOS FET 702, and inputs a down signal *DWNB, supplied by the multiplier 693 through, the other terminal.

As for the drive voltage generators 696 and 697, reference numerals 708 to 711 indicate depletion type MOS FETs.

These drive voltage generators 696 and 697 operate so that the drive voltages VB5 and VB6 will have the same value as the voltage CP-OUT at the output terminal 692.

When the Frequency Excess signal S+ is low and the Frequency Short signal S− is low, the down signal DWNf goes high, the down signal *DWNf goes low, the up signal UP goes high, and the up signal *UP goes low. The multiplier 693 becomes inactive relative to the down signal DWNf and down signal *DWNf. The multiplier 694 becomes inactive relative to the up signal UP and up signal *UP.

When the down signal DWN goes high and the down signal *DWN goes low, the down signal DWNB supplied from the multiplier 683 is driven high. The MOS FET 702 performs pumping, whereby current flows from the output terminal 692 to the MOS FET 703.

When the down signal DWN and down signal *DWN go high alternately, the down signal DWNB and down signal *DWNB are driven high alternately. The MOS FETs 701 and 702 perform pumping alternately, whereby current flows from the output terminal 692 to the MOS FET 703.

When the up signal UP goes high and the up signal *UP goes low, the up signal UPB supplied from the multiplier 704 is driven high. The MOS FET 700 performs pumping, whereby current flows from the MOS FET 700 to the output terminal 692.

When the up signals UP and *UP go high alternately, the up signals UPB and *UPB are driven high alternately. The MOS FETs 700 and 699 perform pumping alternately, whereby current flows from the MOS FET 700 to the output terminal 692.

When the frequency excess signal S+ is high and the frequency short signal S− is low, the down signal DWNf goes low, the down signal *DWNf goes high, the up signal UP goes high, and the up signal *UP goes low. The multiplier 693 becomes active relative to the down signal DWNf and down signal *DWNf. The multiplier 694 becomes inactive relative to the up signal UP and up signal *UP.

When the down signal DWN goes high, the down signal DWNf is multiplied by the down signal DWN, and the inverse down signal *DWNf is multiplied by the down signal *DWN. Consequently, a large amount of current flows in from the output terminal 692 to the MOS FET 703.

When the frequency excess signal S+ is low and the frequency short signal S− is high, the down signal DWNf goes high, the down signal *DWNf goes low, the up signal UP goes low, and the up signal *UP goes high. The multiplier 693 becomes inactive relative to the down signal DWNf and down signal *DWNf. The multiplier 694 becomes active relative to the up signals UP and *UP.

When the up signal UP goes high, the up signal UPf is multiplied by the up signals UP and the up signal *UPf is multiplied by the inverse up signal *UP. Consequently, a large amount of current flows from the MOS FET 700 to the output terminal 692.

In the clock reproduction circuit of the seventh embodiment having the foregoing components, with the input of the data signal DATA, the phase detector 304 detects a phase difference between the VCO clock CLK supplied from the voltage controlled oscillator 303 and the data signal DATA. The phase-locked 680 operates so that the phase of the clock CLK is synchronized in phase with the data signal DATA.

The phase-locked loop control circuit 681 detects a phase difference between the clock CLK and data signal DATA, without waiting for a cycle slip, at every transition of the data signal DATA.

Based on the relationship between the quantized phase difference $\Delta\beta_{n-1}$, between the clock CLK and data signal DATA detected at the previous transition of the data signal DATA, and the quantized phase difference $\Delta\beta_n$, between the clock CLK and data signal DATA detected at the current transition of the data signal DATA, a difference between the frequency of the clock CLK and the data frequency of the data signal DATA is detected. The phase-locked loop 680 is then controlled so that the frequency of the clock CLK will become consistent with the bit frequency of the data signal DATA.

When the frequency of the clock CLK is lower than the data frequency of the data signal DATA; that is, when the frequency of the clock CLK falls short of the bit transfer frequency of the data signal DATA, the Frequency Short signal S− is driven high.

As a result, the up signal UPf is driven high and the up signal *UPf is driven low. The output voltage CP-OUT of the multiplying charge pump 682 is raised and the frequency of the clock CLK is raised.

In contrast, when the frequency of the clock CLK is higher than the data frequency of the data signal DATA; that is, when the frequency of the clock CLK exceeds the bit transfer frequency of the data signal DATA, the Frequency Excess signal S+ is driven high.

As a result, the down signal DWNf is driven high and the down signal *DWNf is driven low. The output voltage CP-OUT of the multiplying charge pump 602 is lowered, and the frequency of the clock CLK is lowered.

As mentioned above, in the clock reproduction circuit of the seventh embodiment, a difference between the frequency of the clock CLK and the data frequency of the data signal DATA is detected, without waiting for a cycle slip, so that the frequency of the clock CLK will become consistent with the data frequency of the data signal DATA. The gain of the phase detector 304 need not be raised; that is, the amount of timing jitter will not increase, whereas frequency detection can be speeded up and a speedup of clock reproduction can be achieved.

As described above, using a clock reproduction circuit according to the present invention, a difference between the frequency of a clock CLK and the data frequency of a data signal DATA can be detected, without waiting for a cycle slip, so that the frequency of the clock CLK will become consistent with the data frequency of the data signal DATA. Frequency detection can be speeded up, and eventually speedup of clock reproduction can be achieved. Further, using a phase detector according to the present invention, an output signal of a voltage controlled oscillator latched with an input signal and the input signal are ANDed in order to produce charge pump drive signals. A one-shot pulse generator is unnecessary. Even a high-frequency input signal can therefore be handled properly. Further, when using a charge pump according to the present invention, the pulse duration required for charge pump drive signals is determined by capacitors. This obviates the necessity of using a one-shot pulse produced from an input signal to determine a pulse duration for charge pump drive signals. Even a high-frequency input signal can be handled properly, using a charge pump according to the present invention, when a drive voltage is controlled so that it will have the same value as a voltage developed at an output terminal of the charge pump, and the output impedance can be raised. Eventually, the influence of power-supply noise can be minimized. Using two charge pumps in accordance with the present invention, circuitry enabling complementary drive can be realized. This helps protect an output signal of a voltage controlled oscillator from the influence of power-supply noise.

In the embodiments described above, outputs from the phase detected (PD) and the frequency error detection circuit are applied to the loop filter via the charge pump. Further, in the conventional clock reproduction circuit using the PLL, the output of the phase detector is also applied to the loop filter via the charge pump. However, as described with reference to FIG. 5, there is a problem that the output of the charge pump cannot have a full swing due to parasitic inductance. Next, an embodiment in which this problem is solved will be described.

Figure 67:
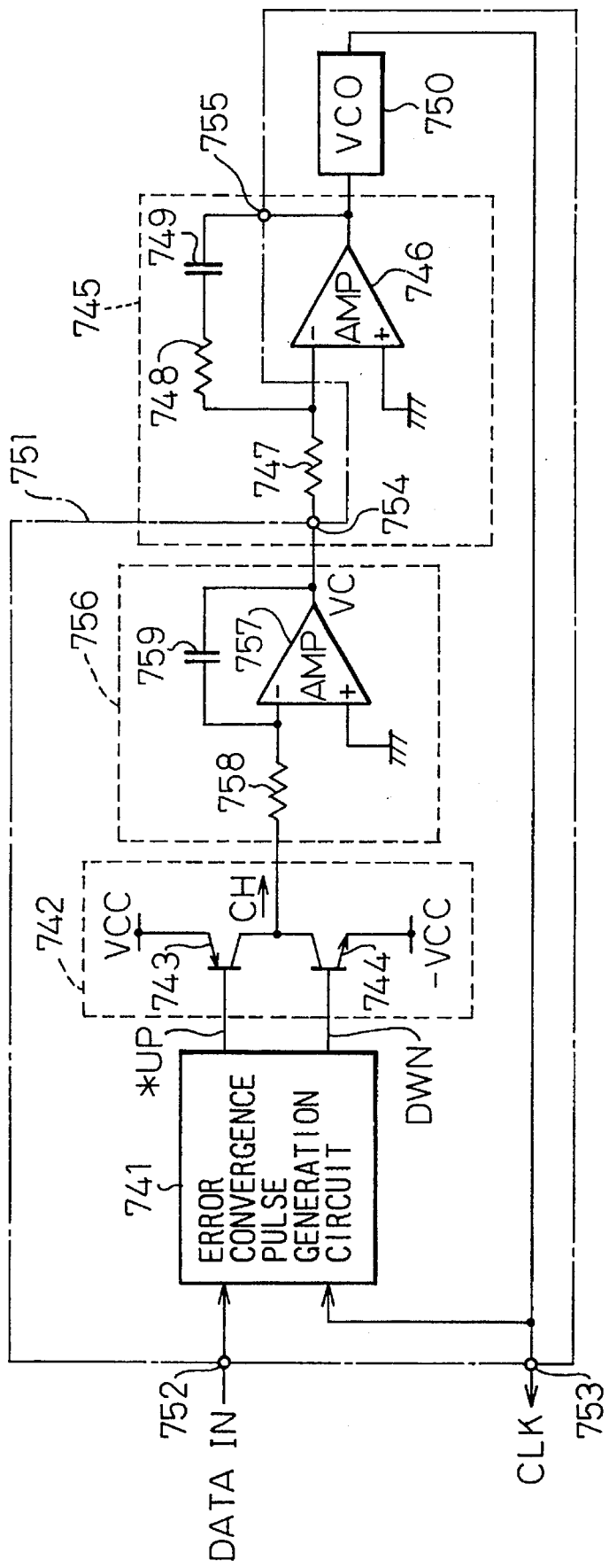
FIG. 67 is a circuit diagram showing a clock reproduction circuit of a eighth embodiment.

FIG. 67 shows a clock reproduction circuit of an eighth embodiment. This clock reproduction circuit has a constitution shown in FIG. 5, however, it differs from the conventional clock reproduction circuit in a point that an integrating circuit 756 is connected between an output terminal of a charge pump 742 and an external terminal 754 of a semiconductor integrated circuit 751. Therefore, explanations regarding the error convergence pulse generator 741, the charge pump 742, an operational amplifier 746 and the voltage controlled oscillator (VCO) 750 are omitted.

The integrating circuit 756 is a known active CR integrating circuit which includes an operational amplifier 757 having the noninverting input terminal thereof grounded, a resistor 758 connected between an inverting input terminal of the operational amplifier 757 and the output terminal of the integrating circuit, and a capacitor 759 connected between the inverting input terminal of the operational amplifier 757 and an output terminal of the integrating circuit. The output terminal of the operational amplifier 757 is connected to the external terminal 754. The resistor 758 is designed to limit current and has a resistance of, for example, 10 k ohms. The capacitor 759 can store only a small quantity of charge and has a capacitance of, for example, 1 pF. In contrast, the capacitor 749 has a relatively large capacitance of, for example, 0.1 uF.

The error convergence pulse generator 741 falls into two types: a type whose output pulses have a certain duration and which controls error convergence on the basis of the number of pulses; and a type that controls error convergence on the basis of the pulse duration. For example, the error convergence pulse generator 741 may be a phase detector (PD), a frequency error detector, or a phase frequency detector (PFD).

The error convergence pulse generator 741, the charge pump 742 and the integrating circuit 756 constitute an error detector.

FIG. 68 shows output signals *UP and DWN of the error convergence pulse generator 741, output charge CH of the charge pump 742, and an output voltage VO of the integrating circuit 756. In this example, the signals *UP and DWN have constant pulse durations. In response to one up pulse *UP, the charge CH is stored in the capacitor 759 via an pnp transistor 743 and the resistor 758 from the power supply line VCC. Thus, the quantity of charge increases by a value q. This causes the voltage V0 to fall. Since the loop filter 745 has an inverting output terminal, the input voltage of the voltage controlled oscillator 750 rises with the fall of the voltage V0. Eventually, the output frequency of the voltage controlled oscillator 750 rises. Likewise, in response to one down pulse DWN, the charge CH is lost from the capacitor 759 to the power supply line−VCC via the resistor 758 and an npn transistor 744. An operation reverse to the foregoing operation is carried out.

With the foregoing operation, an error in the frequency or the phase of a VCO clock CLK relative to a data signal DATA is converged to a given frequency or a certain value (0 or π/2). For adjusting the quantity of charge CH proportionally to a pulse duration, the output of the charge pump 742 undergoes a full swing between the voltages of the power supply lines VCC and −VCC.

The charge CH has a pulsating wave and contains high-frequency components unnecessary for a phase-locked loop. The charge CH is therefore integrated by the integrating circuit 756, whereby the unnecessary components are removed and necessary information alone is supplied by the integrating circuit 756. The influence of parasitic inductance and capacitance existent at the external terminal 754 is therefore minimized. Even if the fequency of the data signal DATA (the data frequency) is as high as 1 Gbps or the like, distortion of the wave supplied to the external terminal 754 can be drastically reduced.

FIG. 69 shows a phase error detector of the ninth embodiment that is substituted for the error convergence pulse generator 741, charge pump 742, and integrating circuit 756 shown in FIG. 67.

The error convergence pulse generator 756 is a known exclusive OR gate. A VCO clock CLK and a return-to-zero (hereinafter, RZ) signal DATA are applied to one terminal and the other terminal of the error convergence pulse generator 756. 757 indicates an equivalent resistor in the output circuit of the error convergence pulse generator 756. The resistor 757 plays the role of the resistor 758 in FIG. 67. The integrating circuit 758 does not therefore have the resistor 758.

FIG. 70 shows waveforms of the RZ signal DATA, the VCO clock CLK, the output charge UD of the exclusive OR gate 756 and the output voltage V0 of the integrating circuit 758. The charge UD has pulses that appear alternately above and below a zero line. When an error in phase relative to the data signal DATA; that is, $\Delta E$ provided according to the formula $\pi/2+\Delta E$, is negative as shown in FIG. 70, the voltage V0 resulting from the integration of the charge UD by the integrating circuit 758 falls. This causes the output of the loop filter 745 shown in FIG. 67 to increase. The $\Delta E$ value then converges on zero. When the error in phase, $\Delta E$, is positive, the voltage V0 rises and $\Delta E$ value again converges on zero.

In the output stage of the exclusive OR gate 756, similarly to that in the charge pump 742 shown in FIG. 67, a full swing occurs between the voltages of the power supply lines, charge is emitted in proportional to a positive pulse duration, and charge is absorbed in a quantity proportional to a negative pulse duration. Thus, the output stage serves as a charge pump. The exclusive OR gate 756 may be said to consist of an exclusive OR gate excluding the output stage and a charge pump realized in the output stage.

FIG. 71 shows a phase error detector of the tenth embodiment that is substituted for the error convergence pulse generator 741, the charge pump 742 and the integrating circuit 756 shown in FIG. 67.

The pulse convergence generator 761 is a known Hogge's circuit, wherein D flip-flops 762 and 763 are connected in series, two input terminals of each of exclusive OR gates 766 and 767 are connected to a data input terminal D and a positive-phase output terminal Q of each of the D flip-flops 762 and 763.

The NRZ signal DATA is applied to the data terminal D of the D flip-flop 762. The VCO clock CLK is applied to a clock input terminal CK of the D flip-flop 762. A VCO clock *CLK that is in inverse relation to the VCO clock CLK and is active low is applied to a clock input terminals CK of the D flip-flop 763.

The output of the exclusive OR gate 766 contains phase error information. When a trailing part of a pulse included in a densely-pulsated portion of the data signal DATA overlaps an adjoining pulse, the trailing edge of the pulse of the data signal DATA is considered to have shifted along a time axis. This causes a phase jitter in the VCO clock CLK. To reduce the occurrence of the phase jitter, only the output of the gate 767 is employed.

An adder 773 is connected between the output terminal of the error convergence pulse generator 761 and an input terminal of an integrating circuit 770. The adder 773 includes diodes 774 and 775 for causing current to flow unidirectionally, and resistors 778 and 779 for adding charge. The resistances of the resistors 778 and 779 have the same value. The resistors 778 and 779 in the adder 773 play the role of the resistor 758 in FIG. 67. The integrating circuit 770 therefore has no resistor.

FIG. 72 shows the operation of the phase error detector having the aforesaid circuit elements. In FIG. 72, Q1 and Q2 indicate outputs of the D flip-flops 762 and 763. V1 and V2 indicate outputs of the gates 766 and 767.

The outputs of the gates 766 and 767 have, similarly to the outputs of the charge pump 742 in FIG. 67, a full swing between the voltages of the power supply lines. Charge is emitted from or absorbed by the adder 773 in a quantity proportional to the differences between the positive pulse duration of the output of the exclusive OR gate 766 and the negative pulse duration of the output of the exclusive OR gate 767.

The output stages of the gates 766 and 767 and the adder 773 constitute a charge pump. The circuitry shown in FIG. 71 may be said to consist of an error convergence pulse generator excluding the output stages of the gates 766 and 767 in the error convergence pulse generator 761, a charge pump, and the integrating circuit 770, which are connected in tandem.

Figure 73:
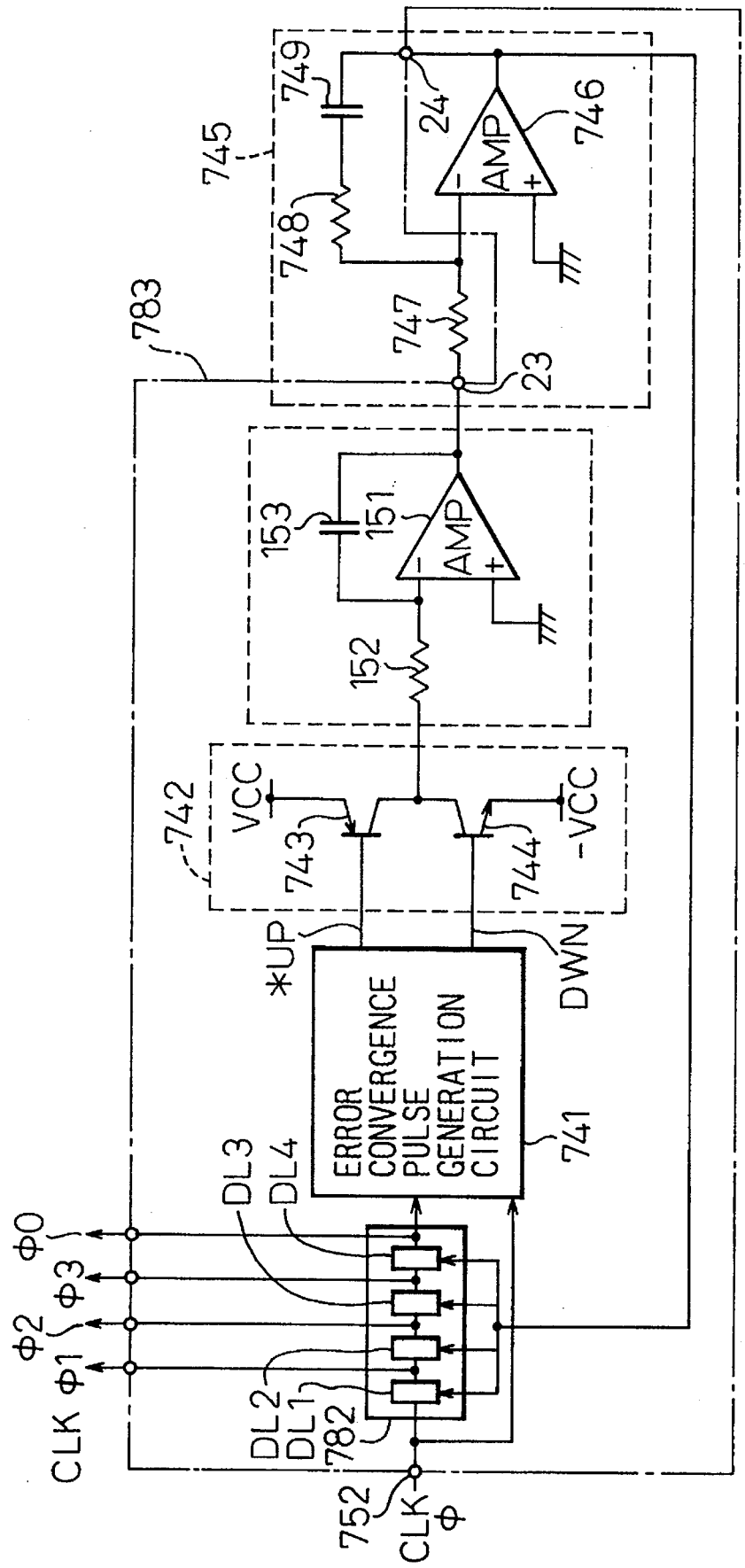
FIG. 73 is a circuit diagram showing a delay locked circuit of the eleventh embodiment.

FIG. 73 shows a delay locking circuit of the eleventh embodiment.

The delay locking circuit is a delay-locked loop in which a four-step delay circuit 782 is used instead of the voltage controlled oscillator (VCO) 750 in FIG. 67. The delay locking circuit produces a plurality of clocks $\phi 0$ to $\phi 3$ which are phase shifted by certain values relative to an input clock $\phi$.

Similarly to the circuitry in FIG. 67, the circuitry in FIG. 73 comprises known circuit elements except that the integrating circuit 756 is connected between the output terminal of the charge pump 742 and the external terminal 754. 783 indicates a semiconductor integrated circuit.

The delay times set for delay circuits DL1 to DL4 in the four-step delay circuit 782 are controlled according to the output of the loop filter 745. The phase difference between the input clock $\phi 0$ of the delay circuit DL1 and an output clock $\phi 0$ of the delay circuit DL converges to $2\pi$.

FIG. 74 shows output clocks $\phi 1$ to $\phi 3$ and $\phi 0$ of the delay lines DL1 to DL4 which are shifted relative to the input clock $\phi 0$ and of which the errors in phase converge to zero.

Figure 75:
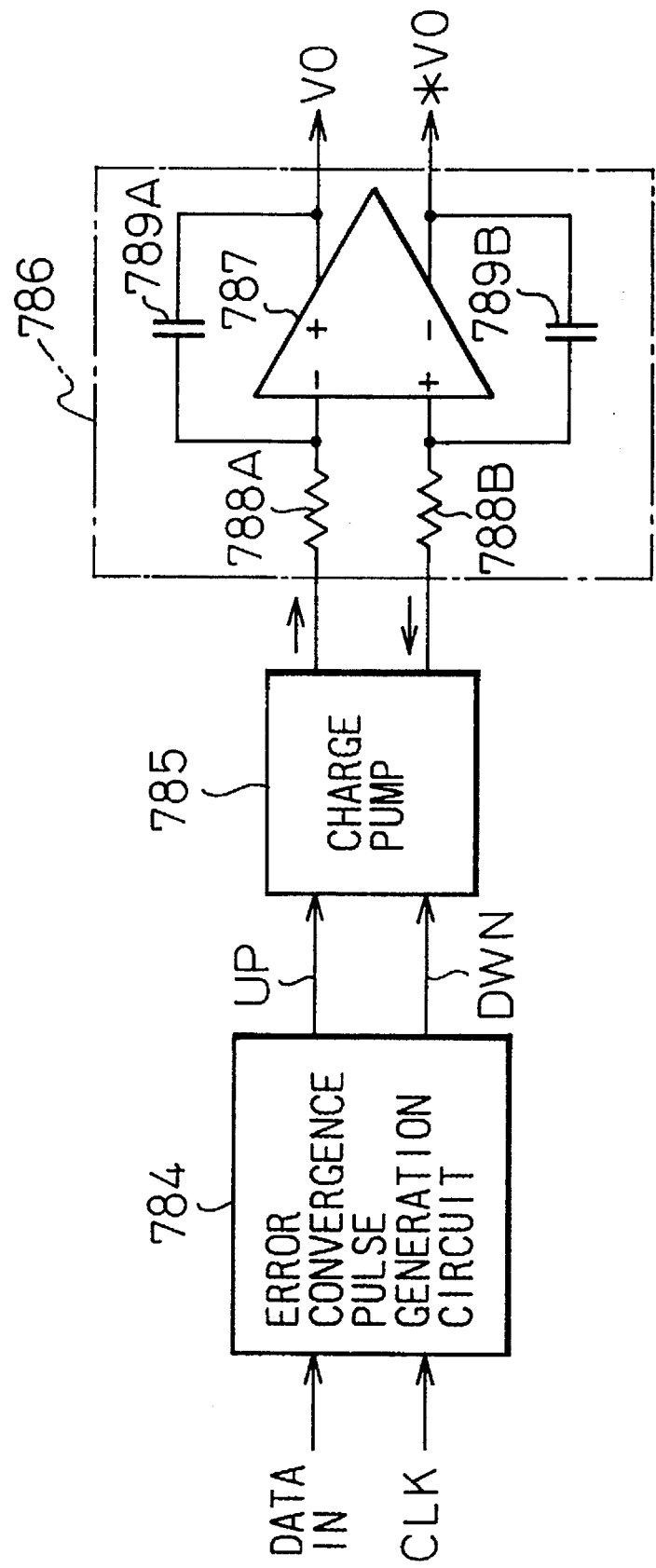
FIG. 75 is a circuit diagram showing an error detector of the twelfth embodiment.

FIG. 75 shows an error detector of the twelfth embodiment to be employed in a phase-locked loop or a delay-locked loop.

The error detector includes a complementary input/output type integrating circuit 786 and a complementary output type charge pump 785 for the sake of quicker operation. A capacitor 789A is connected between an inverting input terminal of a complementary input/output type operational amplifier 787A and a noninverting output terminal thereof. A capacitor 789B is connected between a noninverting input terminal of the complementary input/output type operational amplifier 787A and an inverting output terminal thereof. The inverting and noninverting input terminals are connected to complementary output terminals of a charge pump 785 via resistors 788A and 788B.

An up pulse UP and a down pulse DWN that are supplied from an error convergence pulse generator 784 have constant pulse durations. Output voltages V0 and *V0 of the integrating circuit 786 initially have the same value, for example, zero. In response to one up pulse UP sent from the error convergence pulse generator 784, the charge pump 785 ejects or absorbs a certain quantity of charge q that moves in the directions of the arrows in FIG. 75 through the complementary output terminals thereof. This causes the output voltage V0 of the integrating circuit 786 to fall by a value V and the output voltage *V0 to rise by the value V. In response to one down pulse DWN, the reverse of the above operation is carried out.

For employing the error detector having the foregoing components in the circuitry shown in FIG. 67 or 73, the loop filter 745 must be a complementary input type. Various modifications are also possible. For example, in FIG. 67 or 73, a constant current source may be connected between the emitter of the pnp transistor 743 and the power supply line VCC and between the emitter of the npn transistor 744 and the power supply line −VCC, so that input and output currents of the charge pump will have constant values. In this variant, the resistor 758 in the integrating circuit 756 becomes unnecessary.

A variety of known phase error detectors or error convergence pulse generators included in frequency error detectors can be used as the error convergence pulse generator 741.

The voltage controlled oscillator 750 may be a discrete semiconductor integrated circuit. The whole of the loop filter 745 may be incorporated in a semiconductor integrated circuit in order to realize a compact design.

As described so far, in an error detector in accordance with the present invention, the output of a charge pump is integrated by an integrating circuit. Unnecessary high-frequency signal components are therefore removed to provide only the necessary information. Even if an output of the integrating circuit contains parasitic capacitance or inductance, the influence of the parasitic capacitance or inductance becomes negligible. A signal for use in converging an error in frequency or phase can be provided reliably despite a high transmission rate.

As for a clock reproducer or delay locking circuit using the above error detector, even when parasitic capacitance on an output line of a charge pump becomes critical because of an external circuit connected to a loop filter or a high transmission rate, the clock reproducer or delay locking circuit can operate at a high transmission rate for the aforesaid reasons.

Figure 76:
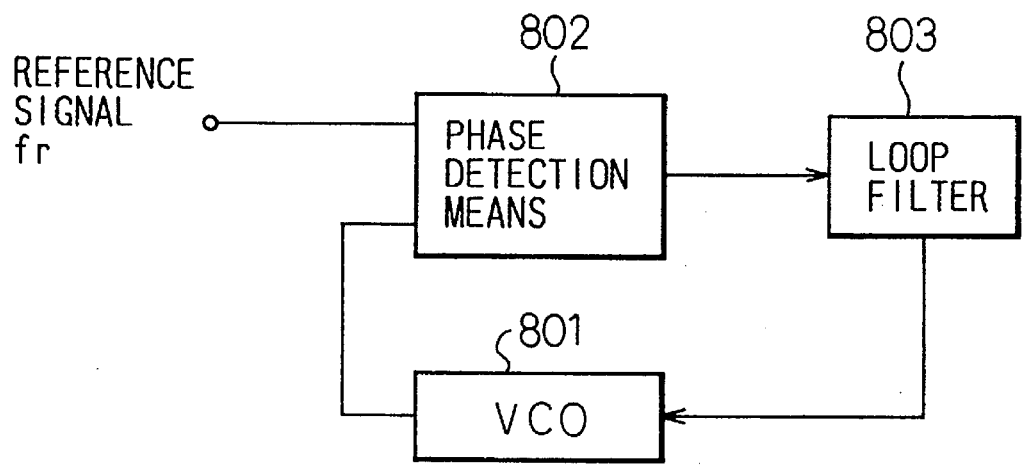
FIG. 76 is a diagram showing a principle constitution of a frequency synchronizing circuit of the thirteenth embodiment.

Next, another type of clock reproduction circuit, according to the present invention will be described. This type clock of reproduction circuit has a new frequency synchronizing circuit. FIG. 76 is a block diagram showing a principle of a frequency synchronizing circuit of the present invention, FIG. 76 shows a fundamental constitution of the circuit, and FIG. 77 shows a feedback characteristic of the circuit.

In FIG. 76, reference numeral 801 indicates a voltage controlled oscillator which can change its oscillation frequency (VCO frequency) according to applied voltage, 802 indicates a reference phase detection means which compares the VCO clock output from the voltage controlled oscillator 801 with a first reference clock signal fr and outputs a signal corresponding to the difference between them, and 803 indicates a low pass filter which deletes the high frequency components from the output signal of the reference phase detection means 802. By feeding back the output of the low pass filter 803 to the voltage controlled oscillator 801, the VCO clock is made to synchronize with the first reference clock fr. This feedback loop of the frequency synchronizing circuit has the characteristic that it does not change the VCO frequency within a predetermined phase error range including a zero point of the phase error, and operates to make the VCO frequency agree with the frequency of the first reference clock fr outside the above range.

Figure 77:
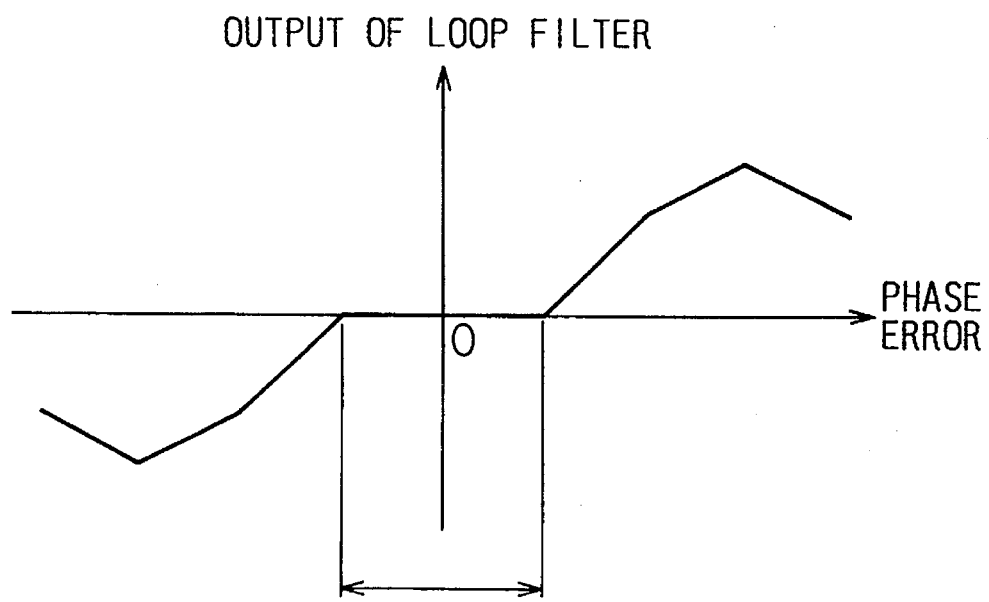
FIG. 77 is a diagram showing a fundamental characteristic of the frequency synchronizing circuit of the thirteenth embodiment.

The feedback loop of the frequency synchronizing circuit of the present invention has a characteristic shown in FIG. 77. As shown in the figure, within the range, indicated by an arrow, including a zero point of the phase error, the output voltage of the low pass filter 803, namely, the feedback voltage to the VCO 801, does not change the VCO frequency. Therefore, the VCO frequency does not change. For example, this range is from +π to −π. When frequencies of the VCO clock and the first reference clock agree with each other and only the phases are different, the phase error is within the range indicated by the arrow because the phase error is constant. Therefore, the VCO clock does not change its frequency. When the frequencies are different, the phase error gradually increases although the phases agree with each other at the start. When the phase error exceeds the range indicated by the arrow, the feedback loop operates, therefore, the frequencies are made to agree.

Next, explanations for making a clock reproduction circuit for reproducing a clock which is synchronous with a second reference clock will be described. A frequency of the second reference clock is different from that of the first reference clock to a certain extent and the phase of the second reference clock is not fixed. The clock reproduction circuit can be constituted by combining a second loop with the frequency synchronizing circuit of the present invention so that the second loop detects the phase error between the second reference clock and a VCO clock or a divided VCO clock of the VCO 801 of frequency synchronizing circuit of the present invention. In the clock reproduction circuit, the problems of the conventional clock reproduction circuit of FIG. 6, due to the switching, do not occur because the VCO clock of the VCO 801 is always fed back so that its frequency agrees with that of the first reference clock fr.

Figure 78:
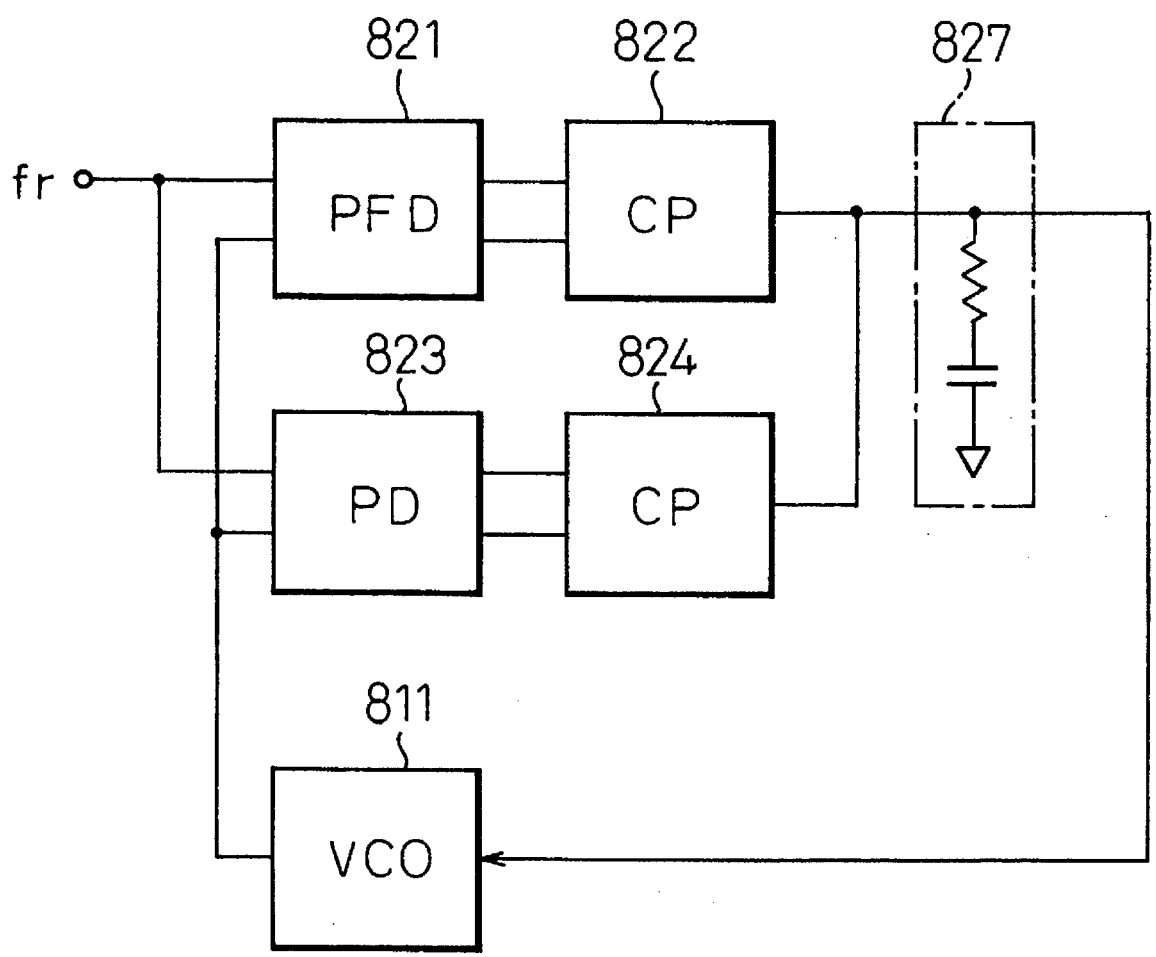
FIG. 78 is a block diagram showing a total constitution of a frequency synchronizing circuit of the thirteenth embodiment.

FIG. 78 is a block diagram showing the constitution of a frequency synchronizing circuit of the twelfth embodiment.

In FIG. 78, reference numeral 811 indicates a VCO; 821 indicates a digital type phase frequency comparator (PFD: Phase Frequency Detector); 822 indicates a PFD charge pump which converts the outputs of PFD 821 into a charge signal and a discharge signal output to a low pass filter 831; 823 indicates digital-type phase comparator (PD: Phase Detector); 824 indicates a PD charge pump which converts the outputs of PD 823 into a charge and discharge signal output to the low pass filter 831; and 831 indicates a low pass filter. As shown in figure, the low pass filter 831 is constituted by a resistor and a capacitor.

Figure 79:
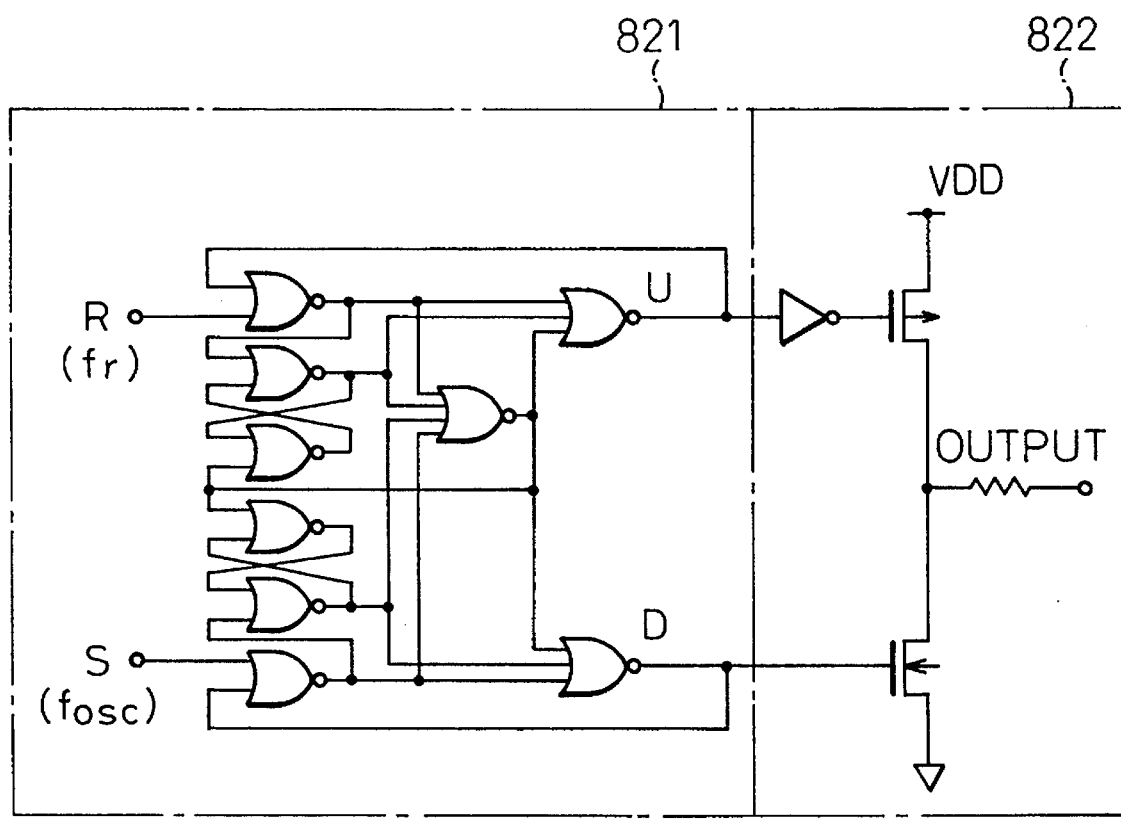
FIG. 79 is a circuit diagram of a phase frequency detector (PFD), and a charge pump for the same, shown in FIG. 78.
Figure 80:
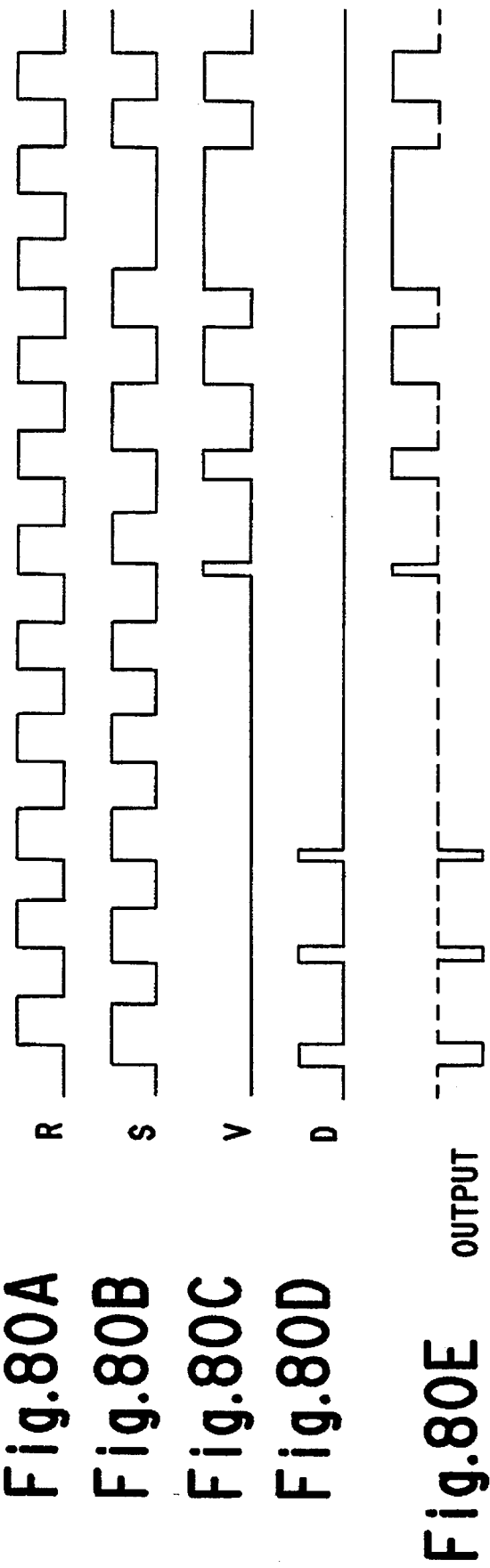
FIG. 80 is a time chart for explaining the operations of the PFD and the charge pump shown in FIG. 79.

FIG. 79 is a diagram showing the circuit constitution of the PFD 821 and the PFD charge pump 822, and FIG. 80 is a time chart showing the operations. In normal PLL technology, the PFD shown in FIG. 79 is called a phase comparator. However, in this specification, the phase frequency comparator (PFD) and the phase comparator (PD) are distinguished. The PFD shown in FIG. 79 is well known, therefore, a detailed description of the PFD is omitted. The PFD outputs-phase positive or negative-phase signals on terminals U and D according to whether or not a phase of an input S is in advance of that of an input R. When the phase of the input S advances to that of the input R, pulses are output at the terminal D. When the phase of the input S is delayed to that of the input R, pulses are output at the U terminal. The widths of these pulses change according to the value of the phase difference. The circuit shown in FIG. 79 is a sequence circuit, therefore, the states of the terminals U and D cannot be determined by the levels of the inputs R and S, namely, they are influenced by the previous states. The pulse on the terminal U is inverted by an inverter, then, the inverted pulse is applied to a gate of a P-channel transistor of the charge pump 82. When the pulse is applied, the P-channel transistor turns on and becomes conductive. In this way, the potential on an output terminal of the charge pump is charged up from a high potential terminal of a source via a resistor during a period of the pulse. The pulse on the terminal D is applied to the gate of a N-channel transistor of the charge pump 824. When the pulse is applied, the P-channel transistor turns on and becomes conductive. In this way, the potential of an output terminal of the charge pump is discharged to the low potential terminal of a source via a resistor during the period of the pulse. Namely, the charge and discharge to the low pass filter 831 is performed according to the phase difference, and the output of the low pass filter is fed back to the VCO 811 so that the phase difference becomes zero. In this circuit, the reference clock fr is input to the input terminal R and the VCO clock from the VCO 801 is input to the input terminal S. Therefore, a pulse is output on the terminal D to perform the charge-up when the phase of the VCO clock advances to that of the reference signal fr, and a pulse is output on the terminal U to perform the discharge when the phase of the VCO clock is delayed to that of the reference signal fr.

Figure 81:
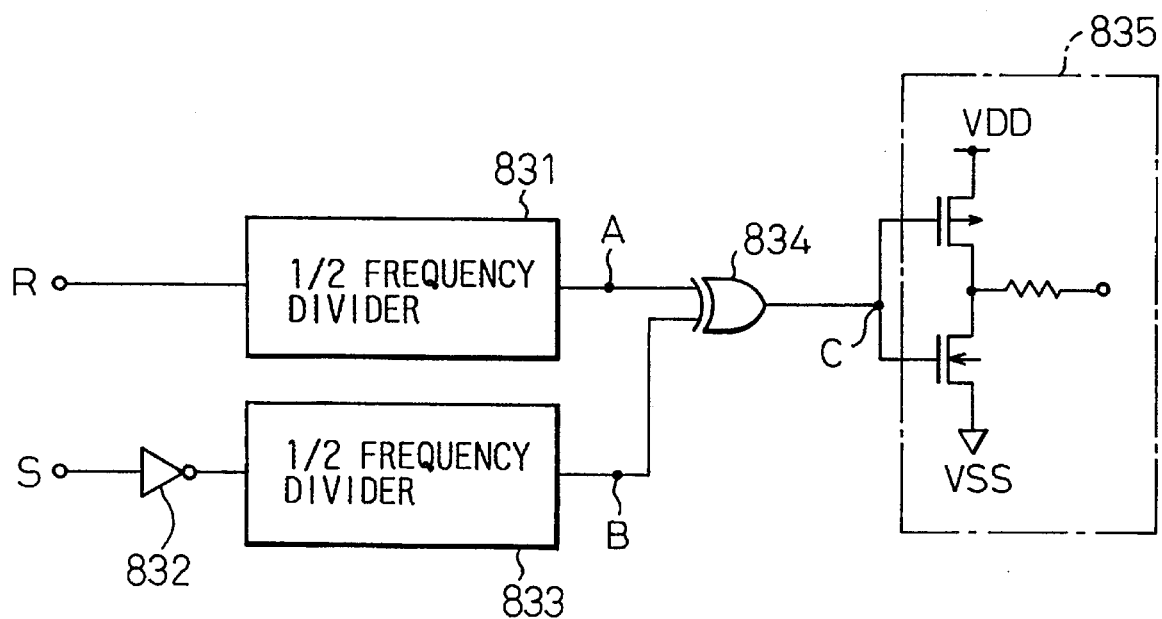
FIG. 81 is a circuit diagram of a phase comparator (PD) and a charge pump for the same shown in FIG. 78.
Figures 82A, 82B, 82C, 82D, 82E:
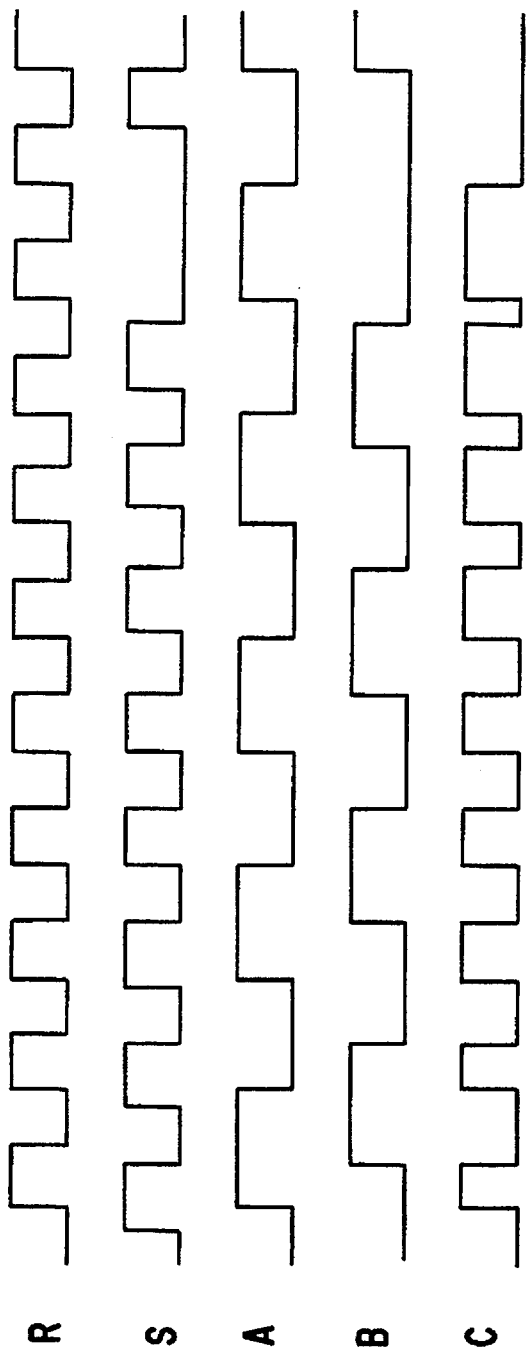
FIG. 82 is a diagram for explaining operations of the PD and the charge pump shown in FIG. 81.

FIG. 81 is a diagram showing circuit constitutions of the PD 823 and the PD charge pump 824, and FIG. 82 is a time chart showing operations of them.

In the circuit shown in FIG. 81, a signal input to an input terminal R is divided by a ½ frequency divider 831 and is input to an Exclusive OR (EXOR) gate 834. A signal input to an input terminal S is inverted by an inverter 832 and is divided by a ½ frequency divider 833, then, is input to the EXOR gate 834. As shown in FIG. 82, an output of the EXOR gate 834 has the same durations of high and low levels when the phases agree, the low level duration becomes larger than the high level duration when the phase of the signal input to the input terminal S advances to that of the input terminal R, and the high level duration becomes larger than the low level duration when the phase of the signal input to the input terminal S delays to that of the input terminal R. The output of the EXOR gate 834 is applied to gates of a p-channel transistor and an n-channel transistor consisting of a CMOS inverter gate. In this way, when the output of the EXOR gate 834 is low, the p-channel transistor becomes conductive, and the potential of an output terminal of the charge pump is charged up from a high potential terminal of the source, via a resistor, during a period of the pulse. In this way, when the output of the EXOR gate 834 is high, the n-channel transistor becomes conductive, and the potential of an output terminal of the charge pump is discharged to the low potential terminal of the source via a resistor during the period of the pulse. Namely, the charge and discharge to the low pass filter 827 is performed according to the phase difference, and the output of the low pass filter is fed back to the VCO 811 so that the phase difference becomes zero. This circuit is also a sequence circuit, therefore, the output state is influenced by the directly previous state. In this circuit, the reference clock fr is input to the input terminal R and the VCO clock output from the VCO 811 is input to the input terminal S. Therefore, when the phase of the VCO clock advances to the reference clock fr, the p-channel transistor becomes conductive and the charge-up operation is performed. When the phase of the VCO clock is delayed to the reference clock fr, the n-channel transistor becomes conductive and the discharge operation is performed.

It is important that relating to the phase difference, the first feedback loop consisting of the PFD 821 and the PFD charge pump 822 has the opposite feedback direction to that of the second feedback loop lo consisting of the PD 823 and the PFD charge pump 824. Further, the gains of the two feedback loops are set to be equal within a range from $-\pi$ to $+\pi$. This will be described later.

Figure 83:
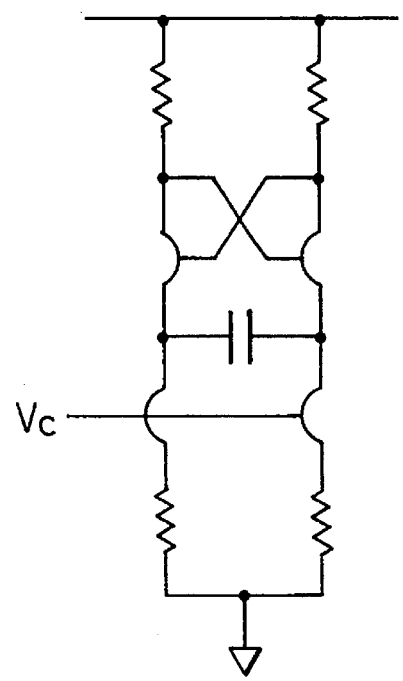
FIG. 83 is a circuit diagram of the voltage controlled oscillator (VCO) shown in FIG. 78.

FIG. 83 is a diagram showing a circuit constitution of the VCO 811.

The VCO 811 shown in FIG. 83 is an oscillator consisting of MES transistors. In this circuit, two MES transistors mutually become conductive, charging and discharging of a capacitor element are repeated, and the circuit oscillates. By changing a gate voltage Vc of the MES transistor connected to low potential terminal of the source, the VCO frequency changes because a time constant of the charge and discharge of the capacitor element changes. In this circuit, the VCO frequency increases when the voltage Vc increases, and the VCO frequency decreases when the voltage Vc decreases.

Each element of the frequency synchronizing circuit of the first embodiment shown in FIG. 78 was described above. The feedback loop of the circuit will be described with reference to FIG. 84.

Figure 84:
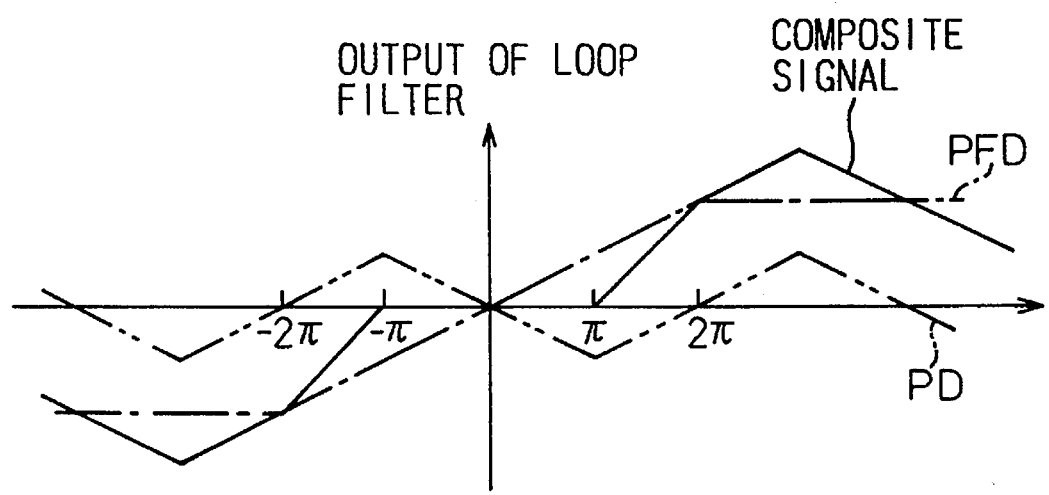
FIG. 84 is a diagram showing an output characteristic related to the phase difference of the frequency synchronizing circuit of the thirteenth embodiment.

FIG. 84 is a diagram showing output voltage characyeristics of the low pass filter 835 relative to the phase difference.

In FIG. 84, a dashed line indicates a phase difference output characteristic of the first feedback loop consisting of the PFD 821 and the PFD charge pump 822; and a two dot chain line indicates a phase difference output characteristic of the first feedback loop consisting of the PD 823 and the PD charge pump 824. As described above, the gains of the two feedback loops are same and the direction of them are opposite. Therefore, as shown in FIG. 78, when the outputs of the PFD charge pump 822 and the PD charge pump 824 are connected and input to the low pass filter 827, the synthesize phase difference output characteristic indicated by a continuous line is obtained. Namely, within a phase difference range from $-\pi$ to $+\pi$, the outputs of the two feedback loops cancel with each other, and the output voltage of the low pass filter is held constant although the phase difference exists. Further, the output voltage of the low pass filter changes according to the phase difference out of the phase difference range from $-\pi$ to $+\pi$, however, the output voltage of the low pass filter does not cross a center level when the phase difference is in either an advanced state or a delayed state.

Since the total feedback loop has a above-mentioned characteristic, the feedback loop operates to converge the frequencies of the two clocks when the phase difference gradually increases. However, when the frequencies of the two clocks are same, the phase difference does not exceed $-\pi$ or $+\pi$. Therefore, the feedback loop does not operate although a phase difference exists.

The frequency synchronizing circuit of the twelfth embodiment was described above. In the following, an embodiment of a clock reproduction circuit which reproduces a clock from a data signal by using the frequency synchronizing circuit will be described.

Figure 85:
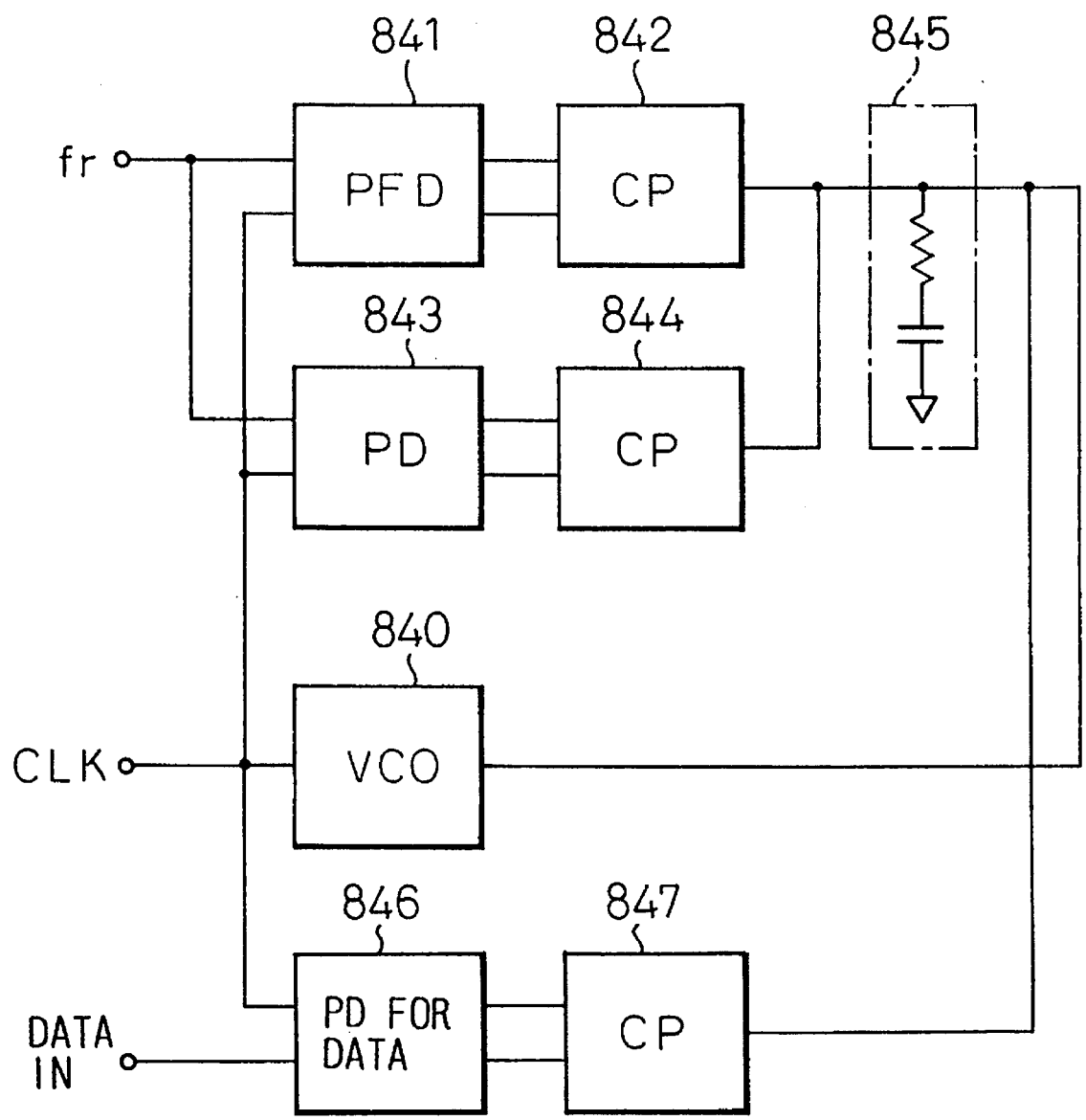
FIG. 85 is a block diagram showing a constitution of a clock reproduction circuit of fourteenth embodiment.

FIG. 85 is a diagram showing a constitution of a clock reproduction circuit of the thirteenth embodiment.

In FIG. 85, reference numeral 840 indicates a VCO; 845 indicates a low pass filter; 841 indicates a PFD; 842 indicates a PFD charge pump; 843 indicates a PD; and 844 indicates a PD charge pump. These elements are same to those of the frequency synchronizing circuit shown in FIG. 78. The clock reproduction circuit of the embodiment further includes a data signal phase detector (PD) 846 and a data signal charge pump 847.

Figure 86:
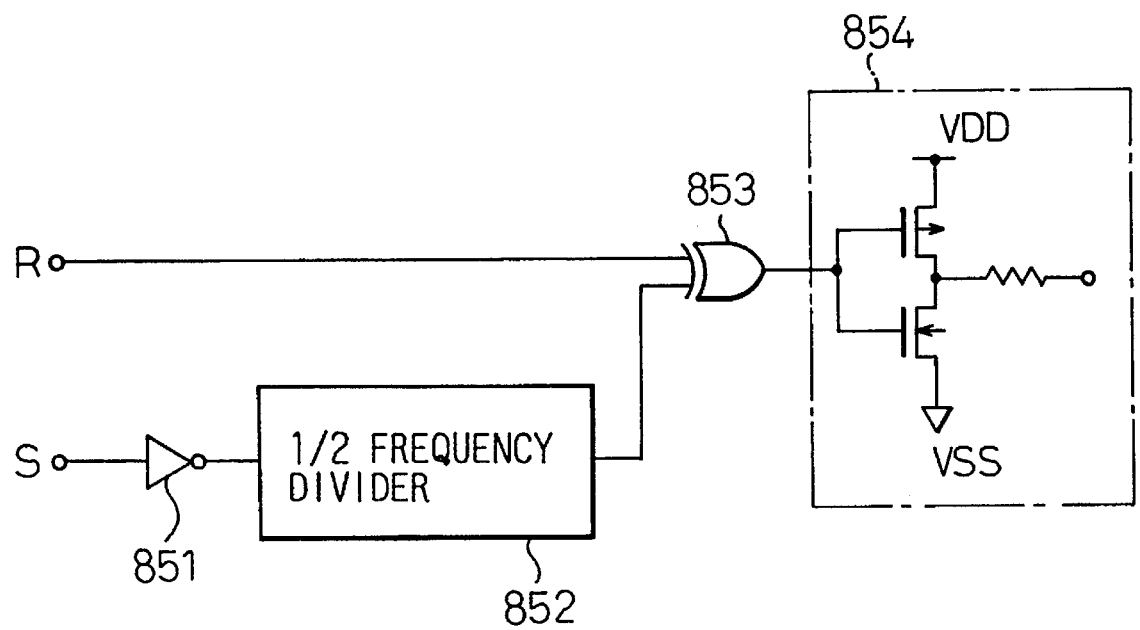
FIG. 86 is a circuit diagram of a data signal PD and a charge pump for the same, shown in FIG. 85.

FIG. 86 is a diagram showing circuits of the data signal PD 846 and the data signal charge pump 847.

By comparing FIG. 81 with FIG. 86, it is apparent that the circuit shown in FIG. 86 is similar to the circuit shown in FIG. 81. However, it is different in that the ½ frequency divider 831 is omitted. In this circuit, a VCO clock output from the VCO 840 is compared with the data signal. The data signal is a NRZ signal, therefore, the cycle period of the data signal is equal to twice the cycle period of the data clock. Therefore, it is unnecessary to divide the data signal input to the input terminal R. Consequently, the ½ frequency divider 831 is omitted.

Further, in the circuit shown in FIG. 86, an EXOR gate 853 is used. An Exclusive NOR (EXNOR) gate can be used.

Alternatively, in the circuit shown in FIG. 85, a clock output from the VCO 840 is controlled to synchronize with the reference clock fr by the frequency synchronizing circuit consisting of the PFD 841, the PFD charge pump 842, the PD 843, the PD charge pump 844 and the low pass filter 845 and, then, the clock is controlled so that the frequency of the clock agrees with the data clock included in the data signal by the loop consisting of the data signal PD 846, the data signal charge pump 847, and the low pass filter 845. In this way, the problem of the conventional clock reproduction circuit shown in FIG. 82, that a comparatively long time is necessary to synchronize the VCO clock with the data signal after the loop switching, is avoided.

Figure 87:
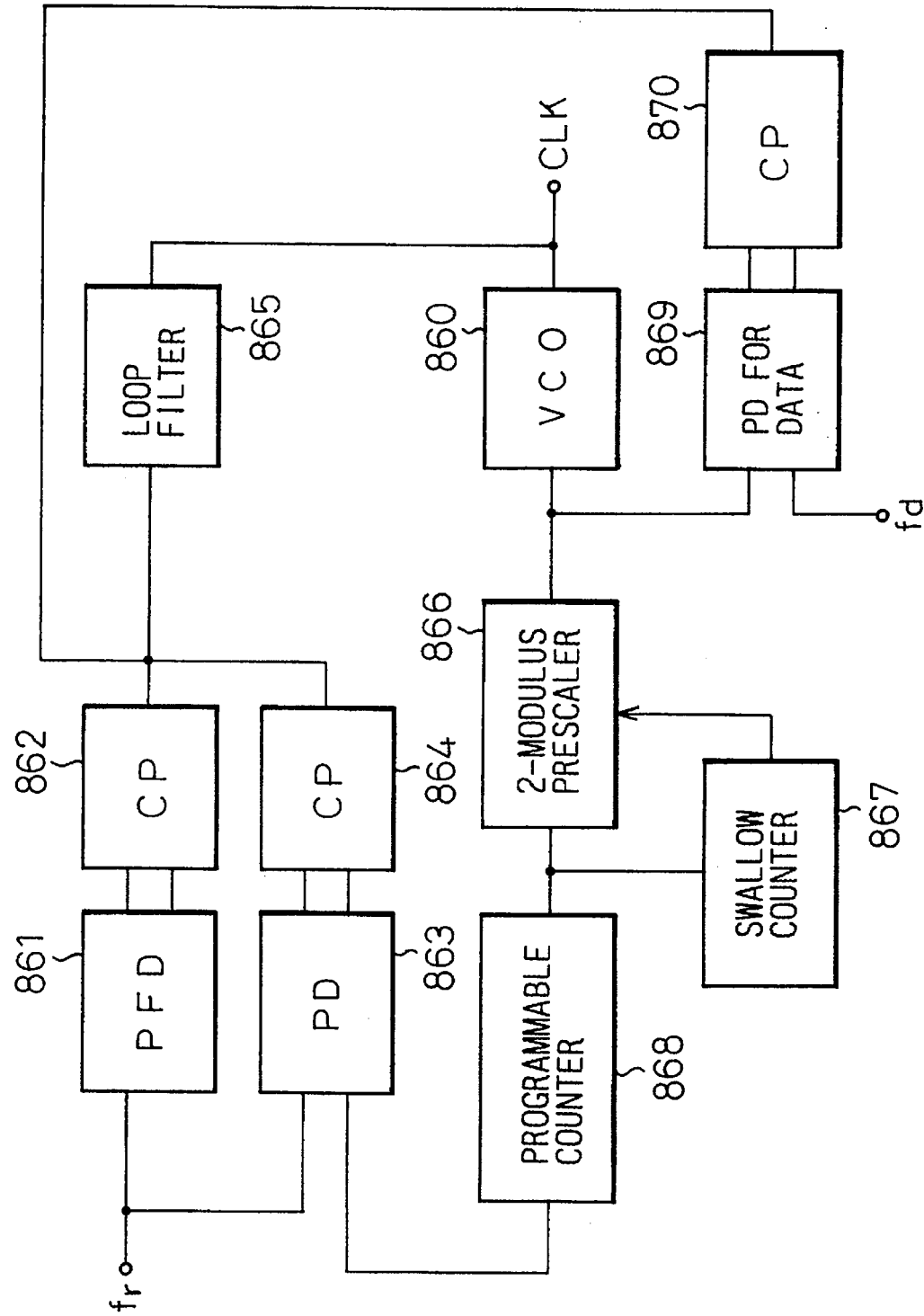
FIG. 87 is a diagram showing a constitution of a clock reproduction circuit of the fifteenth embodiment.

FIG. 87 is a block diagram showing a constitution of a clock reproduction circuit of a fourteenth embodiment. In the present embodiment, the present invention is applied to a frequency synthesizer.

In FIG. 87, reference numeral 860 indicates a VCO, 865 indicates a low pass filter, 861 indicates a PFD, 862 indicates a PFD charge pump, 863 indicates a PD, 864 indicates a PD charge pump, 869 indicates a data signal phase detector (PD) and 870 indicates a data signal charge pump. These elements are same to those of the second embodiment shown in FIG. 85. In the present embodiment, a 2-modulous prescaler 866 which divides the clock, a swallow counter 867 and a programmable counter 868 are further included.

The response speed of the PFD 861 is slow. Therefore, when the clock output from the VCO 860 has a very high frequency, the detection of the phase difference between the reference clock and the clock is difficult. In order to solve this problem, the clock is divided into 1/N frequency and the reference clock is also divided into 1/N frequency. The portion consisting of the 2-modulous prescaler 866, the swallow counter 867 and the programmable counter 868 divides the clock by N. The divisional ratio N can be optionally determined.

Figure 88:
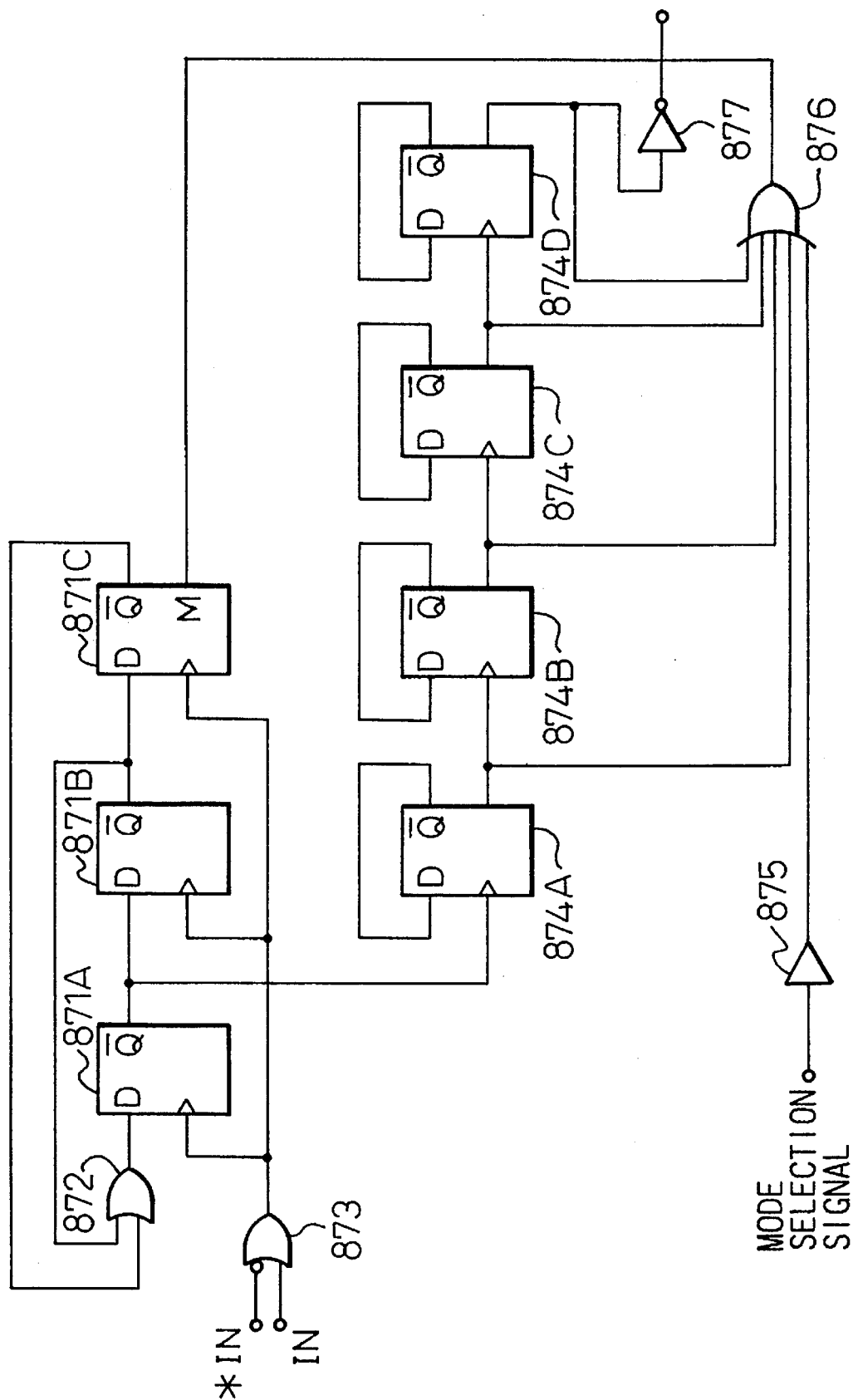
FIG. 88 is a circuit diagram of a 2-modulous prescaler shown in FIG. 87.

FIG. 88 is a diagram showing a circuit constitution of the 2-modulus prescaler. This circuit divides the signal into 1/P or 1/(P+1) frequency. Either of 1/P or 1/(P+1) is selected by a signal applied to a mode selection terminal.

In the constitution shown in FIG. 87, until the swallow counter 867 counts the output of the 2-modulous prescaler 866 to A (A is an integer.), the 2-modulous prescaler 866 performs the 1/N dividing operation. Therefore, the A(P+1) counting is performed at this portion. Then, until the programmable counter 868 counts the output of the 2-modulous prescaler 866 to (M–A), the 2-modulous prescaler 866 performs the 1/P dividing operation. Therefore, the (M–A)P counting is performed at this portion. Therefore, the total count number N is expressed by a following formula.

$$N=A(P+1)+(M-A)P=MP+A$$

Therefore, N can be optionally determined by properly selecting P, A, and M.

The operation of the fourteenth embodiment shown in FIG. 87 is almost same to that of the second embodiment except that the reference clock and the output from the VCO 811 are divided by N.

Figure 89:
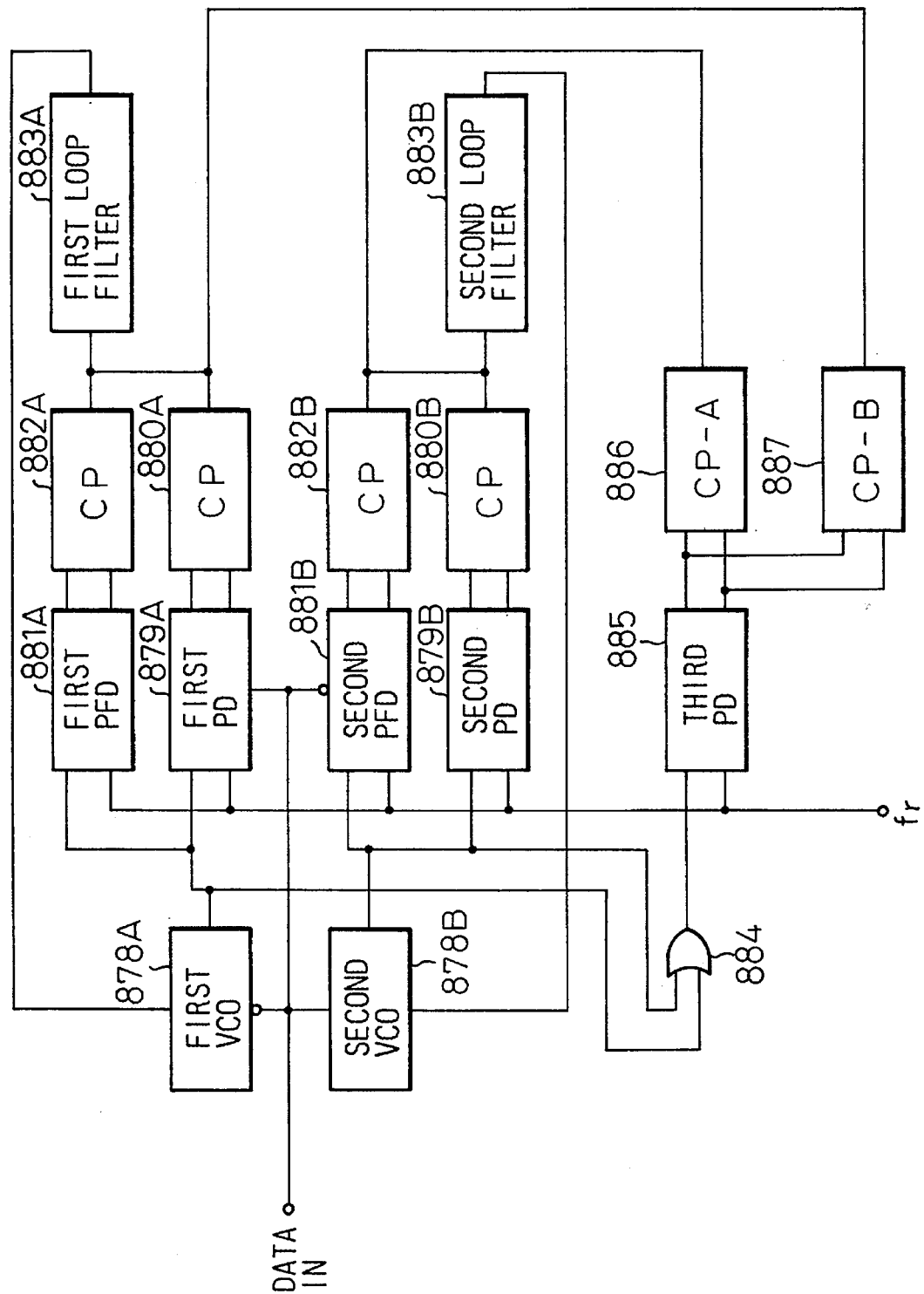
FIG. 89 is a diagram showing a constitution of a clock reproduction circuit of the sixteenth embodiment.

FIG. 89 is a diagram showing a constitution of a clock reproduction circuit of a fifteenth embodiment.

In FIG. 89, a portion consisting of a first VCO 878A, a first low pass filter 883A, a first PFD 881A, a first PFD charge pump 882A, a first PD 879A, and a first PD charge pump 880A, and a second portion consisting of a second VCO 878B, a second low pass filter 883B, a second PFD 881B, a second PFD charge pump 882B, a second PD 879B and a second PD charge pump 880B respectively have constitutions the same as those of the frequency synchronizing circuit shown in FIG. 78 except that the first VCO 878A and the second VCO 878B operate complimentarily. The VCO clock output from the first VCO 878A and second VCO 878B are synthesized by an OR gate 884, and the phase difference between the synthesized clock and the reference clock fr is detected by a third PD 885. The error signal detected by the third PD 885 is fed back to the first low pass filter 883A and the second low pass filter 883B via the third PD charge pumps 886 and 887. The third PD 885 has a same constitution as those of the first PD and the second PD.

In the clock reproduction circuit shown in FIG. 89, the first VCO 878A and the second VCO 878B respectively operate in response to the data signal, therefore, the first portion and the second portion complimentarily repeat an active state and an inactive state. Further, the charge from the inactive state to the active state is synchronous with the change of the data signal, therefore, the phases of the VCO clocks output from the first VCO 878A and the second VCO 878B agree with the phase of the data signal. Because each portion has the same constitution as that of the frequency synchronizing circuit shown in FIG. 78, the frequencies of the VCO clocks output from the first VCO 878A and the second VCO 878B agree with the frequency of the reference clock fr. Consequently, when the VCO clocks output from the first VCO 878A and the second VCO 878B lo are synthesized by an OR gate 884, the VCO frequency of the VCO clock agrees with that of the reference clock and the phase of the VCO clock agrees with that of the data signal.

The third PD 885 detects the phase difference between the above synthesized clock and the reference clock fr, and the detected phase difference is fed back to the first portion via the third PD charge pump 886 and is fed back to the second portion via the third PD charge pump 887. By these feedback operations, the first VCO 878A and the second VCO 878B respectively change their VCO frequencies according to the phase difference between the synthesize clock and the reference clock fr. Therefore, it is apparent that the VCO frequencies of the first VCO 878A and the second VCO 878B are controlled to agree with the data clock by these feedback mechanisms because the phase of the synthesized clock completely agrees with a change in the data signal. Finally, a clock which is synchronous with the data clock of the data signal is reproduced.

Figure 90:
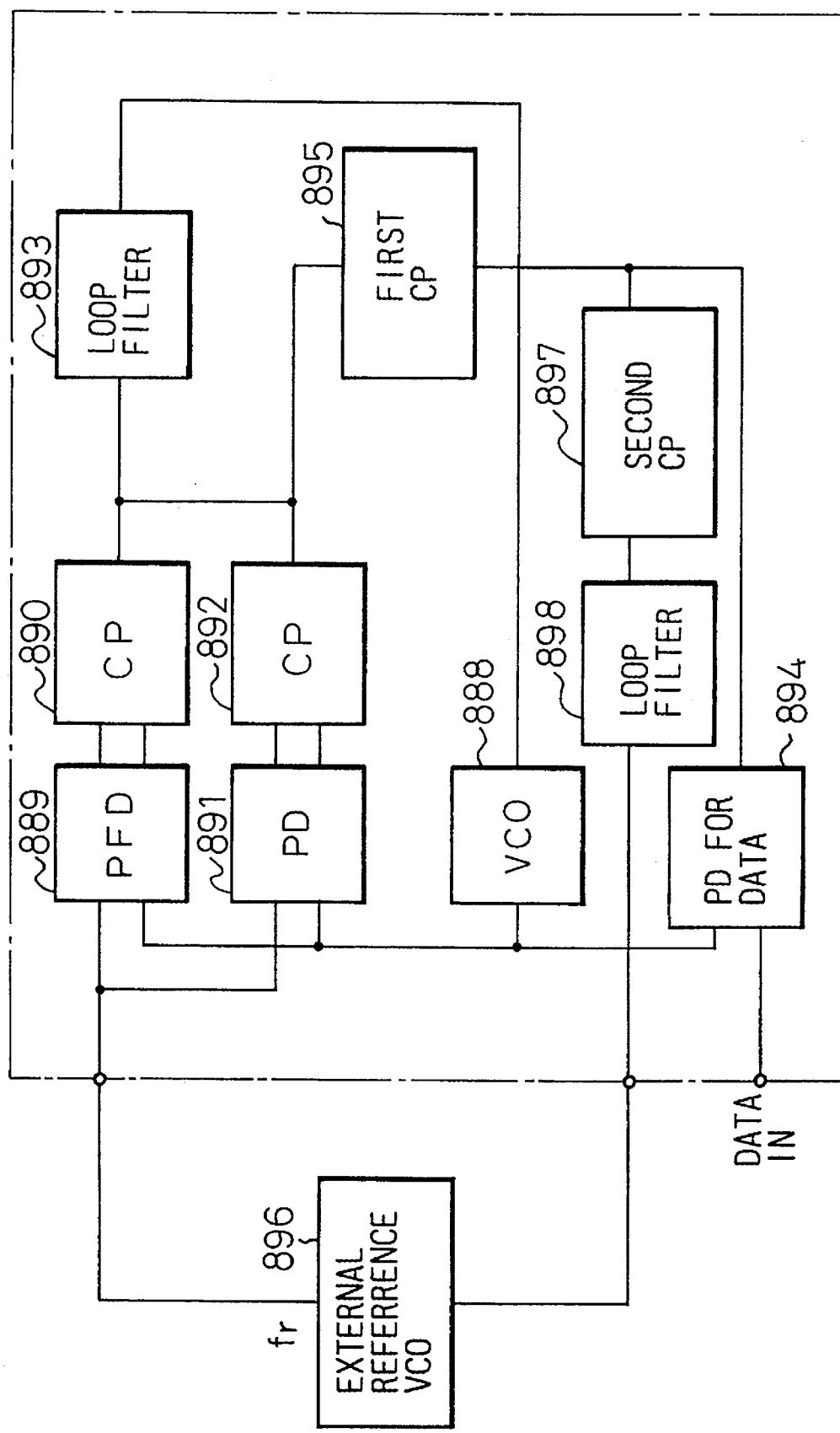
FIG. 90 is a diagram showing a constitution of a clock reproduction circuit of the seventeenth embodiment.

FIG. 90 is a diagram showing the constitution of a clock reproduction circuit of a sixteenth embodiment.

In FIG. 90, a VCO 896, a low pass filter 893, a PFD 889, a PFD charge pump 890, a PD 891, a PD charge pump 892, a data signal PD 894, and a data signal first charge pump 897 respectively correspond to the same elements in FIG. 85, and have same constitutions as those. The points different from the constitution of FIG. 85 are that a reference VCO 896 for generating the reference clock is provided outside of the circuit itself, and a phase difference detected by a data signal PD 894 is fed back to a reference VCO 896 via a data signal second charge pump 897 and a low pass filter 893.

In the eleventh embodiment shown in FIG. 78 and in other embodiments described above, the reference clock fr is output from the oscillator using a crystal oscillator, etc. Therefore, the reference clock always has a constant frequency. The frequency of the reference clock fr is selected to be approximate to the data clock frequency of the data signal, however, they do not completely agree. Therefore, after the VCO frequency is controlled to agree with the frequency of the reference clock fr by the frequency synchronizing circuit, the phase of the clock is controlled to agree with that of the data signal according to a phase comparing result, and the VCO frequency is further changed to completely agree with that of the data signal. This means that in the practical feedback operation, two feedback operations, one of which controls the VCO frequency to agree with that of the reference clock fr and the other of which controls the VCO frequency to agree with that of the fundamental clock of the data signal, are performed. Therefore, the feedback controls become very complicated.

In the sixteenth embodiment, a VCO frequency of the VCO clock output from the VCO 888 is controlled to agree with that of the reference clock output from the reference VCO 896, then, the frequency and a phase of the VCO clock is controlled to agree with those of the data clock of the data signal. However, because the feedback control is performed by the reference VCO 896 according to a phase difference between the VCO clock output from the VCO 888 and the data signal, the frequency of the reference signal output from the VCO 896 is controlled to agree with the frequency of the data clock of the data signal. By this control, both of the reference clock generated by the reference VCO 896 an the clock generated by the VCO 888 are synchronous with the data clock of the data signal.

As described above, by using the frequency synchronizing circuit of the present invention, the response characteristic of the clock reproduction circuit, which reproduces the data clock from the data signal, can be improved. Therefore, the communication efficiency of a communication system using this clock reproduction circuit can be increased.

We claim:

1. A clock reproduction circuit for reproducing a data clock from a data signal which is modulated by said data clock, comprising:

a voltage controlled oscillator generating a VCO clock;

a phase detector outputting a phase difference signal relating to a phase difference between said data signal and said VCO clock at each transition edge of said data signal;

a frequency error detection circuit-detecting a frequency difference between said data clock and said VCO clock by detecting and holding phases of said VCO clock at transition edges of said data signal and by detecting changes of said phases of said VCO clock, and outputting a frequency error signal relating to said detected frequency difference;

a charge pump whose output signal is controlled by said phase difference signal and said frequency error signal; and a loop filter generating a loop signal by deleting the high frequency components from said output signal of said charge pump and outputs said loop signal to said voltage controlled oscillator.

2. A clock reproduction circuit according to claim 1, comprising a frequency lock detection circuit for determining whether said frequency of said VCO clock is consistent with or close to the frequency of said data clock and, when said frequency of said VCO clock becomes consistent with or close to said frequency of said data clock, outputting a frequency lock signal, and said frequency error detection circuit stops outputting said frequency error signal to said loop filter when said frequency lock detection circuit outputs said frequency lock signal.

3. A clock reproduction circuit for according to claim 1, wherein said frequency error detection circuit includes:

a phase difference detection circuit which detects the phase of said VCO clock at respective transition edges of said data signal; and a phase comparing circuit which compares said detected phases of said VCO clock at two transition edges of said data signal so as to provide a frequency error signal representing a difference between said detected phases.

4. A clock reproduction circuit according to claim 3, wherein said frequency error detection circuit includes a control circuit, and said phase difference detection circuit includes a plurality of phase difference detection/hold circuits each of which detects a phase of said VCO clock at one transition edge of said data signal, and holds said detected phase, said phase comparing circuit includes a plurality of comparison circuits, the number of which is equal to that of said phase difference detection/hold circuits, each of which compares said held values of two of said phase difference detection/hold circuits, and said control circuit controls said phase difference detection/hold circuits and said comparison circuits so that each of said phase difference detection/hold circuits cyclically and serially detect phases of said VCO clock at transistion edges of said data signal, and hold the detected phases until a transition edge next to or farther from a transistion edge at which the phase detection is performed; and said comparison circuits cyclically and serially compare said detected phases output from two corresponding phase difference detection/hold circuits.

5. A clock reproduction circuit according to claim 4, wherein each of said phase difference detection/hold circuits includes:

an integrating circuit having an integrated value canceling function; and a charge circuit which charges said integrating circuit during a period from a transistion edge of said data signal to the next transition of a predetermined direction of said VCO clock.

6. A clock reproduction circuit according to claim 5, wherein said charge circuit includes:

a constant current source; and a switch, which is controlled to turn on during said charging period, and is connected between said constant current source and an input terminal of said integrating circuit.

7. A clock reproduction circuit according to claim 5, wherein each of said comparison circuits includes an operational amplifying circuit connected to two of said integrating circuits of said two corresponding phase difference detection/hold circuits via two capacitors.

8. A clock reproduction circuit according to claim 4, wherein said frequency error detection circuit includes storing circuits each of which converts an analog signal output from each of said comparison circuits and holds said digital signal.

9. A clock reproduction circuit according to claim 8, wherein said frequency error detection circuit includes a selection circuit which selects one of said digital signals output from said storing circuits according to a selection signal output from said control circuit.

10. A clock reproduction circuit according to claim 8, wherein each of said storing circuits is a D-type flip-flop.

11. A clock reproduction circuit for according to claim 8, wherein each of said storing circuits includes:

an window comparator which determines whether an output signal V of said operational amplifying circuit is larger than a positive reference value V0, less than −V0, or between V0 and −V0;

a first D-type flip-flop which holds the result that V is larger than V0; and a second D-type flip-flop which holds the result that V is less than −V0.

12. A clock reproduction circuit according to claim 3, wherein said phase difference detection circuit includes:

a multi-phase clock generation circuit for generating m phase-shifted clocks (where m denotes an integer) from a clock, said m phase-shifted clocks being sequentially shifted by a step of 1/m of about one cycle of said VCO clock;

a first latch for latching said m phase-shifted clocks at the first-to-second-level transition of a data signal; and a second latch for latching said m phase-shifted clocks at the second-to-first-level transition of said data signal, and said phase comparing circuit decodes output signals from said first and second latches and calculates said phase difference.

13. A clock reproduction circuit according to claim 1, wherein said phase detector includes:

a latch for latching said VCO clock at the transition edges of said data signal so as to provide a positive phase signal and a negative phase signal;

a first AND circuit for logically calculating the AND of said positive phase signal and said data signal; and a second AND circuit for logically calculating the AND of said negative phase signal and said data signal;

the output signals of said first and second AND circuits being provided as charge pump drive signals.

14. A clock reproduction circuit according to claim 1, wherein said phase detector outputs a first signal group consisting of first increase complementary signals and first decrease complementary signals to said charge pump, and said frequency error detection circuit outputs a second signal group consisting of a second increase signal and a second decrease signal to said charge pump, and said charge pump includes:

a current flow-out circuit including an increase drive voltage generator and an increase pump circuit; and a current flow-in circuit including a decrease pump circuit and a decrease drive voltage generator, wherein said increase drive voltage generator increases the output voltage at an output terminal connected to a first node according to said second increase signal;

said increase pump circuit is connected between said first node and said output terminal and increases said output voltage at said output terminal according to said first increase complementary signals;

said decrease pump circuit is connected between said output terminal and a second node and decreases said output voltage at said output terminal according to said first decrease complementary signals; and said decrease drive voltage generator is connected to said second node and decreases the voltage at said second node according to said second decrease signal.

15. A clock reproduction circuit according to claim 14, wherein said increase pump circuit includes:

three rectifying elements connected between said first node and said output terminal in series, the forward directions of said rectifying elements being in a direction from said first node to said output terminal; and a first capacitor and a second capacitor respectively connected to two connection nodes of said three rectifying elements, the other terminals of said first and second capacitors being respectively supplied with said first increase complementary signals, said decrease pump circuit includes:

three rectifying elements connected between said first node and said output terminal in series, the forward directions of said rectifying elements being in a direction from said output terminal to said second node; and a third capacitor and a fourth capacitor respectively connected to two connection nodes of said three rectifying elements, the other terminals of said third and fourth capacitors being respectively supplied with said first decrease complementary signals.

16. A clock reproduction circuit according to claim 14, wherein said output voltage at said output terminal is fed back to said increase drive voltage generator and said decrease drive voltage generator.

17. A clock reproduction circuit according to claim 16, wherein said increase drive voltage generator and said decrease drive voltage generator are integral, and said first node and said second node are common.

18. A frequency error detection circuit for detecting a frequency difference between a clock and a data clock included in a data signal which is modulated by said data clock, comprising:

a phase difference detection circuit which detects a phase of said clock at each transition edge of said data signal so as to provide a clock phase signal representing said detected phase; and a phase comparing circuit which compares said detected phase values at two transition edges of said data signal so as to provide a frequency error signal representing a difference, between said detected phases, at said two transition edges.

19. A frequency error detection circuit according to claim 18, further including a control circuit, and wherein said phase difference detection circuit includes a plurality of phase difference detection/hold circuits each of which detects a phase of said clock at one transition edge of said data signal, holds said detected phase, and cancels said held value, said phase comparing circuit includes a plurality of comparison circuits, the number of which is equal to that of said phase difference detection/hold circuits, each of which compares said held values of two of said phase difference detection/hold circuits, and said control circuit controls said phase difference detection/hold circuits and said comparison circuits so that each of said phase difference detection/hold circuits cyclically and serially detect phases of said clock at the transistion edges of said data signal, hold the detected phases until a transition edge next to or farther from a transistion edge at which the phase detection is performed, and cancel the detected phases; and said comparison circuits cyclically and serially compare said detected phases output from two corresponding phase difference detection/hold circuits.

20. A frequency error detection circuit according to claim 19, wherein each of said phase difference detection/hold circuits includes:

an integrating circuit having an integrated value canceling function; and a charge circuit which charges said integrating circuit, during a period from a transistion edge of said data signal to the transition of the clock, to the predetermined level.

21. A frequency error detection circuit according to claim 20, wherein said charge circuit includes:

a constant current source; and a switch connected between said constant current source and an input terminal of said integrating circuit, said switch being controlled to turn on during said period.

22. A frequency error detection circuit according to claim 19, wherein each of said comparison circuits includes an operational amplifying circuit connected to two of said integrating circuits of said two corresponding phase difference detection/hold circuits via two capacitors.

23. A frequency error detection circuit according to claim 19, further including storing circuits each of which converts an analog signal output from each of said comparison circuits and holds said digital signal.

24. A frequency error detection circuit according to claim 23, further including a selection circuit which selects one of said digital signals output from said storing circuits according to a selection signal output from said control circuit.

25. A frequency error detection circuit according to claim 23, wherein each of said storing circuits is a D-type flip-flop.

26. A frequency error detection circuit according to claim 23, wherein each of said storing circuits includes:

an window comparator which judges whether an output signal V of said operational amplifying circuit is larger than a positive reference value V0, less than −V0, or between V0 and −V0;

a first D-type flip-flop which holds the result that V is larger than V0; and a second D-type flip-flop which holds the result that V is less than −V0.

27. A frequency error detection circuit according to claim 18, wherein said phase difference detection circuit includes:

a multi-phase clock generation circuit for generating m phase-shifted clocks (where m denotes an integer) from a clock;

a first latch for latching said m phase-shifted clocks at the first-to-second-level transition of a data signal; and a second latch for latching said m phase-shifted clocks at the second-to-first-level transition of said data signal, and said phase comparing circuit decodes the output signals from said first and second latch and calculates said phase difference.

28. A phase detector, comprising:

a latch for latching a clock at the transition edges of a data signal which is modulated by a first clock so as to provide a positive phase signal and a negative phase signal;

a first AND circuit for logically calculating the AND of said positive phase signal and said data signal; and a second AND circuit for logically calculating the AND of said negative phase signal and said data signal;

output signals of said first and second AND circuits being provided as charge pump drive signals.

29. A charge pump for changing an output voltage at an output terminal according to a first signal group consisting of first increase complementary signals and first decrease complementary signals, and a second signal group consisting of a second increase signal and a second decrease signal, comprising:

a current flow-out circuit including an increase drive voltage generator and an increase pump circuit; and a current flow-in circuit including a decrease pump circuit and a decrease drive voltage generator, wherein said increase drive voltage generator, of which the output terminal is connected to a first node, increases an output voltage according to said second increase signal;

said increase pump circuit is connected between said first node and said output terminal and increases said output voltage at said output terminal according to said first increase complementary signals;

said decrease pump circuit is connected between said output terminal and a second node and decreases said output voltage at said output terminal according to said first decrease complementary signals; and said decrease drive voltage generator is connected to said second node and decreases a voltage at said second node according to said second decrease signal.

30. A charge pump according to claim 29, wherein said increase pump circuit includes:

three rectifying elements connected between said first node and said output terminal in series, a forward directions of said rectifying elements being a direction from said first node to said output terminal; and a first capacitor and a second capacitor respectively connected to two connection nodes of said three rectifying elements, the other terminals of said first and second capacitors being respectively supplied with said first increase complementary signals, said decrease pump circuit includes:

three rectifying elements connected between said first node and said output terminal in series, a forward directions of said rectifying elements being a direction from said output terminal to said second node; and a third capacitor and a fourth capacitor respectively connected to two connection nodes of said three rectifying elements, the other terminals of said third and fourth capacitors being respectively supplied with said first decrease complementary signals.

31. A charge pump according to claim 29, wherein said output voltage at said output terminal is fed back to said increase drive voltage generator and said decrease drive voltage generator.

32. A charge pump according to claim 31, wherein said increase drive voltage generator and said decrease drive voltage generator are integral, and said first node and said second node are common.

\* \* \* \* \*